United States Patent
Seo et al.

(10) Patent No.: US 10,263,194 B2
(45) Date of Patent: Apr. 16, 2019

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Tsunenori Suzuki, Kanagawa (JP); Naoaki Hashimoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 77 days.

(21) Appl. No.: 15/154,121

(22) Filed: May 13, 2016

(65) Prior Publication Data

US 2016/0336519 A1     Nov. 17, 2016

(30) Foreign Application Priority Data

May 15, 2015   (JP) .................................. 2015-099866
Mar. 14, 2016  (JP) .................................. 2016-049620

(51) Int. Cl.
*H01L 51/00*   (2006.01)
*H01L 51/50*   (2006.01)
*H01L 51/52*   (2006.01)

(52) U.S. Cl.
CPC ...... *H01L 51/0072* (2013.01); *H01L 51/5004* (2013.01); *H01L 51/506* (2013.01); *H01L 51/508* (2013.01); *H01L 51/5012* (2013.01); *H01L 51/524* (2013.01); *H01L 51/0052* (2013.01); *H01L 51/0067* (2013.01); *H01L 2251/552* (2013.01)

(58) Field of Classification Search
CPC ............. H01L 51/0072; H01L 51/5004; H01L 51/508; H01L 51/5012; H01L 51/506; H01L 51/524; H01L 51/0052; H01L 51/0067; H01L 2251/552; H01L 51/00

USPC ............................................... 428/690, 411.1
See application file for complete search history.

(56) References Cited

U.S. PATENT DOCUMENTS

| | | | |
|---|---|---|---|
| 8,115,382 B2 | 2/2012 | Seo et al. | |
| 8,203,262 B2 | 6/2012 | Seo et al. | |
| 8,384,283 B2 | 2/2013 | Seo et al. | |
| 8,803,419 B2 | 8/2014 | Seo et al. | |
| 8,901,812 B2 | 12/2014 | Seo et al. | |
| 9,269,906 B2 | 2/2016 | Suzuki et al. | |
| 9,911,936 B2 * | 3/2018 | Seo | H01L 51/5016 |
| 9,985,234 B2 * | 5/2018 | Seo | C07D 209/82 |
| 9,991,471 B2 * | 6/2018 | Watabe | C07F 15/0033 |
| 10,062,861 B2 * | 8/2018 | Seo | H01L 51/504 |
| 10,096,658 B2 * | 10/2018 | Watabe | H01L 51/5004 |
| 2009/0167168 A1 * | 7/2009 | Seo | H01L 51/5004 313/504 |
| 2015/0073147 A1 * | 3/2015 | Inoue | H01L 51/0072 544/343 |
| 2018/0076394 A1 * | 3/2018 | Kawakami | C07D 307/77 |
| 2018/0138416 A1 * | 5/2018 | Seo | H01L 51/0072 |
| 2018/0151814 A1 * | 5/2018 | Hirose | C09K 11/06 |
| 2018/0182977 A1 * | 6/2018 | Hirose | H01L 51/502 |

FOREIGN PATENT DOCUMENTS

JP     2009-177157 A     8/2009

* cited by examiner

*Primary Examiner* — Douglas J McGinty
(74) *Attorney, Agent, or Firm* — Husch Blackwell LLP

(57) ABSTRACT

Provided is a novel light-emitting element, a light-emitting element with a long lifetime, or a light-emitting element with high emission efficiency. The light-emitting element includes an EL layer between a pair of electrodes. The EL layer includes at least a light-emitting layer containing a fluorescent substance and a host material, a first electron-transport layer containing a first electron-transport material, and a second electron-transport layer containing a second electron-transport material, which are in contact with each other and in this order. The LUMO level of each of the host material and the second electron-transport material is higher than the LUMO level of the first electron-transport material.

14 Claims, 29 Drawing Sheets

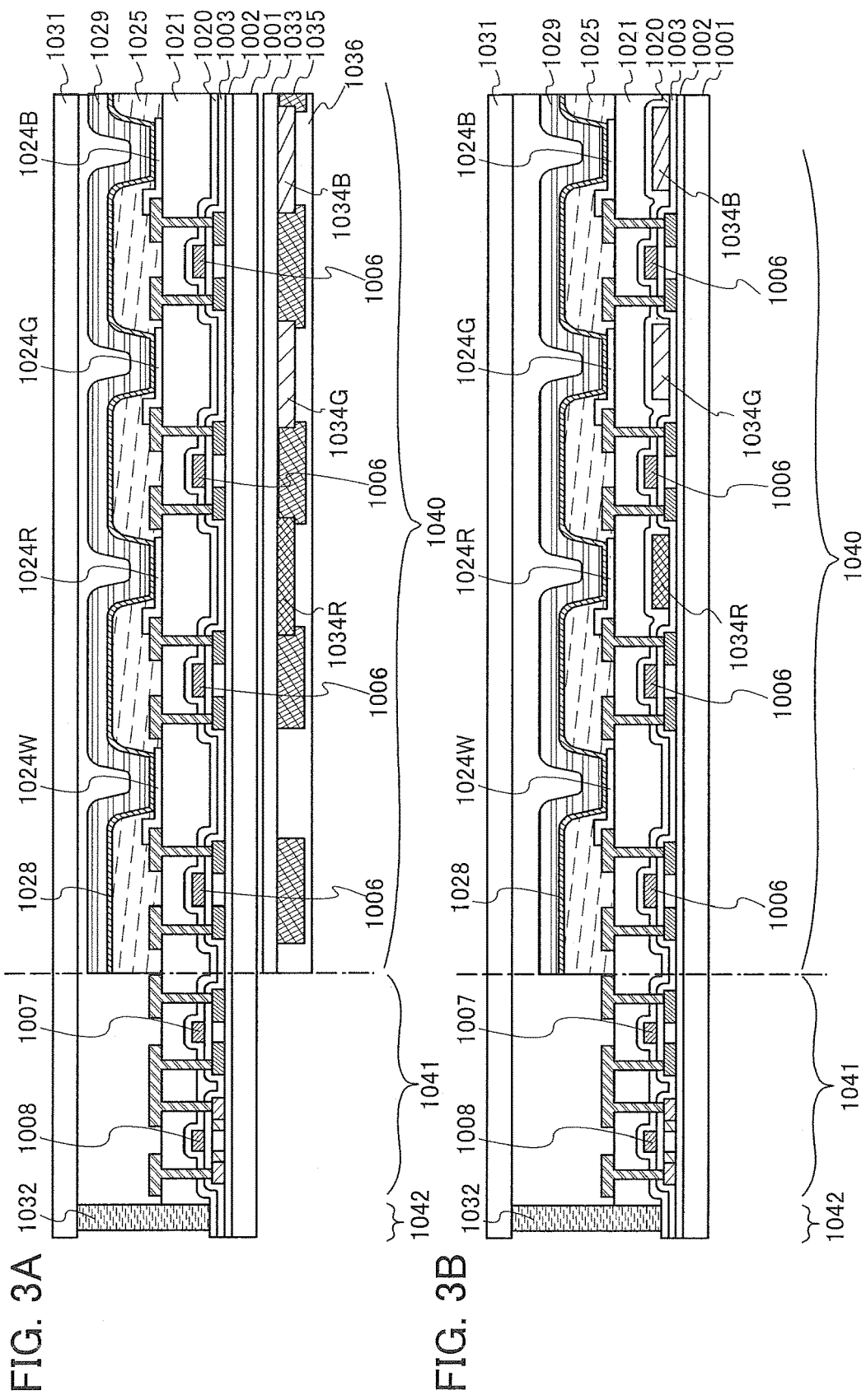

FIG. 7A
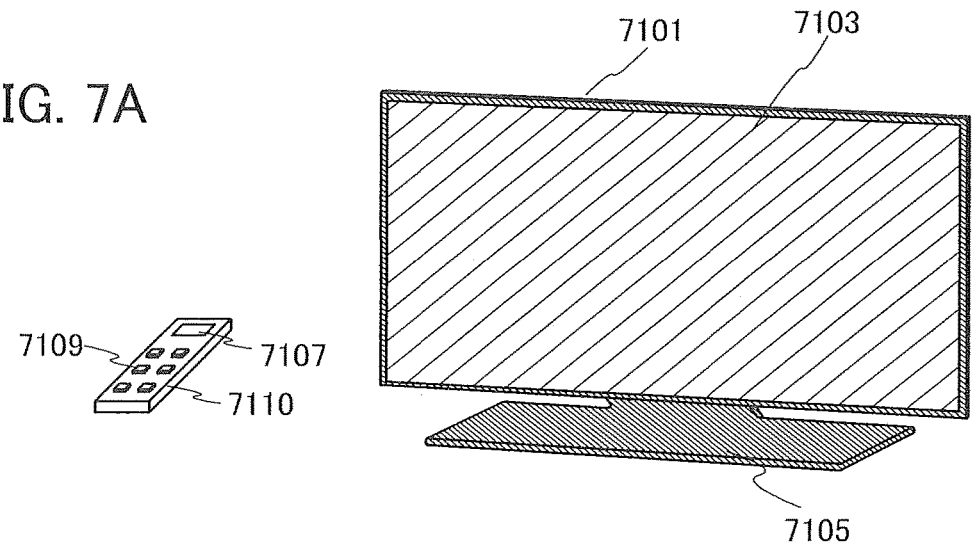
FIG. 7B1
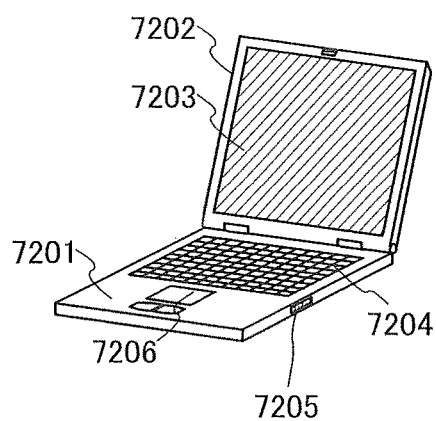
FIG. 7B2
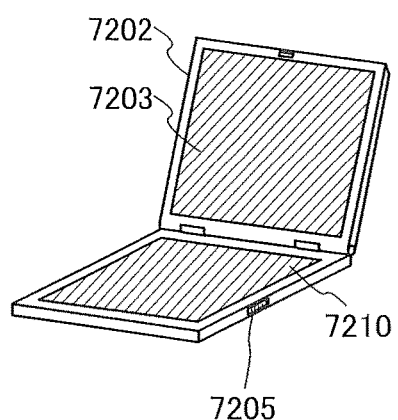
FIG. 7C
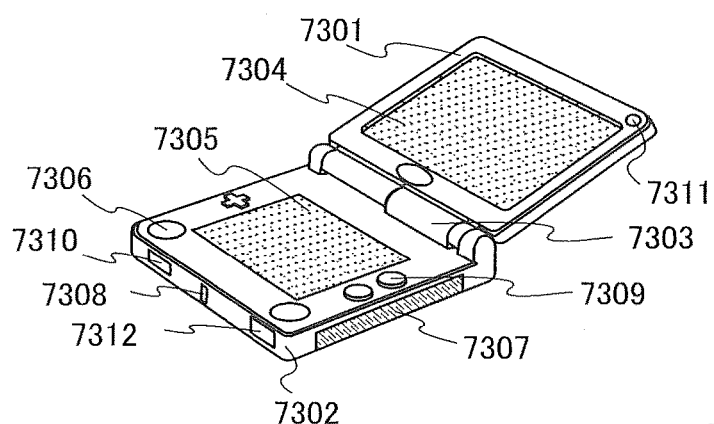
FIG. 7D
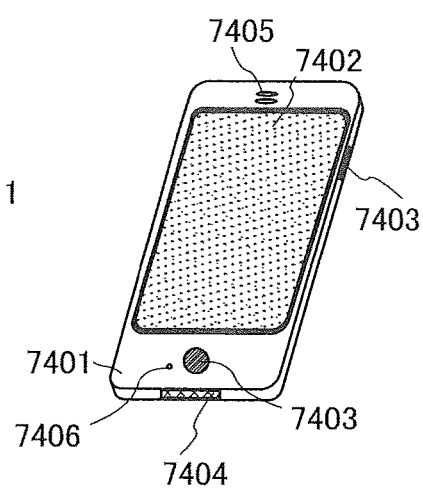

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

One embodiment of the present invention relates to a light-emitting element, a display module, a lighting module, a display device, a light-emitting device, an electronic device, and a lighting device in which the organic compound is used. Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method of driving any of them, and a method of manufacturing any of them.

2. Description of the Related Art

Light-emitting elements (organic EL elements) including organic compounds and utilizing electroluminescence (EL) have been put to more practical use. In the basic structure of such a light-emitting element, an organic compound layer containing a light-emitting substance (an EL layer) is provided between a pair of electrodes. By voltage application to this element, light emission from the light-emitting substance can be obtained.

Since such light-emitting elements are of self-light-emitting type, light-emitting elements have advantages over liquid crystal displays when used as pixels of a display in that visibility of pixels is high and backlight is not required. Thus, light-emitting elements are suitable as flat panel display elements. A display including such a light-emitting element is also highly advantageous in that it can be thin and lightweight. Besides, very high speed response is one of the features of such an element.

Since light-emitting layers of such light-emitting elements can be successively formed two-dimensionally, planar light emission can be achieved. This feature is difficult to realize with point light sources typified by incandescent lamps and LEDs or linear light sources typified by fluorescent lamps. Thus, light-emitting elements also have great potential as planar light sources, which can be applied to lighting devices and the like.

Displays or lighting devices including light-emitting elements can be suitably used for a variety of electronic devices as described above, and research and development of light-emitting elements have progressed for higher efficiency or longer lifetimes.

Patent Document 1 discloses a light-emitting element that achieves a long lifetime by including an electron-transport layer to which a substance having an electron-trapping property is added.

REFERENCE

Patent Document

[Patent Document 1] Japanese Published Patent Application No. 2009-177157

SUMMARY OF THE INVENTION

An object of one embodiment of the present invention is to provide a novel light-emitting element. Another object of one embodiment of the present invention is to provide a light-emitting element with a long lifetime. Another object of one embodiment of the present invention is to provide a light-emitting element with high emission efficiency.

Another object of one embodiment of the present invention is to provide a highly reliable light-emitting device, a highly reliable electronic device, and a highly reliable display device. Another object of one embodiment of the present invention is to provide a light-emitting device, an electronic device, and a display device each with low power consumption.

It is only necessary that at least one of the above-described objects be achieved in the present invention.

A light-emitting element of one embodiment of the present invention includes an anode, a cathode, and an EL layer between the anode and the cathode. The EL layer includes a light-emitting layer, a first electron-transport layer, and a second electron-transport layer. The first electron-transport layer is between the light-emitting layer and the second electron-transport layer. The light-emitting layer has a region in contact with the first electron-transport layer. The second electron-transport layer has a region in contact with the first electron-transport layer. The light-emitting layer includes a fluorescent substance and a host material. The first electron-transport layer includes a first material. The second electron-transport layer includes a second material. The LUMO level of the host material is higher than the LUMO level of the first material. The LUMO level of the second material is higher than the LUMO level of the first material. The host material is a substance including a condensed aromatic ring skeleton including 3 to 6 rings. The first material is a substance including a first heteroaromatic ring skeleton. The second material is a substance including a second heteroaromatic ring skeleton. The substance including the first heteroaromatic ring skeleton is different from the substance including the second heteroaromatic ring skeleton.

Another embodiment of the present invention is a light-emitting element with the above structure, in which each of the substance including the first heteroaromatic ring skeleton and the substance including the second heteroaromatic ring skeleton is a substance including a six-membered nitrogen-containing heteroaromatic ring skeleton.

Another embodiment of the present invention is a light-emitting element with any of the above structures, in which the substance including the first heteroaromatic ring skeleton is a substance including a condensed heteroaromatic ring skeleton.

Another embodiment of the present invention is a light-emitting element with any of the above structures, in which the substance including the first heteroaromatic ring skeleton is a substance including a condensed heteroaromatic ring skeleton including a diazine skeleton or a triazine skeleton.

Another embodiment of the present invention is a light-emitting element with any of the above structures, in which the substance including the first heteroaromatic ring skeleton is a substance including a pyrazine skeleton or a pyrimidine skeleton.

Another embodiment of the present invention is a light-emitting element with any of the above structures, in which the substance including the first heteroaromatic ring skeleton is a substance including a dibenzoquinoxaline skeleton.

Another embodiment of the present invention is a light-emitting element with any of the above structures, in which the host material is a substance including an anthracene skeleton.

Another embodiment of the present invention is a light-emitting element with any of the above structures, in which the second electron-transport layer is in contact with the cathode.

Another embodiment of the present invention is a light-emitting element with any of the above structures, in which the EL layer further includes a hole-injection layer, the hole-injection layer is in contact with the anode, and the hole-injection layer includes an organic acceptor material.

Another embodiment of the present invention is a light-emitting element with the above structure, in which the organic acceptor material is 2,3,6,7,10,11-hexacyano-1,4,5,8,9,12-hexaazatriphenylene.

Another embodiment of the present invention is a light-emitting element with any of the above structures, in which the fluorescent substance exhibits blue light.

Another embodiment of the present invention is a light-emitting device including the light-emitting element with any of the above structures and a transistor or a substrate.

Another embodiment of the present invention is an electronic device including the above light-emitting device and at least one of a sensor, an operation button, a speaker, and a microphone.

Another embodiment of the present invention is a lighting device including the above light-emitting device and a housing.

Note that the light-emitting device in this specification includes, in its category, an image display device with a light-emitting element. The light-emitting device may be included in a module in which a light-emitting element is provided with a connector such as an anisotropic conductive film or a tape carrier package (TCP), a module in which a printed wiring board is provided at the end of a TCP, or a module in which an integrated circuit (IC) is directly mounted on a light-emitting element by a chip on glass (COG) method. The light-emitting device may be included in lighting equipment or the like.

In one embodiment of the present invention, a novel light-emitting element can be provided. In another embodiment of the present invention, a light-emitting element with a long lifetime can be provided. In another object of one embodiment of the present invention, a light-emitting element with high emission efficiency can be provided.

In another embodiment of the present invention, a highly reliable light-emitting device, a highly reliable electronic device, and a highly reliable display device can be provided. In another embodiment of the present invention, a light-emitting device, an electronic device, and a display device each with low power consumption can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 3A and 3B are conceptual diagrams of an active matrix light-emitting device.
FIGS. 7A to 7D illustrate electronic devices.

DETAILED DESCRIPTION OF THE INVENTION

Embodiments of the present invention will be described in detail below with reference to the drawings. Note that the present invention is not limited to the description below, and it is easily understood by those skilled in the art that modes and details can be variously modified without departing from the spirit and scope of the present invention. Accordingly, the present invention should not be interpreted as being limited to the content of the embodiments below.

Embodiment 1

Figure 1A:
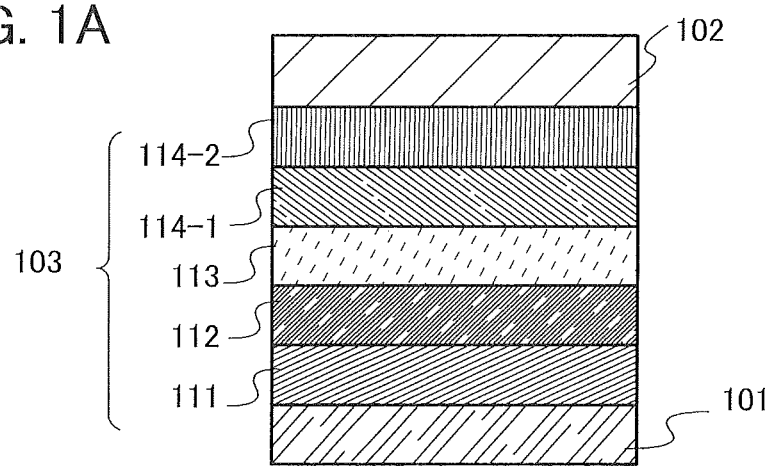
FIGS. 1A to 1C are schematic diagrams of light-emitting elements.

FIG. 1A illustrates a light-emitting element of one embodiment of the present invention. The light-emitting element of one embodiment of the present invention includes at least an anode 101, a cathode 102, and an EL layer 103. The EL layer 103 includes at least a light-emitting layer 113, a first electron-transport layer 114-1, and a second electron-transport layer 114-2.

The light-emitting layer 113 contains a host material and a fluorescent substance. By application of voltage to the light-emitting element for letting current flow, light from the fluorescent substance can be obtained.

The host material is a substance including a condensed aromatic ring skeleton including 3 to 6 rings. A material for the first electron-transport layer 114-1 and a material for the second electron-transport layer 114-2 are substances each including a heteroaromatic ring skeleton. The material for the first electron-transport layer 114-1 is different from the material for the second electron-transport layer 114-2.

In the light-emitting element of one embodiment of the present invention, the LUMO level of each of the host material and the material for the second electron-transport layer 114-2 is higher (shallower) than the LUMO level of the material for the first electron-transport layer 114-1. Note that a difference between the LUMO levels of the host material and the material for the first electron-transport layer 114-1 is preferably smaller than or equal to 0.3 eV, in which case an increase in driving voltage can be suppressed.

In general light-emitting element design, the LUMO levels of layers on the electron-transport layer side (layers in an EL layer between a light-emitting layer and a cathode) are designed to become higher (shallower) from the layer on the cathode side in order to reduce the carrier injection barriers between the layers, decrease the driving voltage, and improve the lifetime.

However, the light-emitting element of one embodiment of the present invention in which the LUMO levels of the host material and the materials for the electron-transport layers have the above relation and materials including particular skeletons are used can have a longer lifetime than a light-emitting element with the conventional structure.

The host material preferably includes a condensed aromatic ring skeleton including 3 to 6 rings because these condensed aromatic rings can maintain an energy gap near the visible light region and have electrochemical stability. In particular, an anthracene skeleton is preferred because an energy gap large enough to excite a blue fluorescent material can be obtained and holes and electrons both can be transported. In addition, the LUMO level of an anthracene derivative can be easily set to approximately −2.7 eV, which is suitable for forming the relation of the LUMO levels.

The material for the first electron-transport layer 114-1 and the material for the second electron-transport layer 114-2 preferably include different heteroaromatic ring skeletons, in which case the LUMO level of the material for the first electron-transport layer 114-1 can be lower (deeper) than the LUMO level of each of the host material and the material for the second electron-transport layer 114-2.

In the case where the EL layer 103 further includes a hole-injection layer 111 and an organic acceptor material is used for the hole-injection layer 111, not only the lifetime can be longer than the conventional lifetime, but also a decrease in efficiency in a high luminance region, what is called roll-off, can be suppressed; thus, a light-emitting element with high luminance and high efficiency can be fabricated. Therefore, in the light-emitting element of one embodiment of the present invention, the EL layer 103 further includes the hole-injection layer 111, and an organic acceptor material is used for the hole-injection layer 111.

One of the reasons for this is probably that the above-mentioned structure can complement the low hole-injection capability of an organic acceptor. The acceptor properties of many organic acceptors with respect to a material having a HOMO level lower (deeper) than −5.4 eV are low, which means that it is hard to inject holes. For this reason, in the case where an organic acceptor is used for the hole-injection layer, a material having a HOMO level higher than or equal to −5.4 eV is preferably used for the hole-transport layer, on the other hand, it is difficult to inject holes from such a hole-transport layer to the light-emitting layer. This is because the material including a condensed aromatic ring skeleton including 3 to 6 rings often has a HOMO level lower (deeper) than −5.4 eV. Accordingly, in the case where an organic acceptor is used for the hole-injection layer, a barrier ultimately exists when holes are injected to the light-emitting layer, and thus the organic acceptor has low hole-injection capability.

Consequently, for example, in the case where the first electron-transport layer 114-1 is not provided or in the case where the LUMO level of the material for the first electron-transport layer 114-1 is similar to the LUMO level of each of the host material and the material for the second electron-transport layer 114-2, the hole-injection property and the hole-transport property of the hole-injection layer for which an organic acceptor is used are low as compared with the electron-injection property and the electron-transport property. In particular, when the element emits light with high luminance, the element includes excessive electrons and roll-off occurs. In that case, a carrier recombination region is narrowed, which adversely affect the lifetime. However, by designing the LUMO levels of the host material, the material for the first electron-transport layer 114-1, and the material for the second electron-transport layer 114-2 as described above, the carrier balance can be maintained in the high luminance region and thus the emission efficiency can be increased even when the hole-injection layer including an organic acceptor is used. Moreover, the carrier recombination region can be kept wide, and thus the lifetime can be prolonged. An organic acceptor has an advantage of excellent sublimation property and a disadvantage of low hole-injection capability, but the problem can be solved by one embodiment of the present invention.

Furthermore, not only the lifetime but also the emission efficiency can be improved depending on the structure. For example, in the case where a composite material of a material having a hole-transport property and a material having an acceptor property (e.g., a transition metal oxide having an acceptor property, particularly an oxide of any of metals belonging to Group 4 to Group 8 in the periodic table) is used for the hole-injection layer 111, a light-emitting element showing excellent efficiency in not only the high luminance region but also in almost all the region can be obtained.

Next, examples of specific structures and materials of the above-described light-emitting element are described. As described above, the light-emitting element of one embodiment of the present invention includes the EL layer 103 that consists of a plurality of layers between the anode 101 and the cathode 102; the EL layer 103 includes at least the light-emitting layer 113, the first electron-transport layer 114-1, and the second electron-transport layer 114-2. The light-emitting layer 113, the first electron-transport layer 114-1, and the second electron-transport layer 114-2 are provided in contact with each other and in this order.

There is no particular limitation on layers other than the light-emitting layer 113, the first electron-transport layer 114-1, and the second electron-transport layer 114-2 included in the EL layer 103, and various layers such as a hole-injection layer, a hole-transport layer, an electron-injection layer, a carrier-blocking layer, an exciton-blocking layer, and a charge-generation layer can be employed.

The anode 101 is preferably formed using any of metals, alloys, electrically conductive compounds with a high work function (specifically, a work function of 4.0 eV or more), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that when a composite material described later is used for a layer which is in contact with the anode 101 in the EL layer 103, an electrode material can be selected regardless of its work function.

In this embodiment, two types of stacked structures of the EL layer 103 will be described. A structure illustrated in FIG. 1A includes the hole-injection layer 111, a hole-transport layer 112, the light-emitting layer 113, the first electron-transport layer 114-1, the second electron-transport layer 114-2, and an electron-injection layer 115. A structure illustrated in FIG. 1B includes the hole-injection layer 111, the hole-transport layer 112, the light-emitting layer 113, the first electron-transport layer 114-1, the second electron-transport layer 114-2, and a charge-generation layer 116. Materials for forming the layers are specifically shown below.

The hole-injection layer 111 is a layer containing a substance having a hole-injection property. For example, a transition metal oxide, in particular, an oxide of a metal belonging to Group 4 to Group 8 in the periodic table (e.g., a molybdenum oxide, a vanadium oxide, a ruthenium oxide, a rhenium oxide, a tungsten oxide, or a manganese oxide) can be used. Alternatively, a complex of a transition metal or a complex of an oxide of a metal belonging to Group 4 to Group 8 in the periodic table can be used; for example, a molybdenum complex such as molybdenum tris[1,2-bis(trifluoromethyl)ethane-1,2-dithiolene] (abbreviation: $Mo(tfd)_3$) can be used. The transition metal oxide (in particular, the oxide of a metal belonging to Group 4 to Group 8 in the periodic table) or the complex of a transition metal (in particular, the complex of an oxide of a metal belonging to Group 4 to Group 8 in the periodic table) acts as an acceptor. The acceptor can extract an electron from a hole-transport layer (or a hole-transport material) adjacent to the hole-injection layer 111 by at least application of an electric field. Further alternatively, a compound including an electron-withdrawing group (a halogen group or a cyano group) such as 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, or 2,3,6,7,10,11-hexacyano-1,4,5,8,9,12-hexaazatriphenylene (abbreviation: HAT-CN) can be used. The compound including an electron-withdrawing group (a halogen group or a cyano group) acts as an organic acceptor. The organic acceptor can extract an electron from a hole-transport layer (or a hole-transport material) adjacent to the hole-injection layer 111 by at least application of an electric field. Alternatively, the hole-injection layer 111 can be formed using a phthalocyanine-based compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N-diphenyl-(1,1-biphenyl)-4,4'-diamine (abbreviation: DNTPD), a high molecular compound such as poly(3,4-ethylenedioxythiophene)/poly(styrenesulfonic acid) (PEDOT/PSS), or the like.

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can also be used for the anode 101. Examples of the acceptor material include a compound including an electron-withdrawing group (a halogen group or a cyano group) such as $F_4$-TCNQ, chloranil, or HAT-CN, a transition metal oxide (in particular, an oxide of a metal belonging to Group 4 to Group 8 in the periodic table). A transition metal oxide (in particular, an oxide of a metal belonging to Group 4 to Group 8 in the periodic table) is preferred because these oxides show an acceptor property with respect to a substance having a hole-transport property whose HOMO level is lower (deeper) than −5.4 eV (these oxides can extract an electron by at least application of an electric field).

As the compound including an electron-withdrawing group (a halogen group or a cyano group), a compound in which an electron-withdrawing group is bonded to a condensed aromatic ring including a plurality of heteroatoms such as HAT-CN is particularly preferred because of its thermal stability.

As the transition metal oxide or the oxide of a metal belonging to Group 4 to Group 8 in the periodic table, vanadium oxide, niobium oxide, tantalum oxide, chromium oxide, molybdenum oxide, tungsten oxide, manganese oxide, and rhenium oxide are preferable because of their high acceptor properties. In particular, molybdenum oxide is more preferable because of its stability in the atmosphere, low hygroscopic property, and easiness of handling.

As the substance having a hole-transport property which is used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ cm²/Vs or more is preferably used. Examples of organic compounds that can be used as the substance having a hole-transport property in the composite material are specifically given below.

Examples of the aromatic amine compounds include N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1). Alternatively, 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, or the like can be used.

Examples of the aromatic hydrocarbon include 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides, pentacene, coronene, or the like can be used. The aromatic hydrocarbon having a hole mobility of $1\times10^{-6}$ cm²/Vs or higher and having 14 to 42 carbon atoms is particularly preferable. The aromatic hydrocarbon may have a vinyl skeleton. Examples of an aromatic hydrocarbon having a vinyl group are 4,4'-bis(2,2-diphenylvinyl)biphenyl (abbreviation: DPVBi) and 9,10-bis[4-(2,2-diphenylvinyl)phenyl]anthracene (abbreviation: DPVPA).

A high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N-bis(phenyl)benzidine] (abbreviation: poly-TPD) can also be used.

By providing a hole-injection layer, a high hole-injection property can be achieved to allow a light-emitting element to be driven at a low voltage.

The hole-transport layer 112 contains a substance having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and 4-phenyl-4'-(9-phenylfluoren-9-yl)triphenylamine (abbreviation: BPAFLP). The substances mentioned here have a high hole-transport property and are mainly ones that have a hole mobility of $10^{-6}$ cm²/Vs or more. An organic compound given as an example of the substance having a hole-transport property in the composite material described above can also be used for the hole-transport layer 112. A high molecular compound such as poly(N-vinylcarbazole) (abbreviation: PVK) and poly(4-vinyltriphenylamine) (abbreviation: PVTPA) can also be used. Note that the layer that contains the substance having a hole-transport property is not limited to a single layer, and may be a stack of two or more layers including any of the above substances.

The light-emitting layer 113 may be a layer that contains a fluorescent substance and emits fluorescence, a layer that contains a phosphorescent substance and emits phosphorescence, or a layer that contains a substance emitting thermally activated delayed fluorescence (TADF) and emits TADF. Furthermore, the light-emitting layer 113 may be a single layer or include a plurality of layers containing different light-emitting substances. Note that in one embodiment of the present invention, a layer that emits fluorescence, specifically, a layer that emits blue fluorescence is preferred.

Examples of a material that can be used as a fluorescent substance in the light-emitting layer 113 are as follows. Fluorescent substances other than those given below can also be used.

The examples include 5,6-bis[4-(10-phenyl-9-anthryl)phenyl]-2,2'-bipyridine (abbreviation: PAP2BPy), 5,6-bis

[4'-(10-phenyl-9-anthryl)biphenyl-4-yl]-2,2'-bipyridine (abbreviation: PAPP2BPy), N,N-bis[4-(9-phenyl-9H-fluoren-9-yl)phenyl]-N,N'-diphenyl-pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N-triphenyl-1,4-phen ylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-tiphenyl-1,4-phenylenediamine (abbreviation: 2DPAPPA), N,N,N',N',N'',N''',N''',N''''-octaphenyldibenzo[g,p]chrysene-2,7,10,15-tetraamine (abbreviation: DBCI), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-(2-methyl-6-[2-(2,3,6,7-tetrahydro-1H,5H-benzo[j]quinolizin-9-yl)ethenyl]-4H-pyran-4-ylidene)propanedinitrile (abbreviation: DCM2), N,N,N',N'-tetrakis(4-methylphenyl)tetracene-5,11-diamine (abbreviation: p-mPhTD), 7,14-diphenyl-N,N,N',N-tetrakis(4-methylphenyl)acenaphtho[1,2-a]fluorantbene-3,10-diamine (abbreviation: p-mPhAFD), 2-{2-isopropyl-6-[2-(1,1,7,7-tetramethyl-2,3,6,7-tetrahydro-1H,5H-benzo[j]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[q]quinolizin-9-yl)ethenyl]-4H-pyran-4-ylidene}propanedinitrile (abbreviation: BisDCJTM). Condensed aromatic diamine compounds typified by pyrenediamine compounds such as 1,6FLPAPm and 1,6mMemFLPAPrn are particularly preferable because of their high hole-trapping property, high emission efficiency, and high reliability.

Examples of materials that can be used as the phosphorescent substance in the light-emitting layer 113 are as follows.

The examples include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); organometallic iridium complexes having 1H-triazole skeletons, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic iridium complexes having imidazole skeletons, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic iridium complexes in which aphenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(II) picolinate (abbreviation: FIrpic), bis{2-[3',5'-bis(trifluoromethyl)phenyl]pyridinato-N,C$^2$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)). These are compounds emitting blue phosphorescence and have an emission peak at 440 nm to 520 nm.

Other examples include organometallic iridium complexes having pyrimidine skeletons, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(I) (abbreviation: [Ir(tBuppm)$_2$(acac)]), (acetylacetonato)bis[6-(2-norbornyl)-4-phenylpyrimidinato]iridium(II) (abbreviation: [Ir(nbppm)$_2$(acac)]), (acetylacetonato)bis[5-methyl-6-(2-methylphenyl)-4-phenylpyrimidinato]iridium(II) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having pyrazine skeletons, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having pyridine skeletons, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(II) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(II) acetylacetonate (abbreviation: [Ir(pq)$_2$(acac)]); and rare earth metal complexes such as tris(acetylacetonato)(monophenanthroline)terbium(III) (abbreviation: [Tb(acac)$_3$(Phen)]). These are mainly compounds emitting green phosphorescence and have an emission peak at 500 nm to 600 nm. Note that organometallic iridium complexes having pyrimidine skeletons have distinctively high reliability and emission efficiency and thus are especially preferable.

Other examples include organometallic iridium complexes having pyrimidine skeletons, such as (diisobutyrylmethanato)bis[4,6-bis(3-methylphenyl)pyrimidinato]iridium(II) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), bis[4,6-di (naphthalen-1-yl)pyrimidinato](dipivaloylmethanato)iridium(III) (abbreviation: [Ir(d1npm)$_2$(dpm)]); organometallic iridium complexes having pyrazine skeletons, such as (acetylacetonato)bis(2,3,5-triphenylpyrazinato)iridium(III) (abbreviation: [Ir(tppr)$_2$(acac)]), bis(2,3,5-triphenylpyrazinatoxdipivaloylmethanato)iridium(III) (abbreviation: [Ir(tppr)$_2$(dpm)]), and (acetylacetonato)bis[2,3-bis(4-fluorophenyl)quinoxalinato]iridium(II) (abbreviation: [Ir(Fdpq)$_2$(acac)]); organometallic iridium complexes having pyridine skeletons, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrin platinum (II) (abbreviation: PtOEP); and rare earth metal complexes such as tris(1,3-diphenyl-1,3-propanedionatoXmonophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). These are compounds emitting red phosphorescence and have an emission peak at 600 nm to 700 nm. Furthermore, organometallic iridium complexes having pyrazine skeletons can provide red light emission with favorable chromaticity.

As well as the above phosphorescent compounds, known phosphorescent materials may be selected and used.

Examples of the TADF material include a fullerene, a derivative thereof, an acridine derivative such as proflavine, eosin, or the like, and a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)), which are shown in the following structural formulae.

[Chemical Formulae 1]

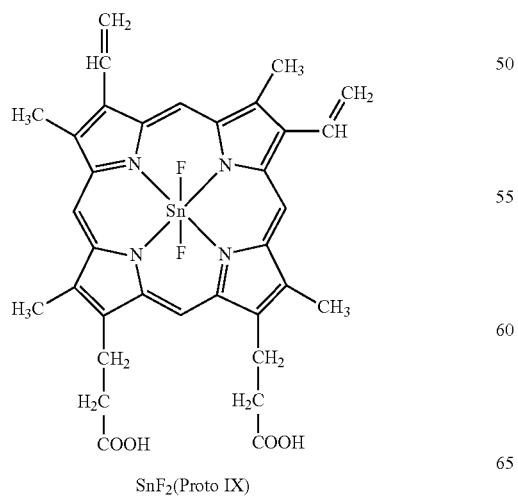

SnF$_2$(Proto IX)

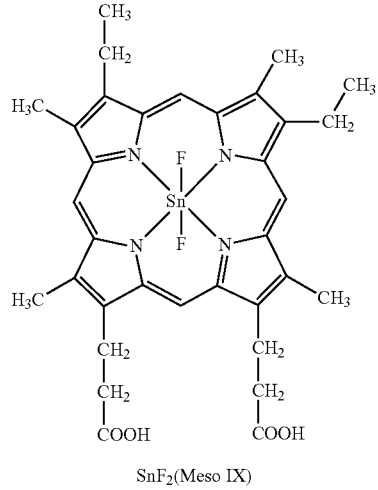

SnF$_2$(Meso IX)

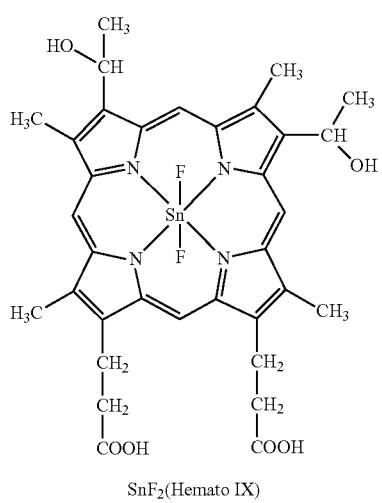

SnF$_2$(Hemato IX)

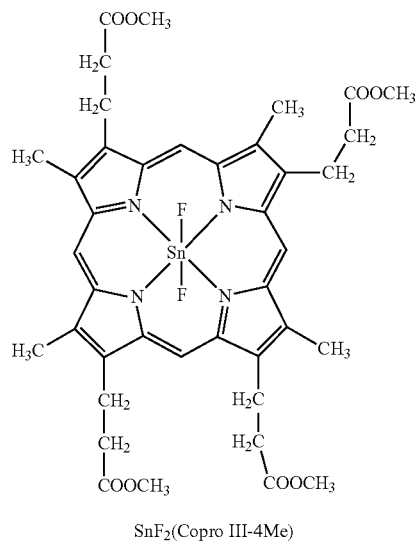

SnF$_2$(Copro III-4Me)

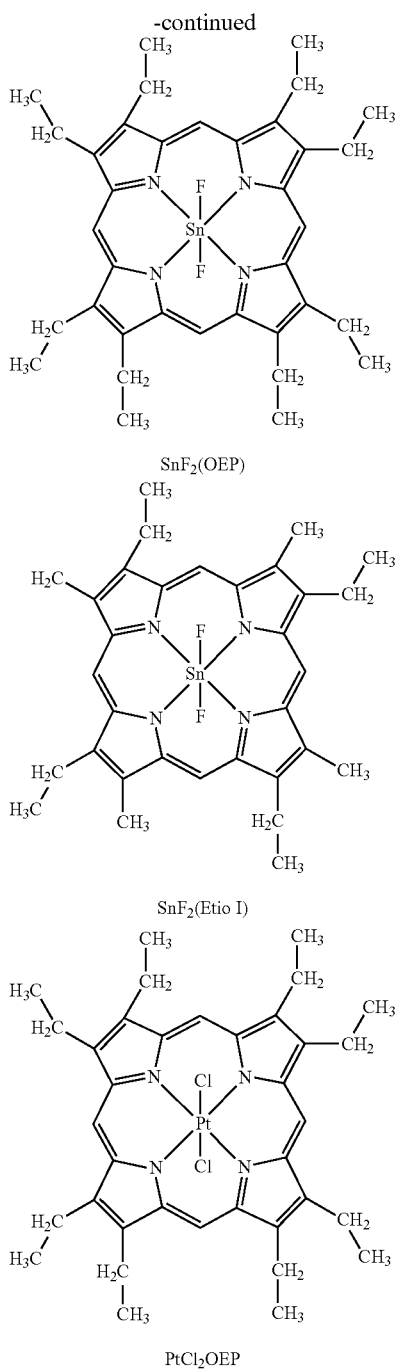

SnF₂(OEP)

SnF₂(Etio I)

PtCl₂OEP

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ) shown in the following structural formula, can be used. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the energy difference between the $S_1$ level and the $T_1$ level becomes small.

[Chemical Formula 2]

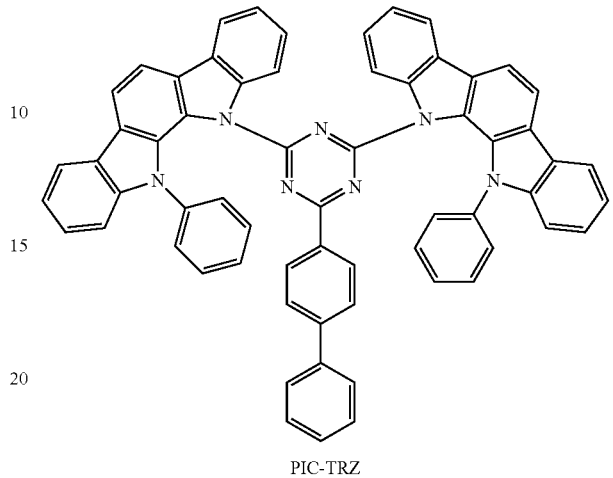

PIC-TRZ

A variety of carrier-transport materials can be used as the host material of the light-emitting layer. As the carrier-transport material, any of substances having a hole-transport property and substances having an electron-transport property listed below and the like can be used. It is needless to say that it is possible to use a material having a hole-transport property, a material having an electron-transport property, or a bipolar material other than the substances listed below.

The following are examples of materials having a hole-transport property: compounds having aromatic amine skeletons, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBAIBP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having carbazole skeletons, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having thiophene skeletons, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-m), and 4-[4-(9-phenyl-9H-fluoren-9-yl)phenyl]-6-phenyldibenzothiophene (abbreviation: DBTFLP-IV); and compounds having furan skeletons, such as 4,4',4''-(benzene-1,3,5-triyl)tri(dibenzofuran) (abbreviation: DBF3P-II) and 4-{3-[3-(9-phenyl-9H-fluoren-9-yl)

phenyl]phenyl}dibenzofuran (abbreviation: mmDBFFLBi-II). Among the above materials, the compounds having aromatic amine skeletons and the compounds having carbazole skeletons are preferred because these compounds are highly reliable and have a high hole-transport property and contribute to a reduction in drive voltage.

The following are examples of materials having an electron-transport property: metal complexes such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBT-BIm-II); heterocyclic compounds having diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compounds having pyridine skeletons, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compounds having diazine skeletons and the heterocyclic compounds having pyridine skeletons are highly reliable and preferred. In particular, the heterocyclic compounds having diazine (pyrimidine or pyrazine) skeletons have a high electron-transport property and contribute to a decrease in drive voltage.

Note that the host material may be a mixture of a plurality of kinds of substances, and in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The ratio of the content of the material having a hole-transport property to the content of the material having an electron-transport property may be 1:9 to 9:1.

An exciplex may be formed by these mixed materials. When these mixed materials are selected so as to form an exciplex that exhibits light emission whose wavelength overlaps with the wavelength of a lowest-energy-side absorption band of the light-emitting material, energy can be transferred smoothly and light emission can be obtained efficiently. In addition, such a combination is preferable in that driving voltage can be reduced.

The electron-transport layer 114 contains a substance having an electron-transport property. As the substance having an electron-transport property, it is possible to use any of the above-listed substances having an electron-transport property that can be used as a host material.

An alkali metal, an alkaline earth metal, or a compound thereof such as lithium fluoride (LiF), cesium fluoride (CsF), or calcium fluoride (CaF$_2$) may be provided between the electron-transport layer 114 and the cathode 102 as part of the cathode 102. For example, a layer that is formed using a substance having an electron-transport property and that contains an alkali metal, an alkaline earth metal, a compound thereof, or an electride can be used. Examples of the electride include a substance in which electrons are added at high concentration to calcium oxide-aluminum oxide.

Here, examples of particularly preferable structures for the light-emitting element of one embodiment of the present invention are described.

In the light-emitting element of one embodiment of the present invention, the host material is preferably a substance including a condensed aromatic ring skeleton including 3 to 6 rings. Examples of the substance including a condensed aromatic ring skeleton including 3 to 6 rings are substances including an anthracene skeleton such as CzPA, 7-[4-(10-phenyl-9-anthryl)phenyl]-7H-dibenzo[c,g]carbazole (abbreviation: cgDBCzPA), 9-phenyl-3-[4-(10-phenyl-9-anthryl)phenyl]-9H-carbazole (abbreviation: PCzPA), 4-[3-(9,10-diphenyl-2-anthryl)phenyl]dibenzofuran (abbreviation: 2mDBFPPA-II), t-BuDNA, and 9-(2-naphthyl)-10-[4-(1-naphthyl)phenyl]anthracene (abbreviation: BH-1); substances including a tetracene skeleton such as 5,12-diphenyltetracene (abbreviation: DPT), rubrene, and 2,8-di-tert-butyl-5,11-bis(4-tert-butylphenyl)-6,12-diphenyltetracene (abbreviation: TBRb); substances including a pyrene skeleton such as 1,3,5-tri(1-pyrenyl)benzene (abbreviation: TPB3), 9,9-bis[4-(1-pyrenyl)phenyl]-9H-fluoren (abbreviation: BPPF), and 2,7-bis(1-pyrenyl)-spiro-9,9'-bifluorene (abbreviation: Spyro-pye); a substance including a perylene skeleton such as 2,5,8,11-tetra(tert-butyl)perylene (abbreviation: TBP); a substance including a fluoranthene skeleton; and a substance including a dibenzochrysene skeleton. Among these substances, substances including an anthracene skeleton are particularly preferred as described above.

In the light-emitting element of one embodiment of the present invention, the electron-transport layer 114 preferably has a two-layer structure of the first electron-transport layer 114-1 and the second electron-transport layer 114-2. The material for the first electron-transport layer 114-1 and the material for the second electron-transport layer 114-2 preferably include different heteroaromatic ring skeletons, in which case the LUMO level of the material for the first electron-transport layer 114-1 can be lower (deeper) than the LUMO level of each of the host material and the material for the second electron-transport layer 114-2.

Note that the substance including a heteroaromatic ring skeleton for the first electron-transport layer 114-1 and that for the second electron-transport layer 114-2 are preferably substances including a six-membered nitrogen-containing heteroaromatic ring skeleton. A substance including a six-membered nitrogen-containing heteroaromatic skeleton has higher reliability as an electron acceptor than a five-membered nitrogen-containing heterocyclic skeleton (e.g., pyrrole, indole, carbazole, imidazole, benzimidazole, triazole, or benzotriazole), leading to a light-emitting element having high reliability. A substance including a six-membered nitrogen-containing heteroaromatic skeleton is particularly suitable for the material for the first electron-transport layer 114-1 because the substance including a six-membered nitrogen-containing heteroaromatic skeleton tends to have a deeper LUMO level than a substance including a five-membered nitrogen-containing heterocyclic skeleton.

Therefore, the substance including a heteroaromatic ring skeleton for the first electron-transport layer 114-1 preferably includes a triazine skeleton or a diazine skeleton (in particular, a pyrazine skeleton or a pyrimidine skeleton). In particular, the substance including a heteroaromatic ring skeleton preferably includes a condensed heteroaromatic ring skeleton. Favorable examples the condensed heteroaromatic ring skeleton including a diazine skeleton include a highly reliable benzoquinazoline skeleton or a dibenzoquinoxaline skeleton. In particular, a dibenzoquinoxaline skeleton is preferred because its LUMO level is easily deep. The light-emitting element of one embodiment of the present invention with the above-described structure can have a long lifetime, which shows less degradation due to an increase in driving time.

The substance including a heteroaromatic ring skeleton for the second electron-transport layer 114-2 is preferably a substance including a pyridine skeleton or a bipyridine skeleton in the case where the second electron-transport layer 114-2 is in contact with the cathode. In the case where the substance including a heteroaromatic ring skeleton for the first electron-transport layer 114-1 includes a triazine skeleton or a diazine skeleton (in particular, a pyrazine skeleton or a pyrimidine skeleton), a combination of the pyridine skeleton or the bipyridine skeleton with the triazine skeleton or the diazine skeleton is preferred because the LUMO level of the pyridine skeleton or the bipyridine skeleton is higher than the LUMO level of the triazine skeleton or the diazine skeleton. The pyridine skeleton or the bipyridine skeleton may form a condensed ring, for example, may form a phenanthroline skeleton.

Examples of the substances including a heteroaromatic ring skeleton for the first electron-transport layer 114-1 and the second electron-transport layer 114-2 include substances including a dibenzoquinoxaline skeleton such as 2mDBTP-DBq-II, 2mDBTBPDBq-II, 2-{3-[3-(2,8-diphenyldibenzothiophen-4-yl)phenyl]phenyl}dibenzo[f,h]quinoxaline (abbreviation: 2mDBTBPDBq-II), 2-{3-[3-(6-phenyldibenzothiophen-4-yl)phenyl]phenyl}dibenzo[f,h]quinoxaline (abbreviation: 2mDBTBPDBq-IV), 2-[4-(9-phenyl-9H-carbazol-3-yl)phenyl]dibenzo[f,h]quinoxaline (abbreviation: PCPDBq), 2-[3-(3,6-diphenyl-9H-carbazol-9-yl)phenyl]dibenzo[f,h]quinoxaline (abbreviation: 2mCzP-DBq-III), 2-[3'-(9H-carbazol-9-yl)biphenyl-3-yl]dibenzo[f,h]quinoxaline (abbreviation: 2mCzBPDBq), 7-[3-(dibenzothiophen-4-yl)phenyl]dibenzo[f,h]quinoxaline (abbreviation: 7mDBTPDBq-II), and 7-[3'-(dibenzothiophen-4-yl)biphenyl-3-yl]dibenzo[f,h]quinoxaline (abbreviation: 7mDBTBPDBq-II); substances including a benzoquinazoline skeleton such as 2,2'-(pyridine-2,6-diyl)bis(4-phenylbenzo[h]quinazoline) (abbreviation: 2,6(P-Bqn)2Py); substances including a pyrimidine skeleton such as 4,6mDBTP2Pm-II, 4,6-bis[3-(9H-carbazol-9-yl)phenyl]pyrimidine (abbreviation: 4,6mCzP2Pm), 4-[3'-(dibenzothiophen-4-yl)biphenyl-3-yl]benzofuro[3,2-d]pyrimidine (abbreviation: 4mDBTBPBfpm-II), 4-{3-[3'-(9H-carbazol-9-yl)]biphenyl-3-yl}benzofuro[3,2-d]pyrimidine (abbreviation: 4mCzBPBfPm), 4,6-bis[3,5-di(pyridin-3-yl)phenyl]-2-methylpyrimidine (abbreviation: B3PYMPM), and 2,2'-(pyridine-2,6-diyl)bis(4,6-diphenylpyrimidine) (abbreviation: 2,6(P2Pm)2Py); substances including a pyrazine skeleton such as pyrazino[2,3-f][1,10]phenanthroline-2,3-dicarbonitrile (abbreviation: PPDN), 2,3-diphenylpyrido[2,3-b]pyrazine (abbreviation: 2PYPR), and 2,3-diphenylpyrido[3,4-b]pyrazine (abbreviation: 3PYPR); substances including a triazine skeleton such as 2,4,6-tris(2-pyridyl)-1,3,5-triazine (abbreviation: 2Py3Tzn), 2,4,6-tris[3'-(pyridin-3-yl)biphenyl-3-yl]-1,3,5-triazine (abbreviation: TmPPPyTz), and 3-[4-(9H-carbazol-9-yl)phenyl]-9-(4,6-diphenyl-1,3,5-triazin-2-yl)-9H-carbazole (abbreviation: CPCBPTz); substances including a phenanthroline skeleton such as bathocuproine (abbreviation: BCP), bathophenanthroline (abbreviation: Bphen), 2,9-bis(naphthalen-2-yl)-4,7-diphenyl-1,10-phenanthroline (abbreviation: NBPhen), and 4,4'-di(1,10-phenanthrolin-2-yl)biphenyl (abbreviation: Phen2BP); substances including a bipyridine skeleton such as 4,4'-bis[3-(9H-carbazol-9-yl)phenyl]-2,2'-bipyridine (abbreviation: 4,4'mCzP2BPy), 4,4'-bis[3-(dibenzothiophen-4-yl)phenyl]-2,2'-bipyridine (abbreviation: 4,4'mDBTP2BPy-II), and 4,4'-bis[3-(dibenzofuran-4-yl)phenyl]-2,2'-bipyridine (abbreviation: 4,4'DBfP2BPy-II); and substances including a pyridine skeleton such as tris[2,4,6-trimethyl-3-(3-pyridyl)phenyl]borane (abbreviation: 3TPYMB), 1,3,5-tri[3-(3-pyridyl)phenyl]benzene (abbreviation: TmPyPB), 3,3',5,5'-tetra[(m-pyridyl)-phen-3-yl]biphenyl (abbreviation: BP4mPy), and 1,3-bis[3,5-di(pyridin-3-yl)phenyl]benzene (abbreviation: BmPyPhB). Among these substances and the above-mentioned substances including a condensed aromatic ring skeleton including 3 to 6 rings which can be used as the host material, materials may be selected such that the LUMO level of each of the host material and the material for the second electron-transport layer 114-2 is higher (shallower) than the LUMO level of the material for the first electron-transport layer 114-1.

Among the light-emitting elements with favorable structures, the light-emitting element using a composite material of a metal oxide and a substance having a hole-transport property for the hole-injection layer 111 can have particularly high emission efficiency (e.g., external quantum efficiency or current efficiency). Furthermore, the light-emitting element of one embodiment of the present invention in which an organic acceptor, specifically, HAT-CN is used for the hole-injection layer can suppress the roll-off of the efficiency in the high luminance region, and thus the light-emitting element can achieve high luminance and high efficiency.

Figure 1B:
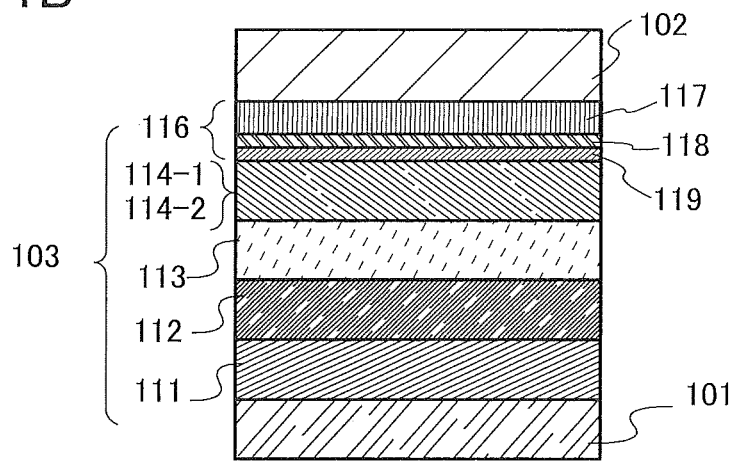

Instead of the electron-injection layer 115, the charge-generation layer 116 may be provided (FIG. 1B). The charge-generation layer 116 refers to a layer capable of injecting holes into a layer in contact with the cathode side of the charge-generation layer 116 and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the electron-transport layer 114 and holes are injected into the cathode 102; thus, the light-emitting element operates.

Note that the charge-generation layer 116 preferably includes either an electron-relay layer 118 or an electron-injection buffer layer 119 or both in addition to the p-type layer 117.

The electron-relay layer 118 contains at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the substance having an acceptor property in the p-type layer 117 and the LUMO level of a substance contained in a layer of the electron-transport layer 114 in contact with the charge-generation layer 116. As a specific value of the energy level, the LUMO level of the substance having an electron-transport property in the electron-relay layer 118 is preferably higher than or equal to −5.0 eV, more preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having a high electron-injection property can be used for the electron-injection buffer layer 119. For example, an alkali metal, an alkaline earth metal, a rare earth metal, or a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)) can be used.

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having an electron-transport property, a material similar to the above-described material used for the electron-transport layer 114 can be used.

For the cathode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the cathode 102 and the electron-transport layer, for the cathode 102, any of a variety of conductive materials such as Al, Ag, ITO, or indium oxide-tin oxide containing silicon or silicon oxide can be used regardless of the work function. Films of these conductive materials can be formed by a dry method such as a vacuum evaporation method or a sputtering method, an inkjet method, a spin coating method, or the like. In addition, the electrode may be formed by a wet method using a sol-gel method, or by a wet method using paste of a metal material.

Any of a variety of methods can be used to form the EL layer 103 regardless of whether it is a dry process or a wet process. For example, a vacuum evaporation method, a gravure printing method, an offset printing method, a screen printing method, an inkjet method, a spin coating method, or the like may be used.

Different methods may be used to form the electrodes or the layers described above.

The structure of the layers provided between the anode 101 and the cathode 102 is not limited to the above-described structure. Preferably, a light-emitting region where holes and electrons recombine is positioned away from the anode 101 and the cathode 102 so that quenching due to the proximity of the light-emitting region and a metal used for electrodes and carrier-injection layers can be prevented.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting substance of the light-emitting layer or the emission center substance included in the light-emitting layer.

Next, an embodiment of a light-emitting element with a structure in which a plurality of light-emitting units are stacked (this type of light-emitting element is also referred to as a stacked element or a tandem element) is described with reference to FIG. 1C. In this light-emitting element, a plurality of light-emitting units are provided between an anode and a cathode. One light-emitting unit has a structure similar to that of the EL layer 103, which is illustrated in FIG. 1A. In other words, the light-emitting element illustrated in FIG. 1C is a light-emitting element including a plurality of light-emitting units; each of the light-emitting elements illustrated in FIGS. 1A and 1B is a light-emitting element including a single light-emitting unit.

Figure 1C:
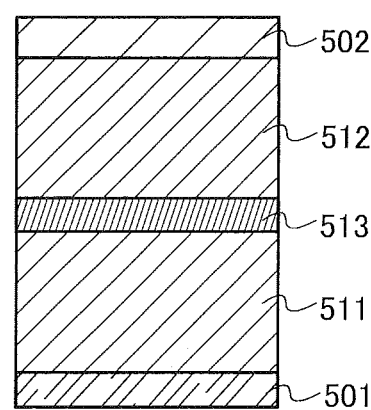

In FIG. 1C, a first light-emitting unit 511 and a second light-emitting unit 512 are stacked between a first electrode 501 and a second electrode 502, and a charge-generation layer 513 is provided between the first light-emitting unit 511 and the second light-emitting unit 512. The first electrode 501 and the second electrode 502 correspond, respectively, to the anode 101 and the cathode 102 illustrated in FIG. 1A, and the materials given in the description for FIG. 1A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied between the first electrode 501 and the second electrode 502. That is, in FIG. 1C, the charge-generation layer 513 injects electrons into the first light-emitting unit 511 and holes into the second light-emitting unit 512 when a voltage is applied so that the potential of the first electrode becomes higher than the potential of the second electrode.

The charge-generation layer 513 preferably has a structure similar to the charge-generation layer 116 described with reference to FIG. 1B. Since the composite material of an organic compound and a metal oxide is superior in carrier-injection property and carrier-transport property, low-voltage driving or low-current driving can be achieved. Note that when a surface of a light-emitting unit on the anode side is in contact with the charge-generation layer 513, the charge-generation layer 513 can also serve as a hole-injection layer in the light-emitting unit and a hole-transport layer is not necessarily formed in the light-emitting unit.

In the case where the electron-injection buffer layer 119 is provided, the electron-injection buffer layer 119 serves as the electron-injection layer in the light-emitting unit on the anode side which is in contact with the electron-injection buffer layer 119 and the light-emitting unit on the anode side does not necessarily further need an electron-injection layer.

The light-emitting element having two light-emitting units is described with reference to FIG. 1C; however, the present invention can be similarly applied to a light-emitting element in which three or more light-emitting units are stacked. With a plurality of light-emitting units partitioned by the charge-generation layer 513 between a pair of electrodes as in the light-emitting element according to this embodiment, it is possible to provide a light-emitting element which can emit light with high luminance with the current density kept low and has a long lifetime. Moreover, a light-emitting device having low power consumption, which can be driven at low voltage, can be manufactured.

Furthermore, when emission colors of light-emitting units are made different, light emission of a desired color can be provided from the light-emitting element as a whole. For example, in a light-emitting element having two light-emitting units, the emission colors of the first light-emitting unit may be red and green and the emission color of the second light-emitting unit may be blue, so that the light-emitting element can emit white light as the whole element.

The above-described structure can be combined with any of the structures in this embodiment and the other embodiments.

Embodiment 2

In this embodiment, a light-emitting device including the light-emitting element containing any of the organic compounds described in Embodiment 1 is described.

Figure 2A:
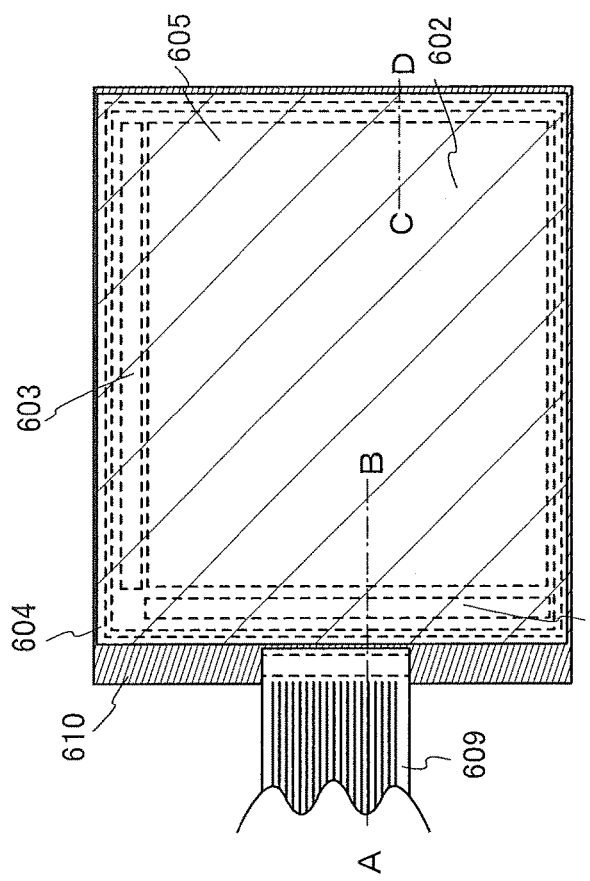
FIGS. 2A and 2B are conceptual diagrams of an active matrix light-emitting device.
Figure 2B:
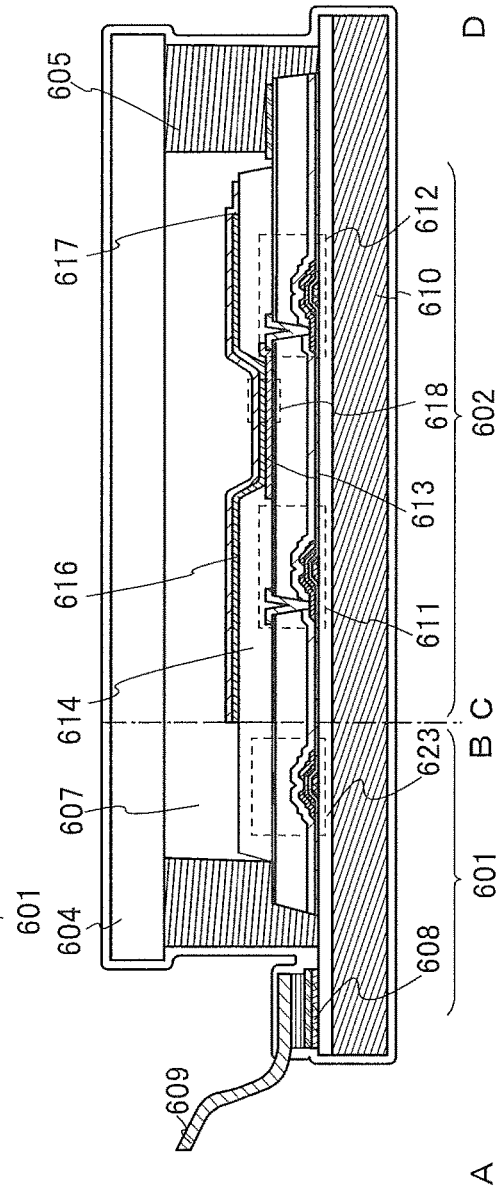

In this embodiment, the light-emitting device manufactured using the light-emitting element containing any of the organic compounds described in Embodiment 1 is described with reference to FIGS. 2A and 2B. Note that FIG. 2A is a top view of the light-emitting device and FIG. 2B is a cross-sectional view taken along the lines A-B and C-D in FIG. 2A. This light-emitting device includes a driver circuit portion (source line driver circuit) 601, a pixel portion 602, and a driver circuit portion (gate line driver circuit) 603, which are to control light emission of a light-emitting element and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure will be described with reference to FIG. 2B. The driver circuit portions and the pixel portion are formed over an element substrate 610; FIG. 2B shows the source line driver circuit 601, which is a driver circuit portion, and one pixel in the pixel portion 602.

The element substrate 610 may be a substrate containing glass, quartz, an organic resin, a metal, an alloy, or a semiconductor or a plastic substrate formed of fiber reinforced plastic (FRP), poly(vinyl fluoride) (PVF), polyester, or acrylic.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that to cover an end portion of the first electrode 613, an insulator 614 is formed, for which a positive photosensitive acrylic resin film is used here.

In order to improve coverage with an EL layer or the like which is formed later, the insulator 614 is formed to have a curved surface with curvature at its upper or lower end portion. For example, in the case where positive photosensitive acrylic is used as a material of the insulator 614, only the upper end portion of the insulator 614 preferably has a curved surface with a curvature radius (0.2 µm to 3 µm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 1. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, and Ca, or an alloy or a compound thereof, such as MgAg, MgIn, and AlLi) is preferably used. In the case where light generated in the EL layer 616 is transmitted through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the EL layer 616, and the second electrode 617. The light-emitting element is the light-emitting element described in Embodiment 1. In the light-emitting device of this embodiment, the pixel portion, which includes a plurality of light-emitting elements, may include both the light-emitting element described in Embodiment 1 and a light-emitting element having a different structure.

The sealing substrate 604 is attached to the element substrate 610 with the sealing material 605, so that a light-emitting element 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case deterioration due to influence of moisture can be suppressed.

An epoxy-based resin or glass frit is preferably used for the sealing material 605. It is preferable that such a material not be permeable to moisture or oxygen as much as possible. As the sealing substrate 604, a glass substrate, a quartz substrate, or a plastic substrate formed of fiber reinforced plastic (FRP), poly(vinyl fluoride) (PVF), polyester, and acrylic can be used.

Although not illustrated in FIGS. 2A and 2B, a protective film may be provided over the second electrode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting device manufactured using the light-emitting element described in Embodiment 1 can be obtained.

The light-emitting device in this embodiment is manufactured using the light-emitting element described in Embodiment 1 and thus can have favorable characteristics.

Specifically, since the light-emitting element described in Embodiment 1 has a long lifetime, the light-emitting device can have high reliability. Since the light-emitting device using the light-emitting element described in Embodiment 1 has high emission efficiency, the light-emitting device can achieve low power consumption.

FIGS. 3A and 3B each illustrate an example of a light-emitting device in which full color display is achieved by formation of a light-emitting element exhibiting white light emission and with the use of coloring layers (color filters) and the like. In FIG. 3A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1025, an EL layer 1028, a second electrode 1029 of the light-emitting elements, a sealing substrate 1031, a sealing material 1032, and the like are illustrated.

In FIG. 3A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 3A, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, green, or blue, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
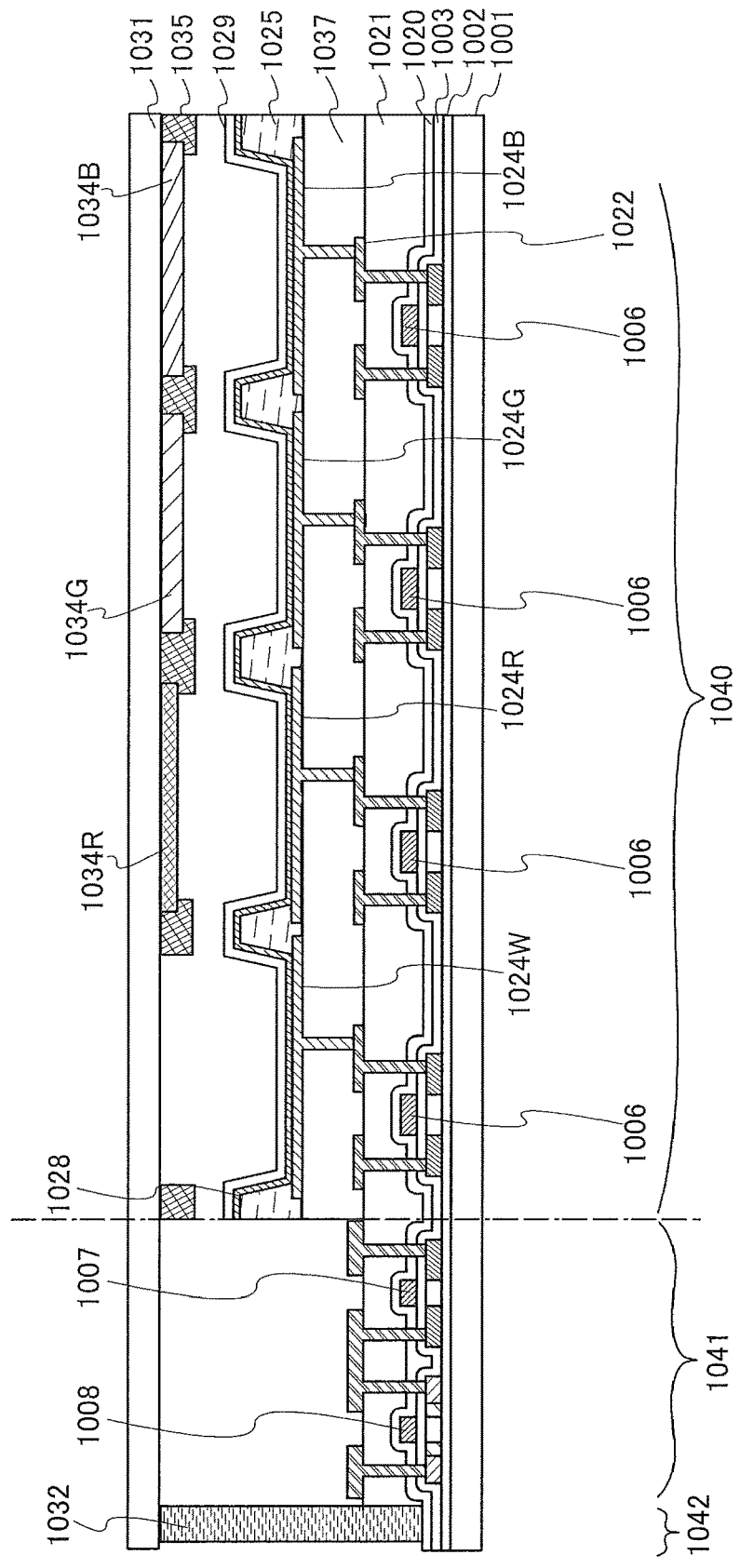
FIG. 4 is a conceptual diagram of an active matrix light-emitting device.

The above-described light-emitting device is a light-emitting device having a structure in which light is extracted from the substrate 1001 side where FETs are formed (a bottom emission structure), but may be a light-emitting device having a structure in which light is extracted from the sealing substrate 1031 side (a top emission structure). FIG. 4 is a cross-sectional view of a light-emitting device having a top emission structure. In this case, a substrate which does not transmit light can be used as the substrate 1001. The process up to the step of forming a connection electrode which connects the FET and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The first electrodes 1024W, 1024R, 1024G, and 1024B of the light-emitting elements each serve as an anode here, but may serve as a cathode. Furthermore, in the case of a light-emitting device having a top emission structure as illustrated in FIG. 4, the first electrodes are preferably reflective electrodes. The EL layer 1028 is formed to have a structure similar to the structure of the EL layer 103, which is described in Embodiment 1, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix may be covered with the overcoat layer. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting device having a top emission structure, a microcavity structure can be favorably employed. A light-emitting element with a microcavity structure is formed with the use of a reflective electrode as the first electrode and a semi-transmissive and semi-reflective electrode as the second electrode. The light-emitting element with a microcavity structure includes at least an EL layer between the reflective electrode and the semi-transmissive and semi-reflective electrode, which includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the semi-transmissive and semi-reflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the semi-transmissive and semi-reflective electrode.

In the light-emitting element, by changing thicknesses of the transparent conductive film, the composite material, the carrier-transport material, and the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of color to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting element described above may be combined with a plurality of EL layers; for example, a light-emitting element may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting device which displays images with subpixels of four colors, red, yellow, green, and blue, the light-emitting device can have favorable characteristics because the luminance can be increased owing to yellow light emission and each subpixel can employ a microcavity structure suitable for wavelengths of the corresponding color.

The light-emitting device in this embodiment is manufactured using the light-emitting element described in Embodiment 1 and thus can have favorable characteristics. Specifically, since the light-emitting element described in Embodiment 1 has a long lifetime, the light-emitting device can have high reliability. Since the light-emitting device using the light-emitting element described in Embodiment 1 has high emission efficiency, the light-emitting device can achieve low power consumption.

Figure 5A:
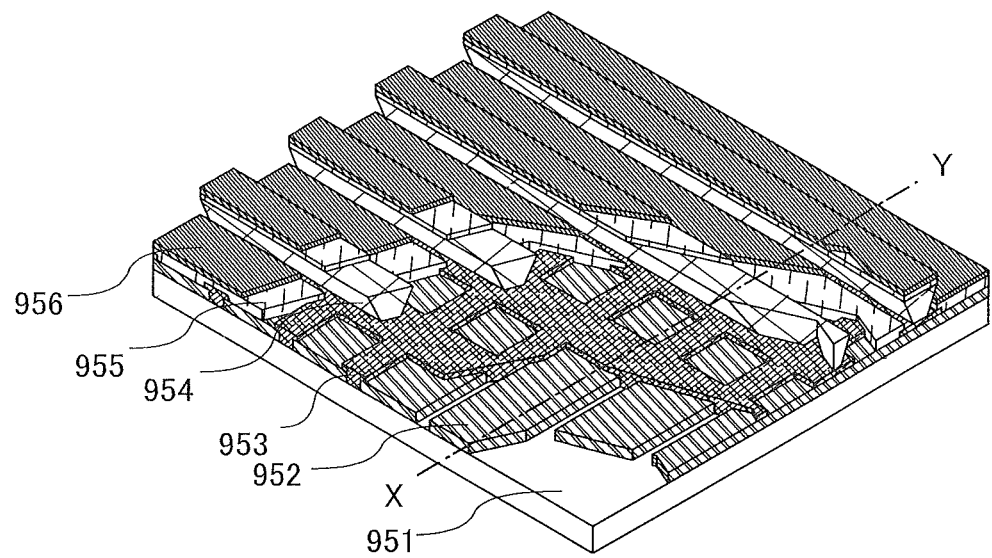
FIGS. 5A and 5B are conceptual diagrams of a passive matrix light-emitting device.
Figure 5B:
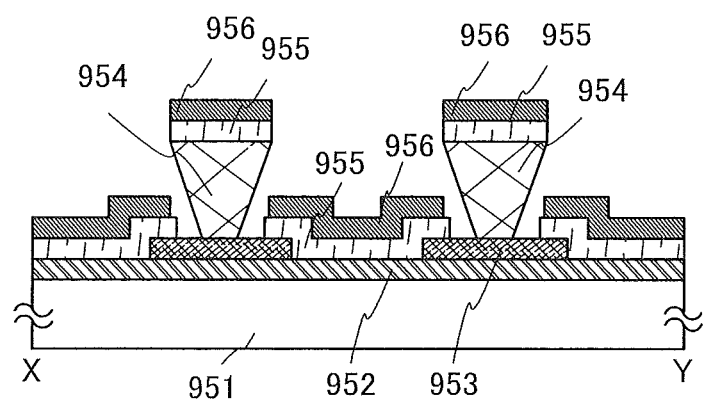

An active matrix light-emitting device is described above, whereas a passive matrix light-emitting device is described below. FIGS. 5A and 5B illustrate a passive matrix light-emitting device manufactured using the present invention. Note that FIG. 5A is a perspective view of the light-emitting device, and FIG. 5B is a cross-sectional view taken along the line X-Y in FIG. 5A. In FIGS. 5A and 5B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid which is parallel to the surface of the insulating layer 953 and is in contact with the insulating layer 953) is shorter than the upper side (a side of the trapezoid which is parallel to the surface of the insulating layer 953 and is not in contact with the insulating layer 953). The partition layer 954 thus provided can prevent defects in the light-emitting element due to static electricity or others. The passive-matrix light-emitting device also includes the light-emitting element described in Embodiment 1; thus, the light-emitting device can have high reliability or low power consumption.

Since many minute light-emitting elements arranged in a matrix in the light-emitting device described above can each be controlled, the light-emitting device can be suitably used as a display device for displaying images.

This embodiment can be freely combined with any of the other embodiments.

Embodiment 3

Figure 6A:
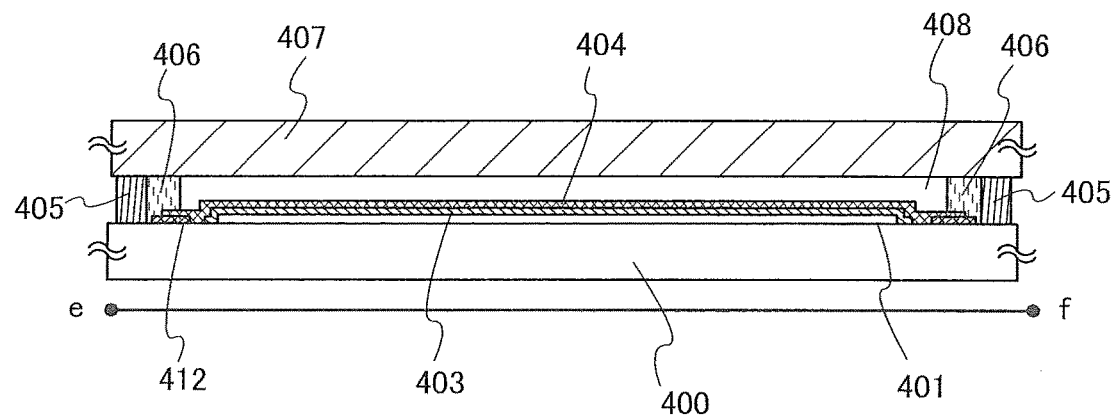
FIGS. 6A and 6B illustrate a lighting device.
Figure 6B:
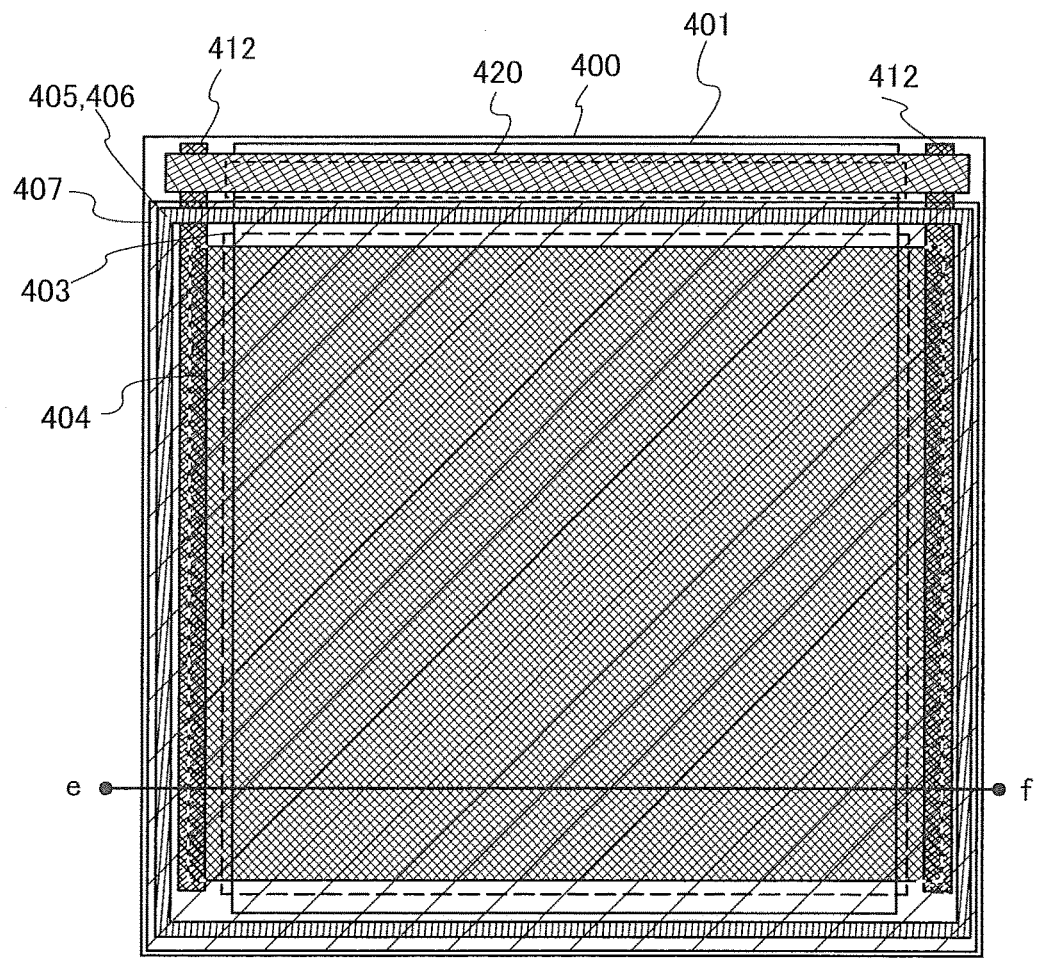

In this embodiment, an example in which the light-emitting element described in Embodiment 1 is used for a lighting device will be described with reference to FIGS. 6A and 6B. FIG. 6B is a top view of the lighting device, and FIG. 6A is a cross-sectional view taken along the line e-f in FIG. 6B.

In the lighting device in this embodiment, a first electrode 401 is formed over a substrate 400 which is a support and has a light-transmitting property. The first electrode 401 corresponds to the anode 101 in Embodiment 1. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 1, or the structure in which the light-emitting units 511 and 512 and the charge-generation layer 513 are combined. Refer to the descriptions for the structure.

The second electrode 404 is formed to cover the EL layer 403. The second electrode 404 corresponds to the cathode 102 in Embodiment 1. The second electrode 404 is formed using a material having high reflectance when light is extracted through the first electrode 401 side. The second electrode 404 is connected to the pad 412, whereby voltage is applied.

As described above, the lighting device described in this embodiment includes a light-emitting element including the first electrode 401, the EL layer 403, and the second electrode 404. Since the light-emitting element is a light-emitting element with high emission efficiency, the lighting device in this embodiment can be a lighting device having low power consumption.

The substrate 400 provided with the light-emitting element having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not shown in FIG. 6B) can be mixed with a desiccant which enables moisture to be adsorbed, increasing reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

The lighting device described in this embodiment includes as an EL element the light-emitting element described in Embodiment 1; thus, the light-emitting device can have high reliability. The light-emitting device can also have high heat resistance.

Embodiment 4

In this embodiment, examples of electronic devices each including the light-emitting element described in Embodiment 1 are described. The light-emitting element described in Embodiment 1 has a long lifetime and high reliability. As a result, the electronic devices described in this embodiment can each include a light-emitting portion having high reliability.

Examples of the electronic devices to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are given below.

FIG. 7A illustrates an example of a television device. In the television device, a display portion 7103 is incorporated in a housing 7101. Here, the housing 7101 is supported by a stand 7105. Images can be displayed on the display portion

7103, and in the display portion 7103, the light-emitting elements described in Embodiment 1 are arranged in a matrix.

Operation of the television device can be performed with an operation switch of the housing 7101 or a separate remote controller 7110. With operation keys 7109 of the remote controller 7110, channels and volume can be controlled and images displayed on the display portion 7103 can be controlled. The remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured by arranging light-emitting elements described in Embodiment 1 in a matrix in the display portion 7203. The computer illustrated in FIG. 7B1 may have a structure illustrated in FIG. 7B2. The computer illustrated in FIG. 7B2 is provided with a second display portion 7210 instead of the keyboard 7204 and the pointing device 7206. The second display portion 7210 has a touch screen, and input can be performed by operation of images, which are displayed on the second display portion 7210, with a finger or a dedicated pen. The second display portion 7210 can also display images other than the display for input. The display portion 7203 may also have a touch screen. Connecting the two screens with a hinge can prevent troubles; for example, the screens can be prevented from being cracked or broken while the computer is being stored or carried.

FIG. 7C illustrates a portable game machine having two housings, a housing 7301 and a housing 7302, which are connected with a joint portion 7303 so that the portable game machine can be folded. The housing 7301 incorporates a display portion 7304 in which the light-emitting elements described in Embodiment 1 are arranged in a matrix, and the housing 7302 incorporates a display portion 7305. In addition, the portable game machine illustrated in FIG. 7C includes a speaker portion 7306, a recording medium insertion portion 7307, an LED lamp 7308, input means (an operation key 7309, a connection terminal 7310, a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion in which the light-emitting elements described in Embodiment 1 are arranged in a matrix is used as either the display portion 7304 or the display portion 7305, or both, and the structure can include other accessories as appropriate. The portable game machine illustrated in FIG. 7C has a function of reading out a program or data stored in a recoding medium to display it on the display portion, and a function of sharing information with another portable game machine by wireless communication. Note that functions of the portable game machine illustrated in FIG. 7C are not limited to them, and the portable game machine can have various functions.

FIG. 7D illustrates an example of a portable terminal. The mobile phone is provided with a display portion 7402 incorporated in a housing 7401, operation buttons 7403, an external connection port 7404, a speaker 7405, a microphone 7406, and the like. Note that the mobile phone 7400 has the display portion 7402 in which the light-emitting elements described in Embodiment 1 are arranged in a matrix.

When the display portion 7402 of the portable terminal illustrated in FIG. 7D is touched with a finger or the like, data can be input into the portable terminal. In this case, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating an e-mail, a character input mode is selected for the display portion 7402 so that characters displayed on a screen can be input. In this case, it is preferable to display a keyboard or number buttons on almost the entire screen of the display portion 7402.

When a sensing device including a sensor such as a gyroscope or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touch on the display portion 7402 or operation with the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by the display portion 7402 while in touch with the palm or the finger, whereby personal authentication can be performed. Furthermore, by providing a backlight or a sensing light source which emits near-infrared light in the display portion, an image of a finger vein, or a palm vein can be taken.

Note that the structure described in this embodiment can be combined with any of the structures described in Embodiments 1 to 4 as appropriate.

As described above, the application range of the light-emitting device including the light-emitting element described in Embodiment 1 is wide so that this light-emitting device can be applied to electronic devices in a variety of fields. By using the light-emitting element described in Embodiment 1, an electronic device having high reliability can be obtained.

Figure 8:
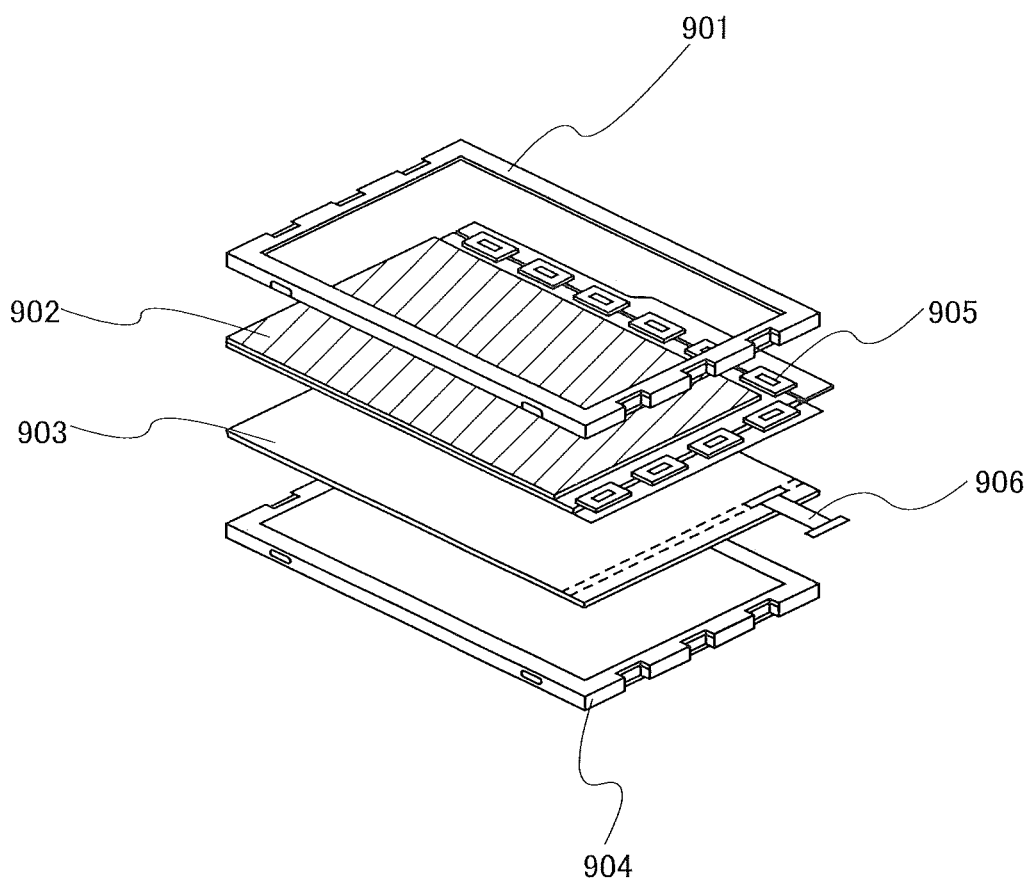
FIG. 8 illustrates a light source device.

FIG. 8 illustrates an example of a liquid crystal display device using the light-emitting element described in Embodiment 1 for a backlight. The liquid crystal display device illustrated in FIG. 8 includes a housing 901, a liquid crystal layer 902, a backlight unit 903, and a housing 904. The liquid crystal layer 902 is connected to a driver IC 905. The light-emitting element described in Embodiment 1 is used for the backlight unit 903, to which current is supplied through a terminal 906.

The light-emitting element described in Embodiment 1 is used for the backlight of the liquid crystal display device; thus, the backlight can have reduced power consumption. In addition, the use of the light-emitting element described in Embodiment 1 enables manufacture of a planar-emission lighting device and further a larger-area planar-emission lighting device; therefore, the backlight can be a larger-area backlight, and the liquid crystal display device can also be a larger-area device. Furthermore, the light-emitting device including the light-emitting element described in Embodiment 1 can be thinner than a conventional one; accordingly, the display device can also be thinner.

Figure 9:
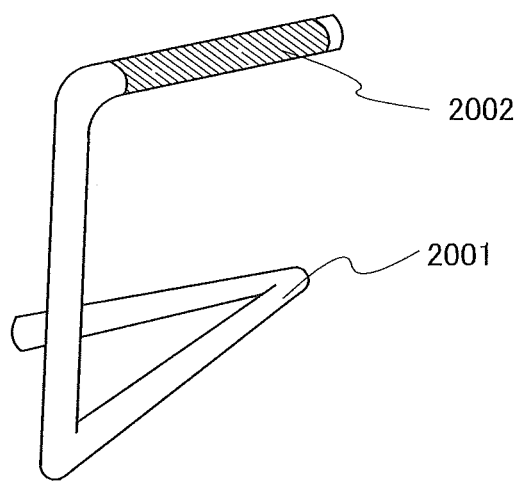
FIG. 9 illustrates a lighting device.

FIG. 9 illustrates an example in which the light-emitting element described in Embodiment 1 is used for a table lamp which is a lighting device. The table lamp illustrated in FIG. 9 includes a housing 2001 and a light source 2002, and the lighting device described in Embodiment 3 may be used for the light source 2002.

Figure 10:
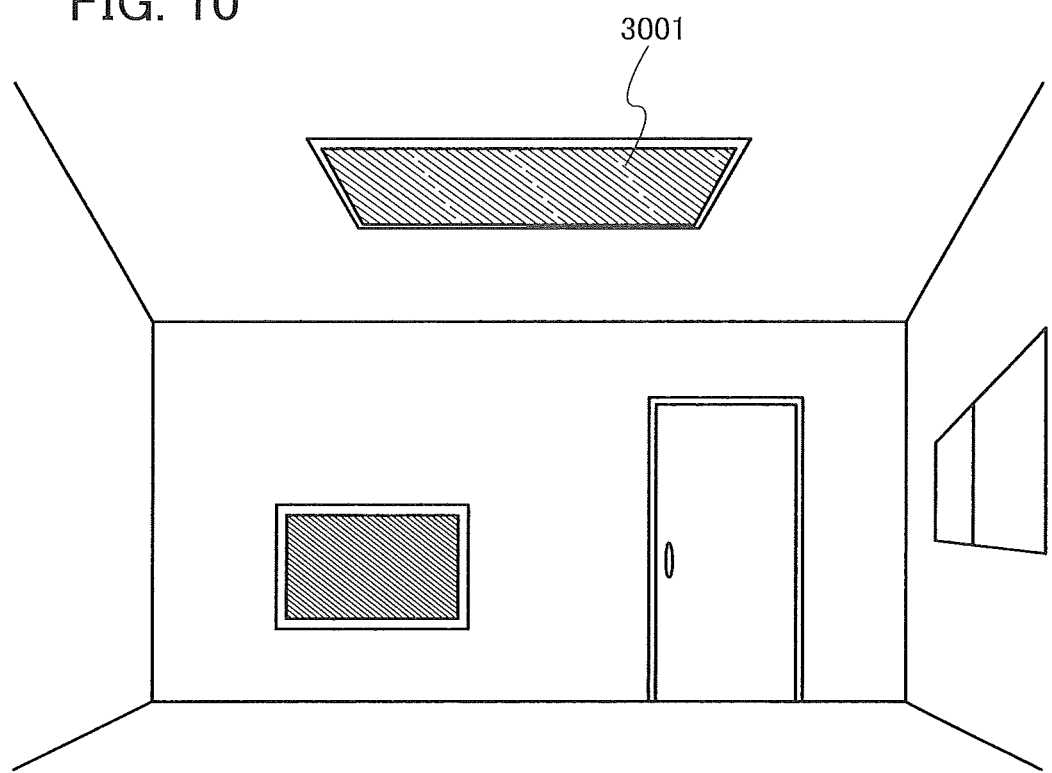
FIG. 10 illustrates a lighting device.

FIG. 10 illustrates an example in which the light-emitting element containing the organic compound described in Embodiment 1 is used for an indoor lighting device 3001. Since the light-emitting element containing the organic compound described in Embodiment 1 has high heat resistance, the lighting device can have high heat resistance. Furthermore, since the light-emitting element containing the organic compound described in Embodiment 1 can have a large area, the light-emitting element can be used for a large-area lighting device. Furthermore, since the light-emitting element containing the organic compound described in Embodiment 1 is thin, the light-emitting element can be used for a lighting device having a reduced thickness.

Figure 11:
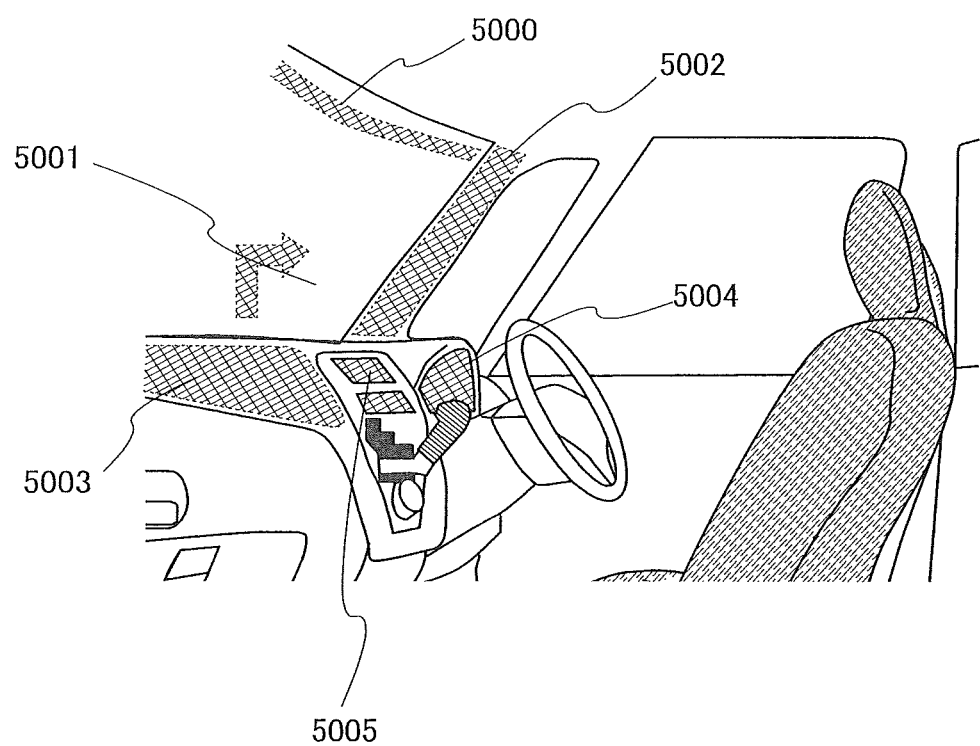
FIG. 11 illustrates in-vehicle display devices and lighting devices.

The light-emitting element described in Embodiment 1 can also be used for an automobile windshield or an automobile dashboard. FIG. 11 illustrates one mode in which the light-emitting element described in Embodiment 1 is used for an automobile windshield and an automobile dashboard. Display regions 5000 to 5005 each include the light-emitting element described in Embodiment 1.

The display region 5000 and the display region 5001 are display devices provided in the automobile windshield in which the light-emitting elements described in Embodiment 1 are incorporated. The light-emitting elements described in Embodiment 1 can be formed into what is called a see-through display device, through which the opposite side can be seen, by including a first electrode and a second electrode formed of electrodes having a light-transmitting property. Such see-through display devices can be provided even in the automobile windshield, without hindering the vision. Note that in the case where a driving transistor or the like is provided, a transistor having a light-transmitting property, such as an organic transistor using an organic semiconductor material or a transistor using an oxide semiconductor, is preferably used.

The display region 5002 is a display device provided in a pillar portion in which the light-emitting elements described in Embodiment 1 are incorporated. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of kinds of information such as navigation data, a speedmeter, a tachometer, a mileage, a fuel level, a gearshift state, and air-condition setting. The content or layout of the display can be freely changed by a user as appropriate. Note that such information can also be shown by the display regions 5000 to 5003. The display regions 5000 to 5005 can also be used as lighting devices.

Figure 12A:
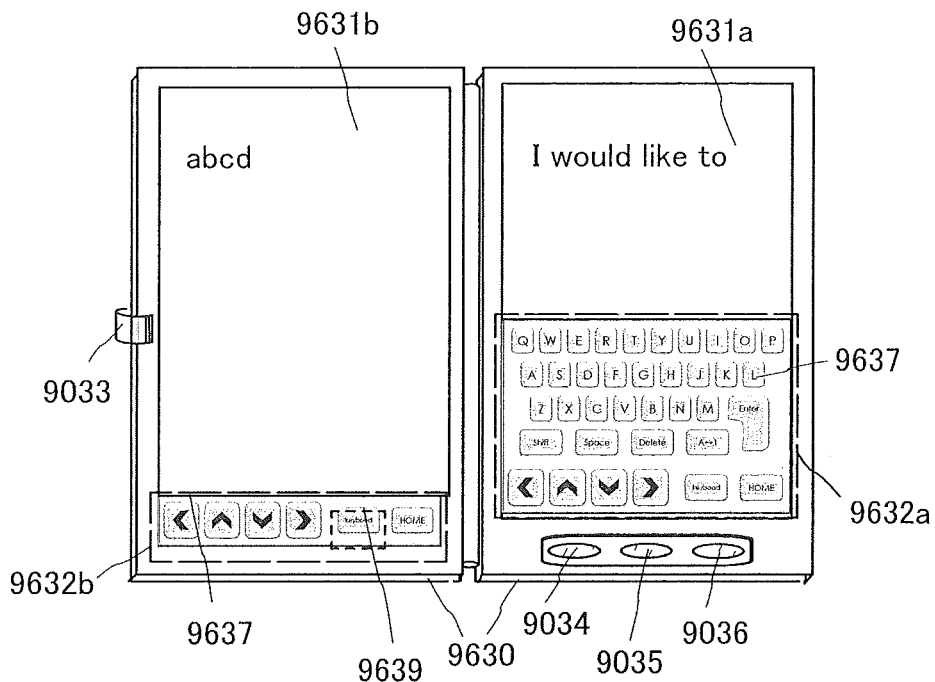
FIGS. 12A to 12C illustrate an electronic device.
Figure 12B:
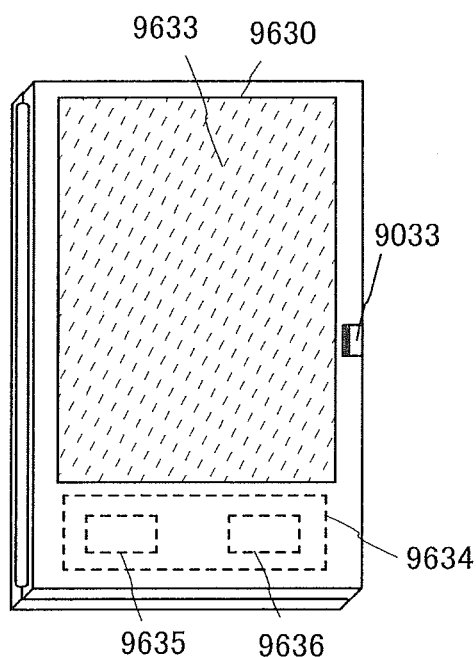

FIGS. 12A and 12B illustrate an example of a foldable tablet terminal. FIG. 12A illustrates the tablet terminal which is unfolded. The tablet terminal includes a housing 9630, a display portion 9631a, a display portion 9631b, a display mode switch 9034, a power switch 9035, a power-saving mode switch 9036, a clasp 9033, and an operation switch. Note that in the tablet terminal, one or both of the display portion 9631a and the display portion 9631b is/are formed using a light-emitting device which includes the light-emitting element described in Embodiment 1.

Part of the display portion 9631a can be a touchscreen region 9632a and data can be input when a displayed operation key 9637 is touched. Although half of the display portion 9631a has only a display function and the other half has a touchscreen function, one embodiment of the present invention is not limited to the structure. The whole display portion 9631a may have a touchscreen function. For example, a keyboard can be displayed on the entire region of the display portion 9631a so that the display portion 9631a is used as a touchscreen, and the display portion 9631b can be used as a display screen.

Like the display portion 9631a, part of the display portion 9631b can be a touchscreen region 9632b. When a switching button 9639 for showing/hiding a keyboard on the touchscreen is touched with a finger, a stylus, or the like, the keyboard can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. The power-saving mode switch 9036 can control display luminance in accordance with the amount of external light in use of the tablet terminal sensed by an optical sensor incorporated in the tablet terminal. Another sensing device including a sensor such as a gyroscope or an acceleration sensor for sensing inclination may be incorporated in the tablet terminal, in addition to the optical sensor.

Although FIG. 12A illustrates an example in which the display portion 9631a and the display portion 9631b have the same display area, one embodiment of the present invention is not limited to the example. The display portion 9631a and the display portion 9631b may have different display areas and different display quality. For example, higher definition images may be displayed on one of the display portions 9631a and 9631b.

FIG. 12B illustrates the tablet terminal which is folded. The tablet terminal in this embodiment includes the housing 9630, a solar cell 9633, a charge and discharge control circuit 9634, a battery 9635, and a DCDC converter 9636. In FIG. 12B, a structure including the battery 9635 and the DCDC converter 9636 is illustrated as an example of the charge and discharge control circuit 9634.

Since the tablet terminal is foldable, the housing 9630 can be closed when the tablet terminal is not in use. As a result, the display portion 9631a and the display portion 9631b can be protected, thereby providing a tablet terminal with high endurance and high reliability for long-term use.

The tablet terminal illustrated in FIGS. 12A and 12B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that a structure in which the solar cell 9633 is provided on one or both surfaces of the housing 9630 is preferable because the battery 9635 can be charged efficiently.

Figure 12C:
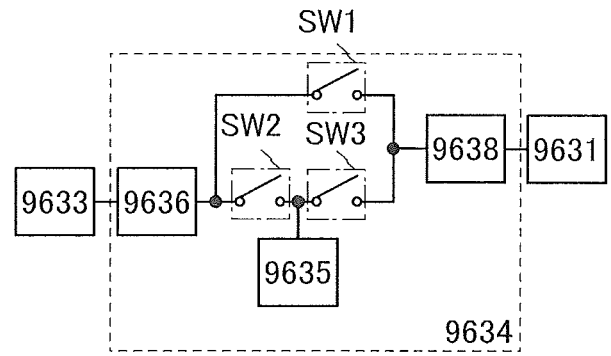

The structure and operation of the charge and discharge control circuit 9634 illustrated in FIG. 12B will be described with reference to a block diagram of FIG. 12C. FIG. 12C illustrates the solar cell 9633, the battery 9635, the DCDC converter 9636, a converter 9638, switches SW1 to SW3, and a display portion 9631. The battery 9635, the DCDC converter 9636, the converter 9638, and the switches SW1 to SW3 correspond to the charge and discharge control circuit 9634 illustrated in FIG. 12B.

First, description is made on an example of the operation in the case where power is generated by the solar cell 9633 with the use of external light. The voltage of the power generated by the solar cell is raised or lowered by the DCDC converter 9636 so as to be voltage for charging the battery 9635. Then, when power from the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module capable of performing charging by transmitting and receiving power wirelessly (without contact), or any of the other charge means used in combination, and the power generation means is not necessarily provided.

One embodiment of the present invention is not limited to the tablet terminal having the shape illustrated in FIGS. 12A to 12C as long as the display portion 9631 is included.

Figure 13A:
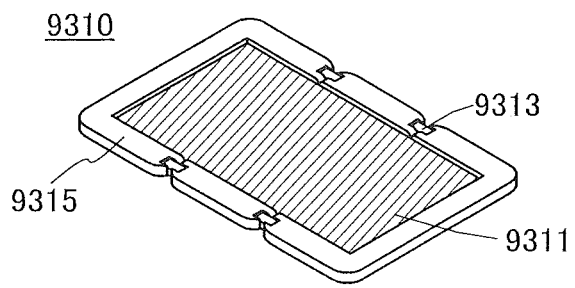
FIGS. 13A to 13C illustrate an electronic device.
Figure 13B:
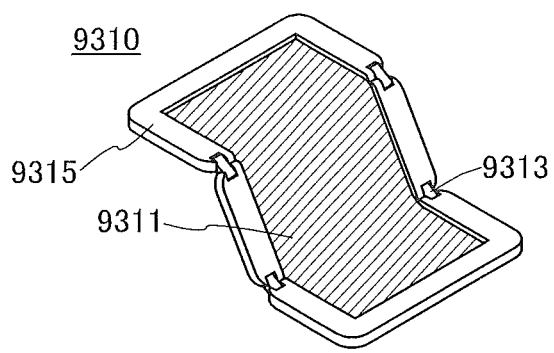
Figure 13C:
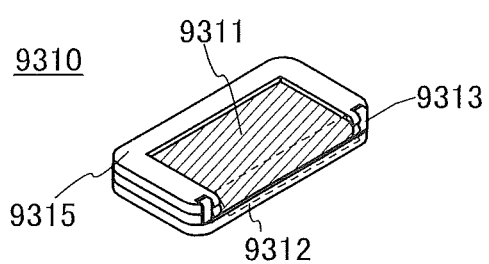

FIGS. 13A to 13C illustrate a foldable portable information terminal 9310. FIG. 13A illustrates the portable information terminal 9310 that is opened. FIG. 13B illustrates the portable information terminal 9310 that is being opened or being folded. FIG. 13C illustrates the portable information terminal 9310 that is folded. The portable information terminal 9310 is highly portable when folded. When the portable information terminal 9310 is opened, a seamless large display region is highly browsable.

A display panel 9311 is supported by three housings 9315 joined together by hinges 9313. The display panel 9311 may be a touch panel (an input/output device) including a touch sensor (an input device). By bending the display panel 9311 at a connection portion between two housings 9315 with the use of the hinges 9313, the portable information terminal 9310 can be reversibly changed in shape from an opened state to a folded state. The light-emitting device of one embodiment of the present invention can be used for the display panel 9311. A display region 9312 in the display panel 9311 includes a display region that is positioned at a side surface of the portable information terminal 9310 that is folded. On the display region 9312, information icons, frequently-used applications, file shortcuts to programs, and the like can be displayed, and confirmation of information and start of application can be smoothly performed.

Example 1

In this example, a light-emitting element 1 of one embodiment of the present invention, which corresponds to the light-emitting element described in Embodiment 1, and a comparative light-emitting element 1 which has a different structure from the light-emitting element of one embodiment of the present invention were compared, and the results are described. A difference between the light-emitting element 1 and the comparative light-emitting element 1 is only a material for the first electron-transport layer. Structural formulae of organic compounds used in the light-emitting element 1 and the comparative light-emitting element 1 are shown below.

[Chemical Formulae 3]

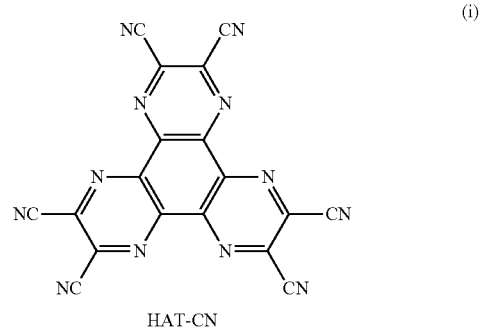

(i)

HAT-CN

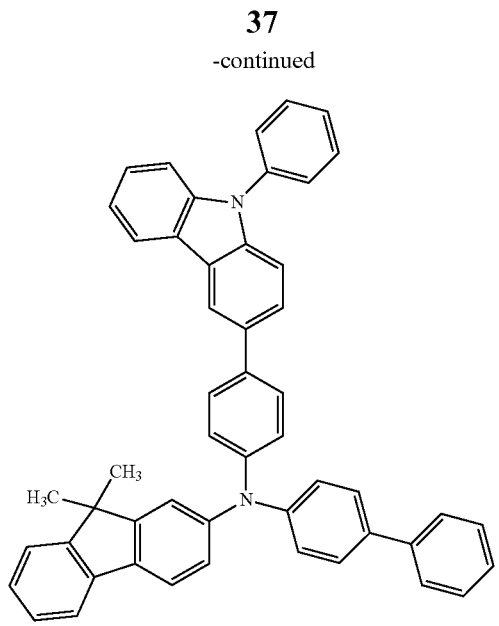

PCBBiF

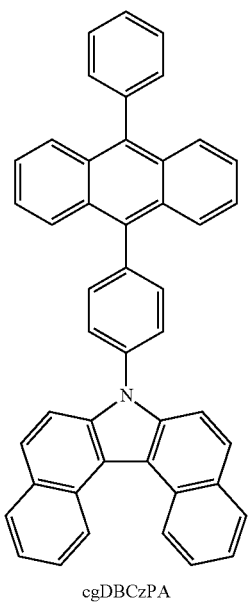

cgDBCzPA

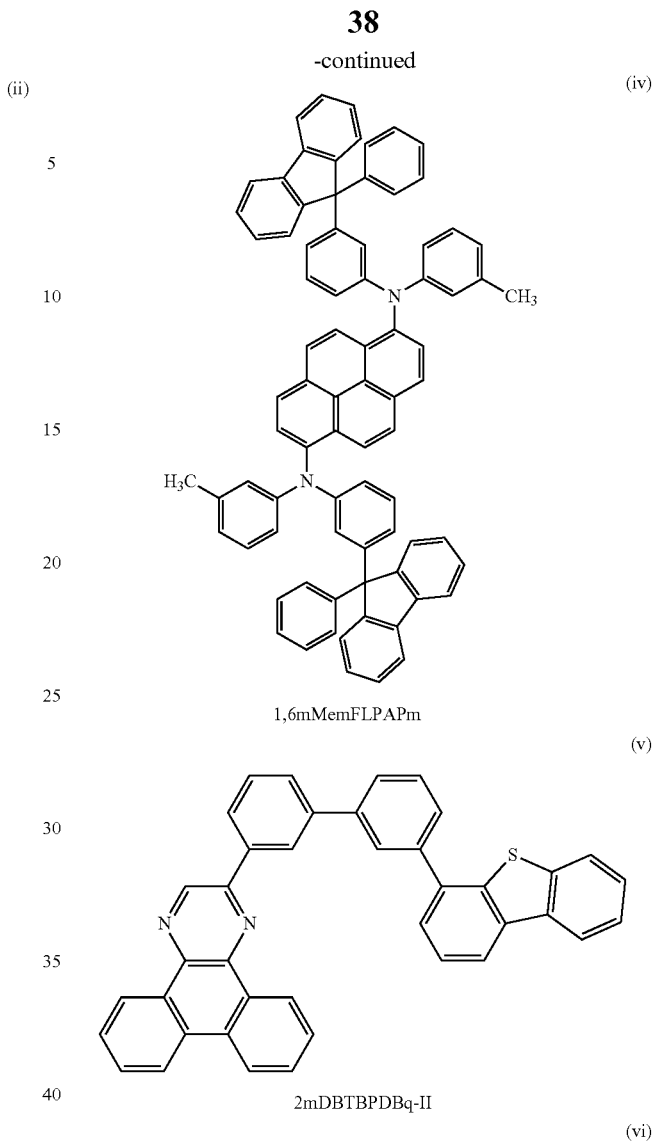

1,6mMemFLPAPm

2mDBTBPDBq-II

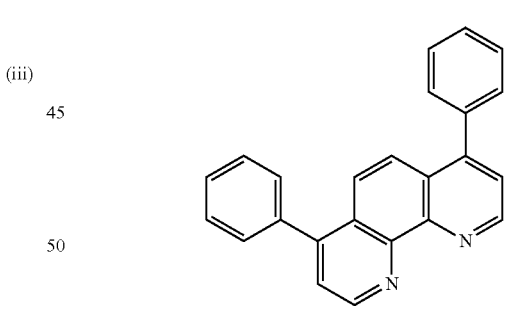

BPhen (Method of Fabricating Light-Emitting Element 1)

First, a film of indium tin oxide containing silicon oxide (ITSO) was formed over a glass substrate by a sputtering method, so that the anode 101 was formed. The thickness thereof was 110 nm and the electrode area was 2 mm×2 mm.

Next, as pretreatment for forming the light-emitting element over the substrate, UV-ozone treatment was performed for 370 seconds after washing of a surface of the substrate with water and baking that was performed at 200° C. for an hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Next, the substrate provided with the anode 101 was fixed to a substrate holder provided in the vacuum evaporation device such that the side on which the anode 101 was formed faced downward. After the pressure was lowered to approximately $10^{-4}$ Pa, 2,3,6,7,10,11-hexacyano-1,4,5,8,9,12-hexaazatriphenylene (abbreviation: HAT-CN) represented by the structural formula (i) was deposited to a thickness of 10 nm over the anode 101 by an evaporation method using resistance heating, whereby the hole-injection layer 111 was formed.

Next, over the hole-injection layer 111, N-(1,1'-biphenyl-4-yl)-9,9-dimethyl-N-[4-(9-phenyl-9H-carbazol-3-yl)phenyl]-9H-fluor en-2-amine (abbreviation: PCBBiF) represented by Structural Formula (ii) was deposited to a thickness of 10 nm to form the hole-transport layer 112.

Furthermore, over the hole-transport layer 112, the light-emitting layer 113 was formed by co-evaporation of 7-[4-(10-phenyl-9-anthryl)phenyl]-7H-dibenzo[c,g]carbazole (abbreviation: cgDBCzPA) represented by the above structural formula (iii) and N,N'-bis (3-methylphenyl)-N,N'-bis [3-(9-phenyl-9H-fluoren-9-yl)phenyl]-pyrene-1,6-diamine (abbreviation: 1,6mMemFLPAPrn) represented by the above structural formula (iv) in a weight ratio of 1:0.05 (=cgDBCzPA: 1,6mMemFLPAPrn) to a thickness of 25 nm.

After that, 2-[3'-(dibenzothiophen-4-yl)biphenyl-3-yl] dibenzo[f,h]quinoxaline (abbreviation: 2mDBTBPDBq-II) represented by the structural formula (v) was deposited to a thickness of 10 nm as the first electron-transport layer 114-1 over the light-emitting layer 113, and then bathophenanthroline (abbreviation: BPhen) represented by the structural formula (vi) was deposited to a thickness of 15 nm as the second electron-transport layer 114-2.

After the formation of the first electron-transport layer 114-1 and the second electron-transport layer 114-2, lithium fluoride (LiF) was deposited by evaporation to a thickness of 1 nm and aluminum was deposited by evaporation to a thickness of 200 nm to form the cathode 102. Thus, the light-emitting element 1 in this example was fabricated.

(Method for Fabricating Comparative Light-Emitting Element 1)

The comparative light-emitting element 1 was fabricated in the same manner as the light-emitting element 1 except for changing 2mDBTBPDBq-II in the first electron-transport layer to cgDBCzPA.

The element structures of the light-emitting element 1 and the comparative light-emitting element 1 are shown in a table below.

TABLE 1

| | Hole-injection layer 10 nm | Hole-transport layer 10 nm | Light-emitting layer 25 nm | First electron-transport layer 10 nm | Second electron-transport layer 15 nm |
|---|---|---|---|---|---|
| Light-emitting element 1 | HAT-CN | PCBBiF | cgDBCzPA: 1,6mMemFLPAPm (1:0.05) | 2mDBTBPDBq-II | BPhen |
| Comparative light-emitting element 1 | | | | cgDBCzPA | |

The light-emitting element 1 and the comparative light-emitting element 1 were each sealed using a glass substrate in a glove box containing a nitrogen atmosphere so as not to be exposed to the air (specifically, a sealing material was applied to surround the elements and UV treatment and heat treatment at 80° C. for an hour were performed at the time of sealing). Then, initial characteristics and reliability of these light-emitting elements were measured. Note that the measurements were carried out at room temperature (in an atmosphere kept at 25° C.).

Figure 14:
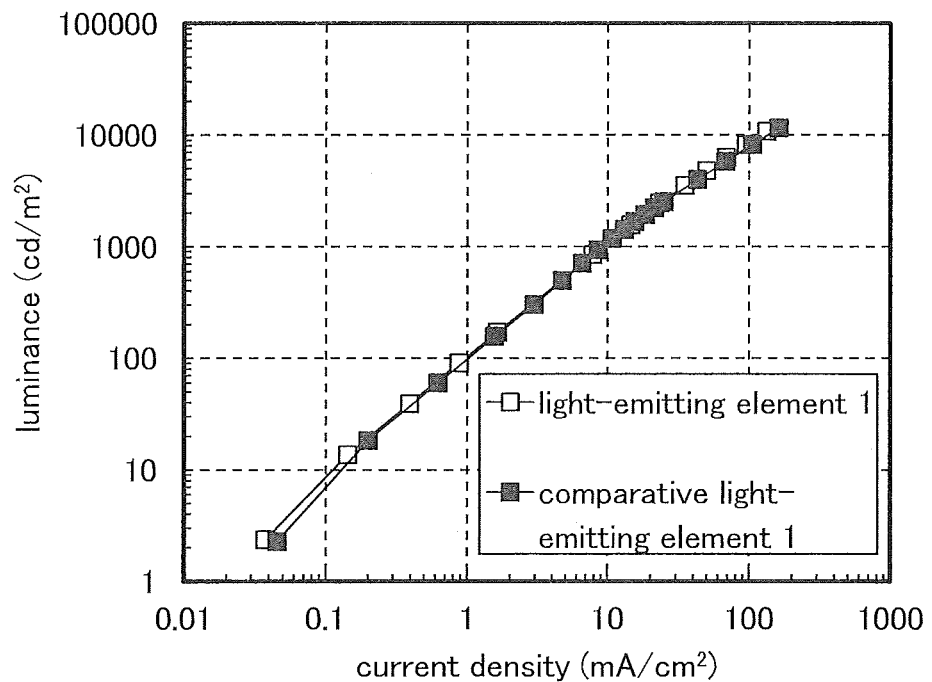
FIG. 14 shows luminance-current density characteristics of a light-emitting element 1 and a comparative light-emitting element 1.
Figure 15:
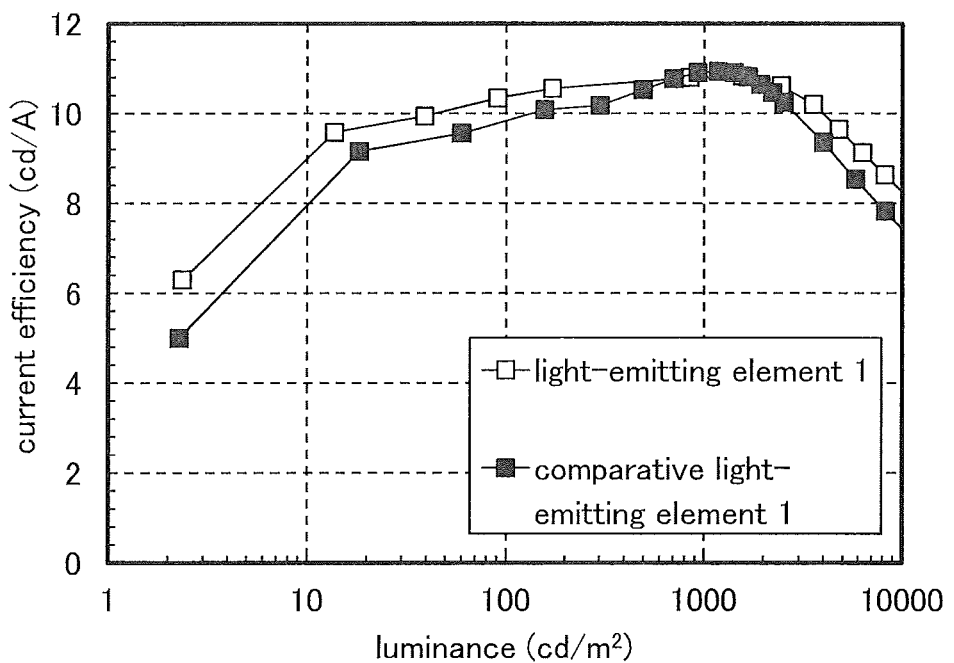
FIG. 15 shows current efficiency-luminance characteristics of the light-emitting element 1 and the comparative light-emitting element 1.
Figure 16:
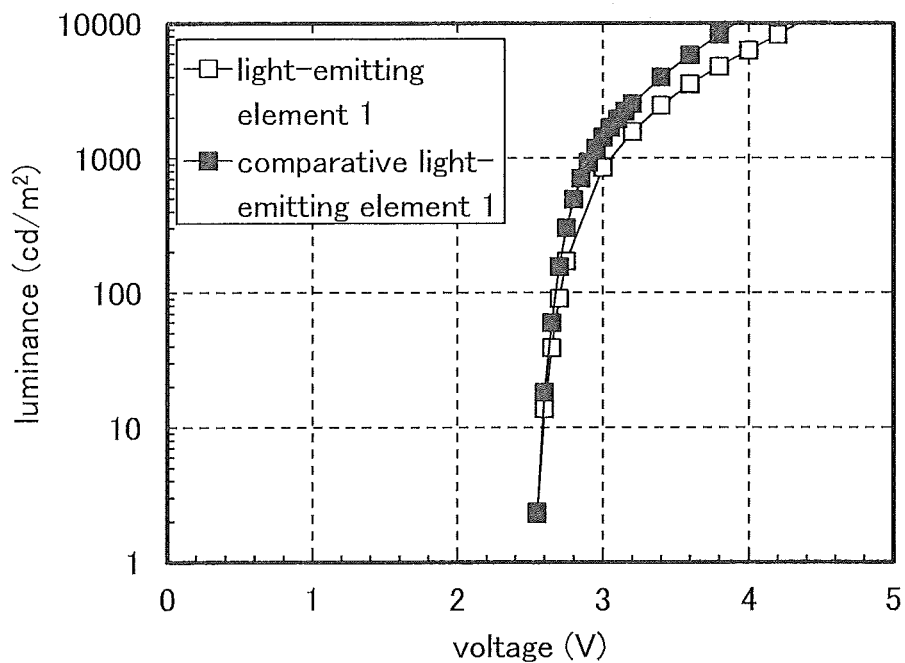
FIG. 16 shows luminance-voltage characteristics of the light-emitting element 1 and the comparative light-emitting element 1.
Figure 17:
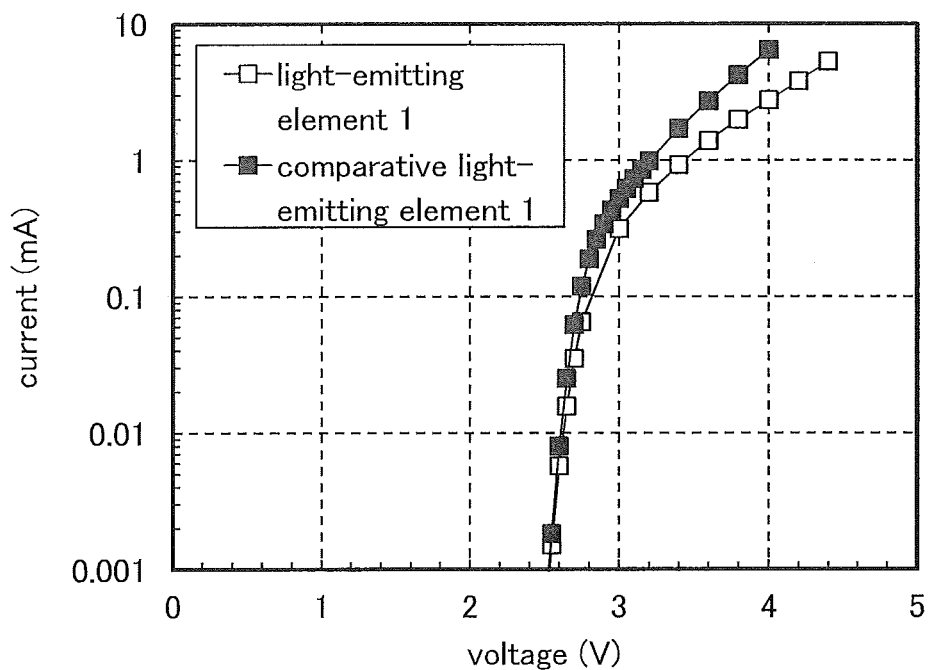
FIG. 17 shows current-voltage characteristics of the light-emitting element 1 and the comparative light-emitting element 1.
Figure 18:
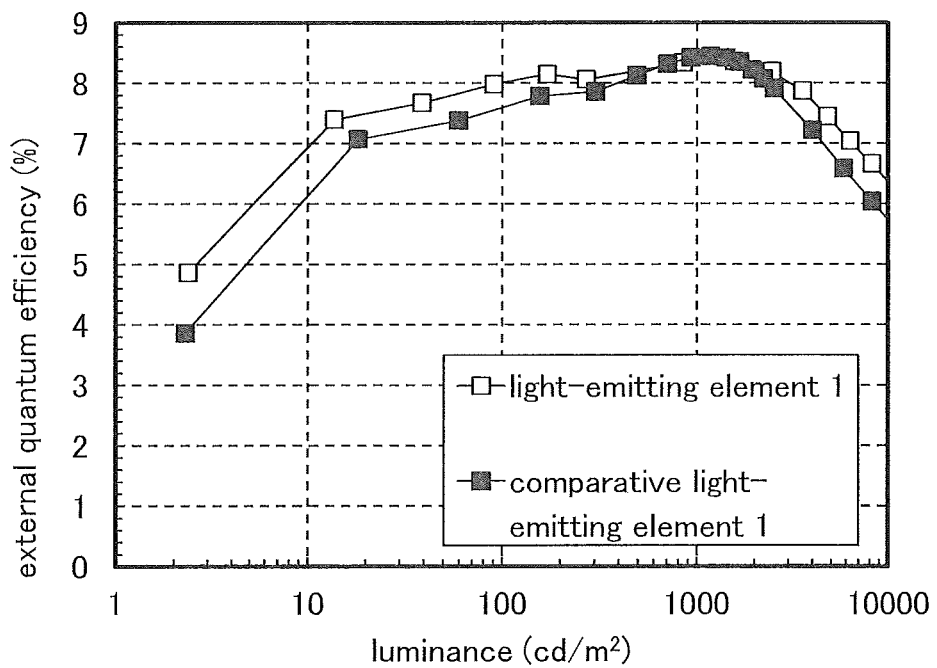
FIG. 18 shows external quantum efficiency-luminance characteristics of the light-emitting element 1 and the comparative light-emitting element 1.
Figure 19:
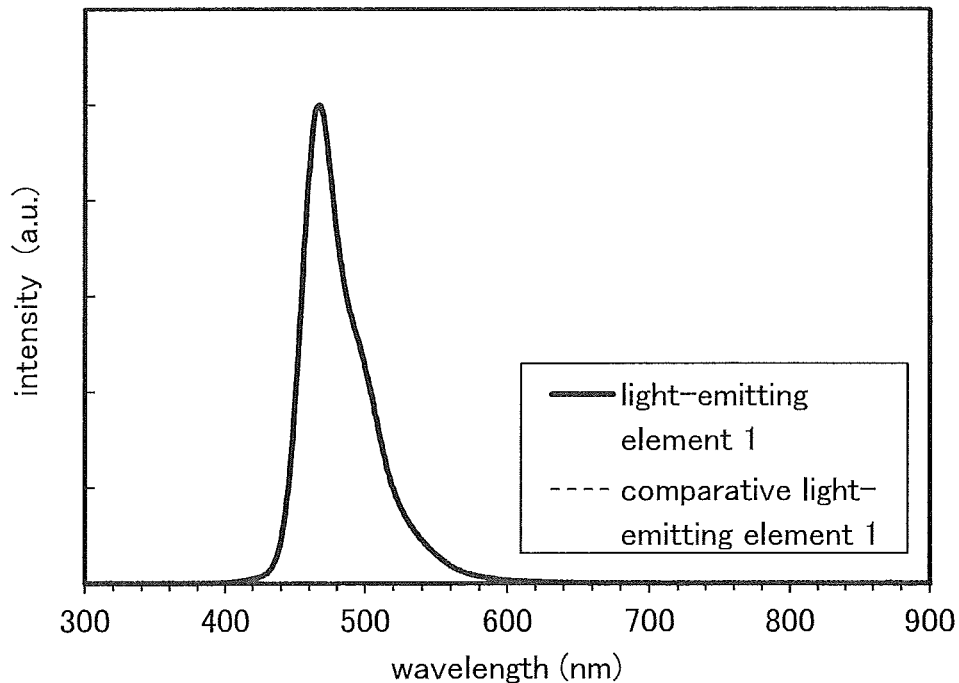
FIG. 19 shows emission spectra of the light-emitting element 1 and the comparative light-emitting element 1.

FIG. 14 shows luminance-current density characteristics of the light-emitting element 1 and the comparative light-emitting element 1. FIG. 15 shows current efficiency-luminance characteristics thereof. FIG. 16 shows luminance-voltage characteristics thereof. FIG. 17 shows current-voltage characteristics thereof. FIG. 18 shows external quantum efficiency-luminance characteristics thereof. FIG. 19 shows emission spectra thereof. Table 2 shows main characteristics of the light-emitting elements at approximately 1000 cd/m$^2$.

TABLE 2

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting element 1 | 3.0 | 0.31 | 8 | 0.14 | 0.18 | 10.8 | 8.3 |
| Comparative light-emitting element 1 | 2.9 | 0.34 | 9 | 0.14 | 0.18 | 10.9 | 8.4 |

It can be found from FIG. 14, FIG. 15, FIG. 16, FIG. 17, FIG. 18, FIG. 19, and Table 2 that each of the light-emitting elements is a blue light-emitting element with favorable characteristics.

Figure 20:
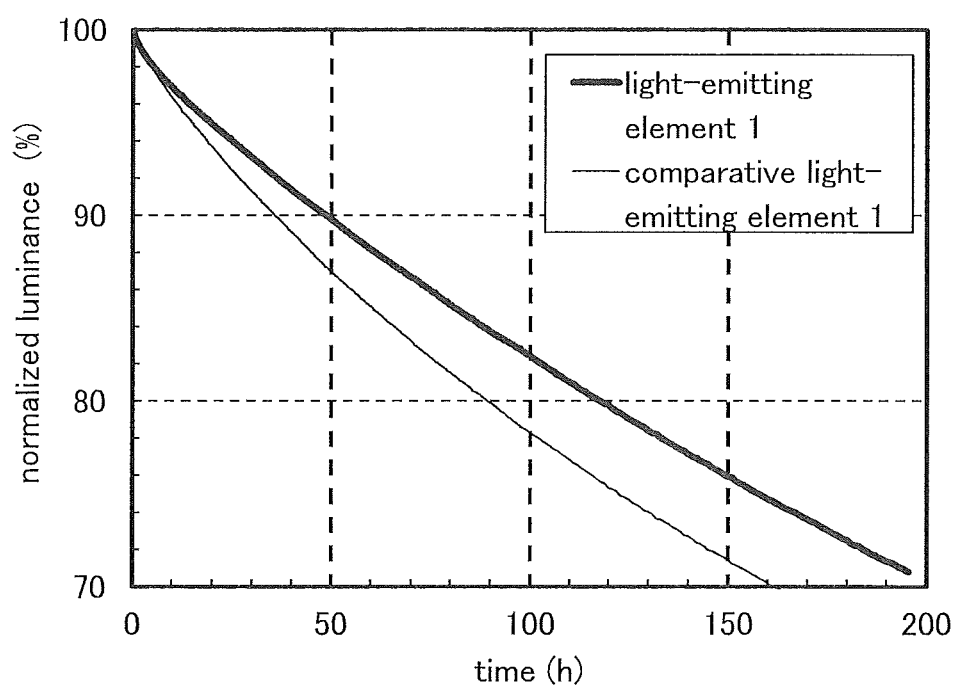
FIG. 20 shows characteristics of normalized luminance change with time of the light-emitting element 1 and the comparative light-emitting element 1.

FIG. 20 shows a change in luminance of the light-emitting element with driving time under the conditions where the initial luminance was 5000 cd/m$^2$ and the current density was constant. As shown in FIG. 20, a decrease in luminance with accumulation of driving time of the light-emitting element 1 of one embodiment of the present invention is smaller than that of the comparative light-emitting element 1; therefore, the light-emitting element 1 has a long lifetime.

Furthermore, a decrease in luminance of the light-emitting element 1 in which HAT-CN, which is an organic acceptor, is used for the hole-injection layer is small in the high luminance region as shown in FIG. 15 and FIG. 18. Therefore, with the structure of the light-emitting element 1 of this example, roll-off on the high luminance side can be suppressed, and the efficiency can be kept high even when the light-emitting element 1 emits light with high luminance.

According to the cyclic voltammetry (CV) measurement results, the LUMO levels of cgDBCzPA, 2mDBTBPDBq-II, and BPhen are estimated to −2.74 eV, −2.94 eV, and −2.63 eV, respectively. Therefore, the light-emitting element 1 is one embodiment of the present invention.

Here, the HOMO level of PCBBiF is estimated to −5.36 eV from the CV measurement result, and this value is relatively high (higher than or equal to −5.4 eV); therefore, electron extraction by HAT-CN is effectively performed. However, since the HOMO level of cgDBCzPA, which is an anthracene derivative, used for the light-emitting layer is estimated to −5.69 eV from the CV measurement result, the injection barrier from the hole-transport layer to the host material in the light-emitting layer is as large as 0.33 eV in each of the light-emitting element 1 and the comparative light-emitting element 1. For this reason, the comparative light-emitting element 1 has excessive electrons, which cause a large roll-off and a decrease in lifetime. In contrast, in the light-emitting element 1, such low hole-injection capability due to the organic acceptor can be compensated by one embodiment of the present invention; thus, small roll-off and a long lifetime are achieved in the light-emitting element 1.

Example 2

In this example, a light-emitting element 2 of one embodiment of the present invention, which corresponds to the light-emitting element described in Embodiment 1, and a comparative light-emitting element 2 which has a different structure from the light-emitting element of one embodiment of the present invention were compared, and the results are described. A difference between the light-emitting element 2 and the comparative light-emitting element 2 is only a material for the first electron-transport layer. Structural formulae of organic compounds used in the light-emitting element 2 and the comparative light-emitting element 2 are shown below.

[Chemical Formulae 4]

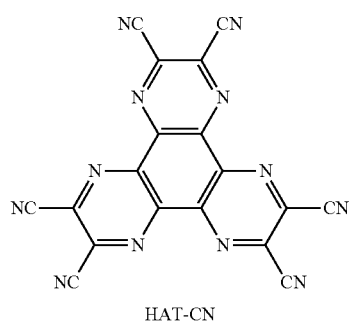

HAT-CN (i)

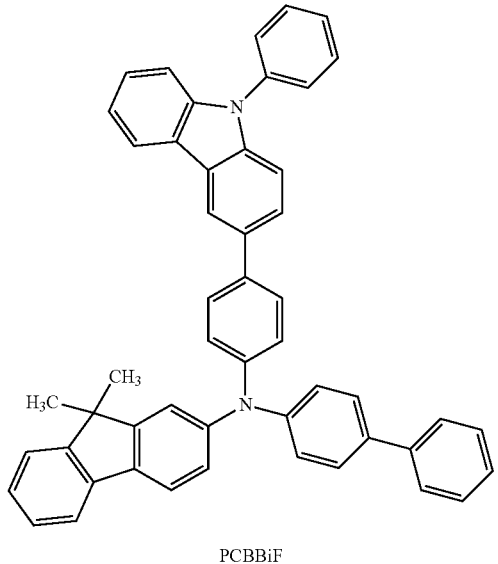

PCBBiF (ii)

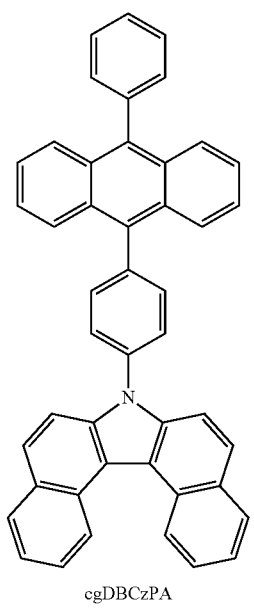

cgDBCzPA (iii)

(iv)

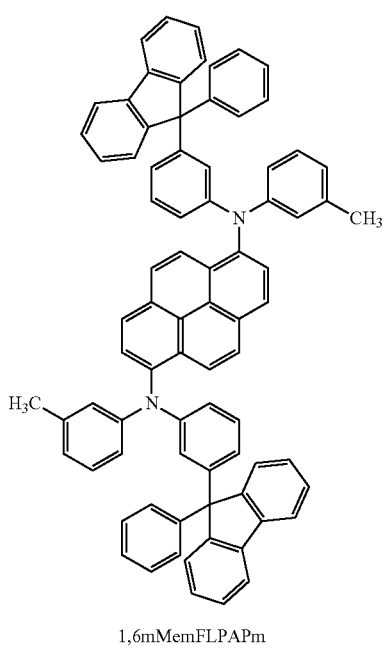

1,6mMemFLPAPrn (v)

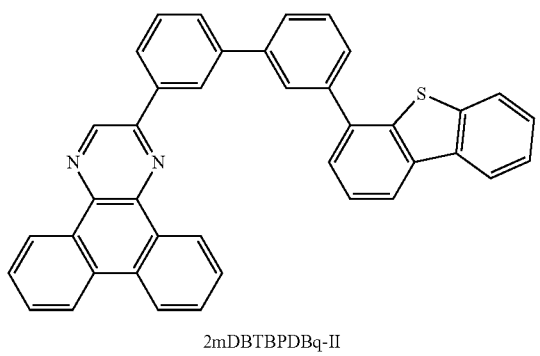

2mDBTBPDBq-II (vii)

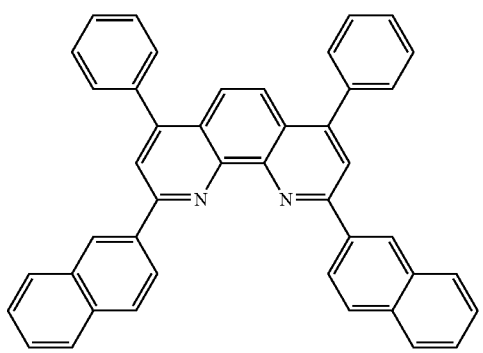

NBPhen (Method of Fabricating Light-Emitting Element 2)

First, a film of indium tin oxide containing silicon oxide (ITSO) was formed over a glass substrate by a sputtering method, so that the anode 101 was formed. The thickness thereof was 110 nm and the electrode area was 2 mm×2 mm.

Next, as pretreatment for forming the light-emitting element over the substrate, UV-ozone treatment was performed for 370 seconds after washing of a surface of the substrate with water and baking that was performed at 200° C. for an hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Next, the substrate provided with the anode 101 was fixed to a substrate holder provided in the vacuum evaporation device such that the side on which the anode 101 was formed faced downward. After the pressure was lowered to approximately $10^{-4}$ Pa, 2,3,6,7,10,11-hexacyano-1,4,5,8,9,12-hexaazatriphenylene (abbreviation: HAT-CN) represented by the structural formula (i) was deposited to a thickness of 10 nm over the anode 101 by an evaporation method using resistance heating, whereby the hole-injection layer 111 was formed.

Next, over the hole-injection layer 111, N-(1,1'-biphenyl-4-yl)-9,9-dimethyl-N-[4-(9-phenyl-9H-carbazol-3-yl)phenyl]-9H-fluor en-2-amine (abbreviation: PCBBiF) represented by Structural Formula (ii) was deposited to a thickness of 10 nm to form the hole-transport layer 112.

Furthermore, over the hole-transport layer 112, the light-emitting layer 113 was formed by co-evaporation of 7-[4-(10-phenyl-9-anthryl)phenyl]-7H-dibenzo[c,g]carbazole (abbreviation: cgDBCzPA) represented by the above structural formula (iii) and N,N'-bis (3-methylphenyl)-N,N'-bis [3-(9-phenyl-9H-fluoren-9-yl)phenyl]-pyrene-1,6-diamine (abbreviation: 1,6mMemFLPAPrn) represented by the above structural formula (iv) in a weight ratio of 1:0.05 (=cgDBCzPA: 1,6mMemFLPAPrn) to a thickness of 25 nm.

After that, 2-[3'-(dibenzothiophen-4-yl)biphenyl-3-yl] dibenzo[f,h]quinoxaline (abbreviation: 2mDBTBPDBq-II) represented by the structural formula (v) was deposited to a thickness of 10 nm as the first electron-transport layer 114-1 over the light-emitting layer 113, and then 2,9-bis(naphthalen-2-yl)-4,7-diphenyl-1,10-phenanthroline (abbreviation: NBPhen) represented by the structural formula (vii) was deposited to a thickness of 15 nm as the second electron-transport layer 114-2.

After the formation of the first electron-transport layer 114-1 and the second electron-transport layer 114-2, lithium fluoride (LiF) was deposited by evaporation to a thickness of 1 nm and aluminum was deposited by evaporation to a thickness of 200 nm to form the cathode 102. Thus, the light-emitting element 2 in this example was fabricated.

(Method for Fabricating Comparative Light-Emitting Element 2)

The comparative light-emitting element 2 was fabricated in the same manner as the light-emitting element 2 except for changing 2mDBTBPDBq-II in the first electron-transport layer to cgDBCzPA.

The element structures of the light-emitting element 2 and the comparative light-emitting element 2 are shown in a table below.

TABLE 3

|  | Hole-injection layer 10 nm | Hole-transport layer 10 nm | Light-emitting layer 25 nm | First electron-transport layer 10 nm | Second electron-transport layer 15 nm |
|---|---|---|---|---|---|
| Light-emitting element 2 Comparative light-emitting element 2 | HAT-CN | PCBBiF | cgDBCzPA: 1,6mMemFLPAPm (1:0.05) | 2mDBTBPDBq-II cgDBCzPA | NBPhen |

The light-emitting element 2 and the comparative light-emitting element 2 were each sealed using a glass substrate in a glove box containing a nitrogen atmosphere so as not to be exposed to the air (specifically, a sealing material was applied to surround the elements and UV treatment and heat treatment at 80° C. for an hour were performed at the time of sealing). Then, initial characteristics and reliability of these light-emitting elements were measured. Note that the measurements were carried out at room temperature (in an atmosphere kept at 25° C.).

Figure 21:
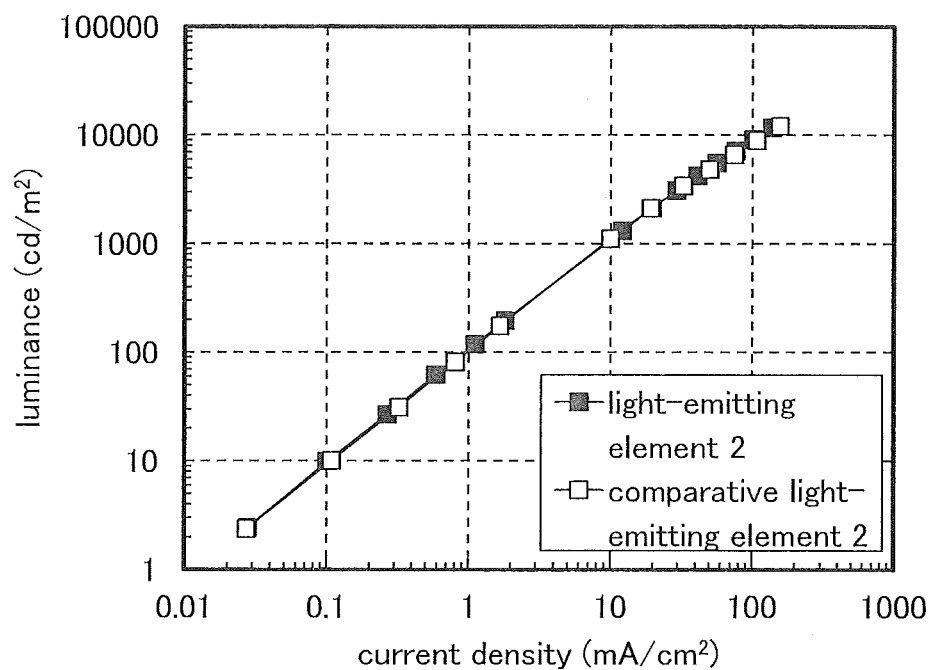
FIG. 21 shows luminance-current density characteristics of a light-emitting element 2 and a comparative light-emitting element 2.
Figure 22:
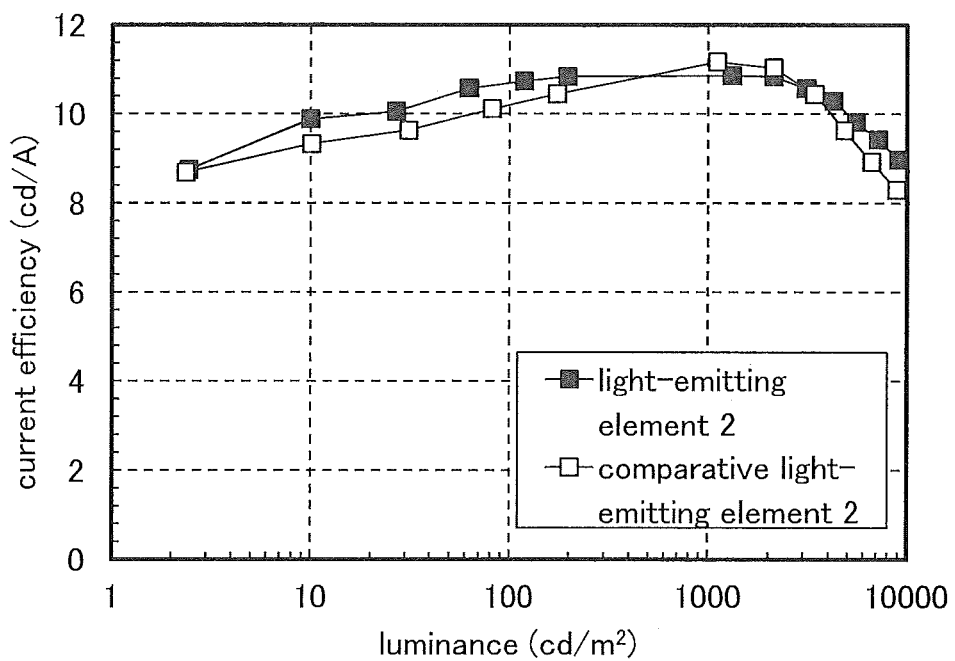
FIG. 22 shows current efficiency-luminance characteristics of the light-emitting element 2 and the comparative light-emitting element 2.
Figure 23:
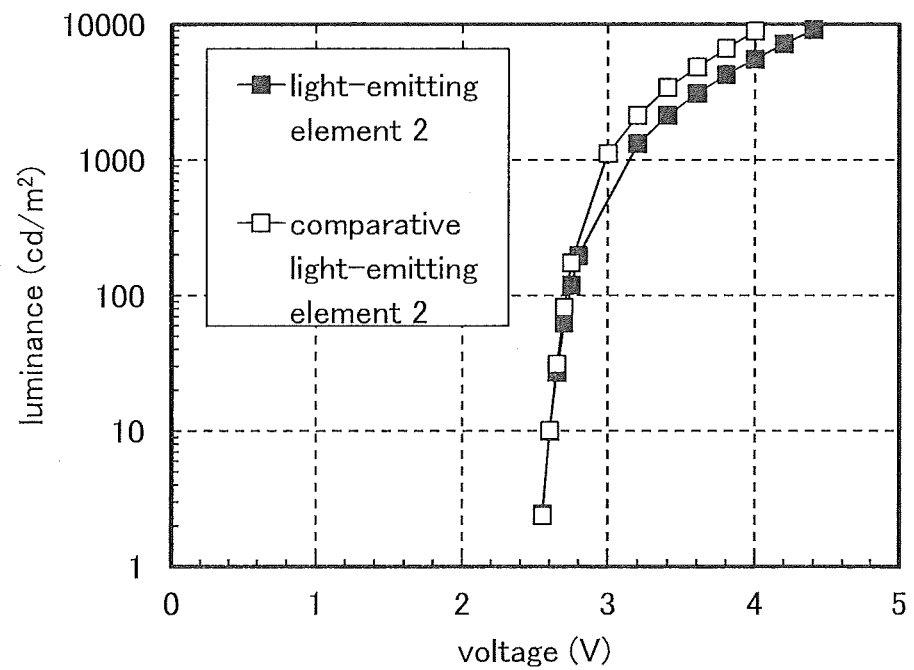
FIG. 23 shows luminance-voltage characteristics of the light-emitting element 2 and the comparative light-emitting element 2.
Figure 24:
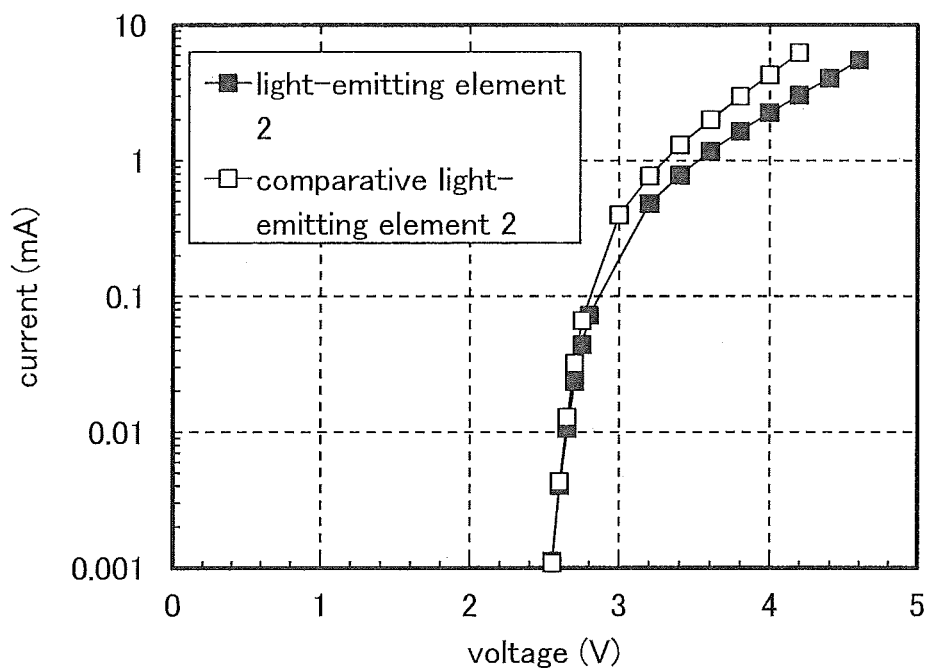
FIG. 24 shows current-voltage characteristics of the light-emitting element 2 and the comparative light-emitting element 2.
Figure 25:
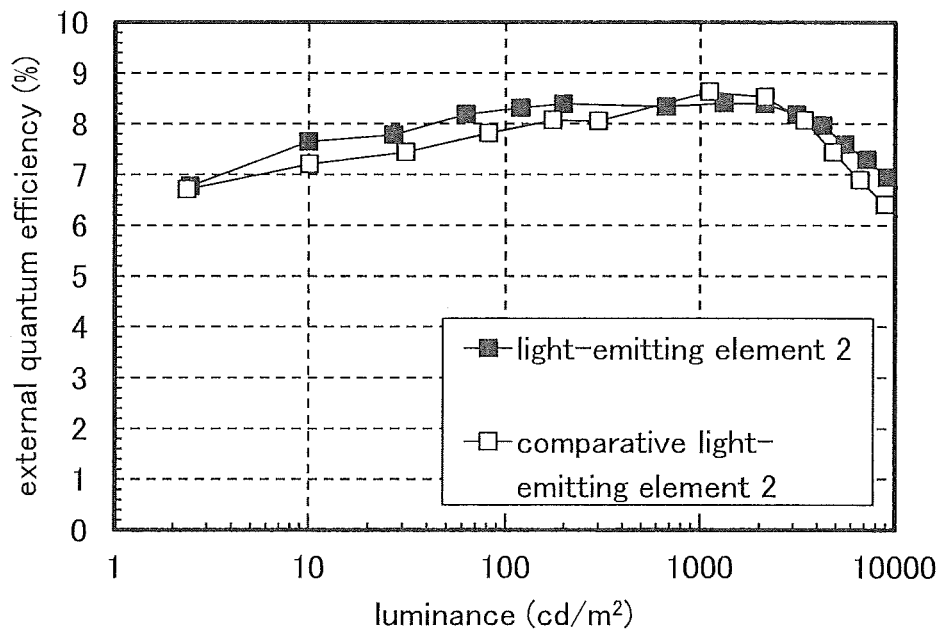
FIG. 25 shows external quantum efficiency-luminance characteristics of the light-emitting element 2 and the comparative light-emitting element 2.
Figure 26:
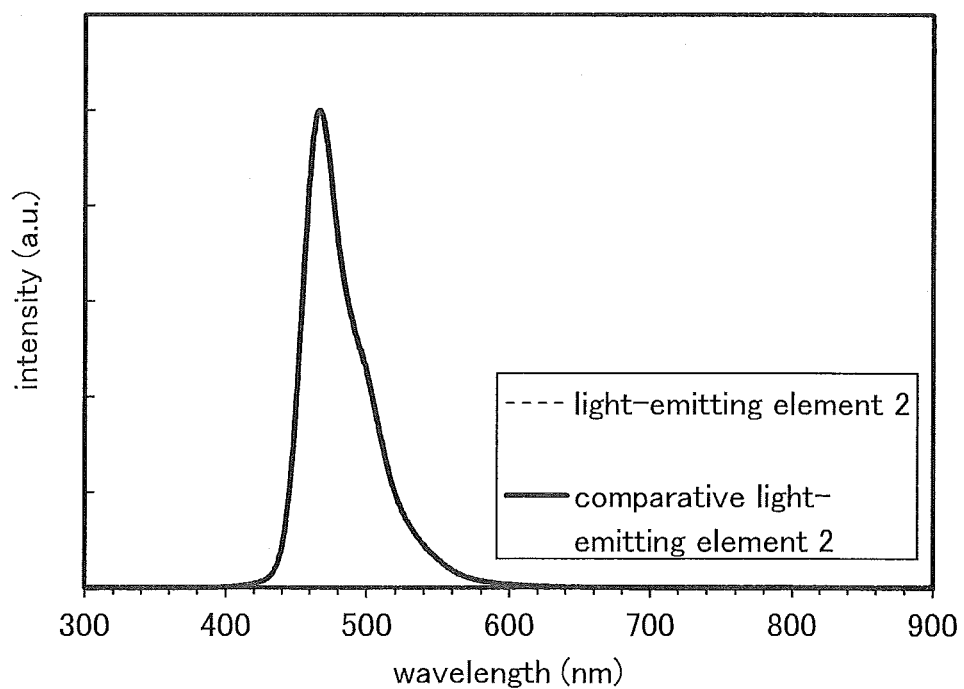
FIG. 26 shows emission spectra of the light-emitting element 2 and the comparative light-emitting element 2.

FIG. 21 shows luminance-current density characteristics of the light-emitting element 2 and the comparative light-emitting element 2. FIG. 22 shows current efficiency-luminance characteristics thereof. FIG. 23 shows luminance-voltage characteristics thereof. FIG. 24 shows current-voltage characteristics thereof. FIG. 25 shows external quantum efficiency-luminance characteristics thereof. FIG. 26 shows emission spectra thereof. Table 4 shows main characteristics of the light-emitting elements at approximately 1000 cd/m².

TABLE 4

|  | Voltage (V) | Current (mA) | Current density (mA/cm²) | Chromaticity x | Chromaticity y | Current efficiency (cd/A) | External quantum efficiency (%) |
|---|---|---|---|---|---|---|---|
| Light-emitting element 2 | 3.2 | 0.48 | 12 | 0.14 | 0.18 | 10.9 | 8.4 |
| Comparative light-emitting element 2 | 3.0 | 0.40 | 10 | 0.14 | 0.18 | 11.2 | 8.6 |

It can be found from FIG. 21, FIG. 22, FIG. 23, FIG. 24, FIG. 25, FIG. 26, and Table 4 that each of the light-emitting elements is a blue light-emitting element with favorable characteristics.

Figure 27:
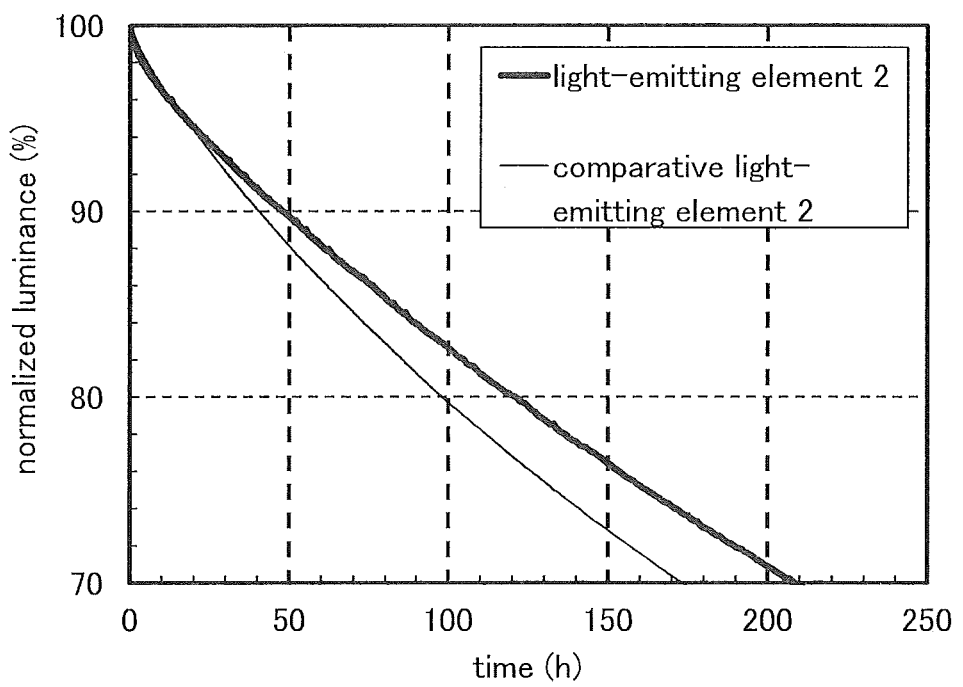
FIG. 27 shows characteristics of normalized luminance change with time of the light-emitting element 2 and the comparative light-emitting element 2.

FIG. 27 shows a change in luminance of the light-emitting element with driving time under the conditions where the initial luminance was 5000 cd/m² and the current density was constant. As shown in FIG. 27, a decrease in luminance with accumulation of driving time of the light-emitting element 2 of one embodiment of the present invention is smaller than that of the comparative light-emitting element 2; therefore, the light-emitting element 2 has a long lifetime.

Furthermore, a decrease in luminance of the light-emitting element 2 in which HAT-CN, which is an organic acceptor, is used for the hole-injection layer is small in the high luminance region as shown in FIG. 22 and FIG. 25. Therefore, with the structure of the light-emitting element 2 of this example, roll-off on the high luminance side can be suppressed, and the efficiency can be kept high even when the light-emitting element 2 emits light with high luminance.

According to the cyclic voltammetry (CV) measurement results, the LUMO levels of cgDBCzPA, 2mDBTBPDBq-II, and NBPhen are estimated to −2.74 eV, −2.94 eV, and −2.83 eV, respectively. Therefore, the light-emitting element 2 is one embodiment of the present invention.

Here, the HOMO level of PCBBiF is estimated to −5.36 eV from the CV measurement result, and this value is relatively high (higher than or equal to −5.4 eV); therefore, electron extraction by HAT-CN is effectively performed. However, since the HOMO level of cgDBCzPA, which is an anthracene derivative, used for the light-emitting layer is estimated to −5.69 eV from the CV measurement result, the injection barrier from the hole-transport layer to the host material in the light-emitting layer is as large as 0.33 eV in each of the light-emitting element 2 and the comparative light-emitting element 2. For this reason, the comparative light-emitting element 2 has excessive electrons, which cause a large roll-off and a decrease in lifetime. In contrast, in the light-emitting element 2, such low hole-injection capability due to the organic acceptor can be compensated by one embodiment of the present invention; thus, small roll-off and a long lifetime are achieved in the light-emitting element 2.

Example 3

In this example, a light-emitting element 3 of one embodiment of the present invention, which corresponds to the light-emitting element described in Embodiment 1, and a comparative light-emitting element 3 which has a different structure from the light-emitting element of one embodiment of the present invention were compared, and the results are described. A difference between the light-emitting element 3 and the comparative light-emitting element 3 is only a material for the first electron-transport layer. Structural formulae of organic compounds used in the light-emitting element 3 and the comparative light-emitting element 3 are shown below.

[Chemical Formulae 5]

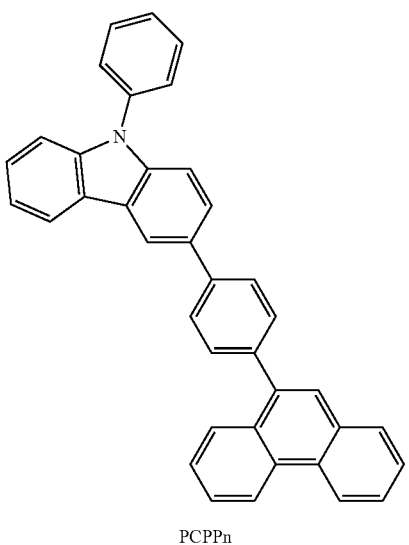

PCPPn

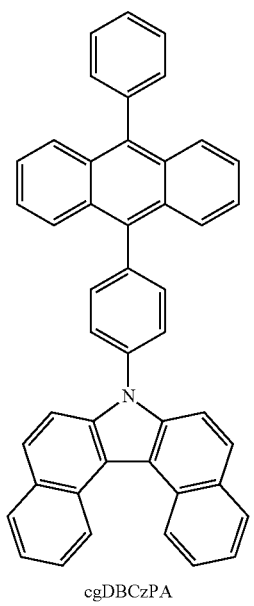

cgDBCzPA

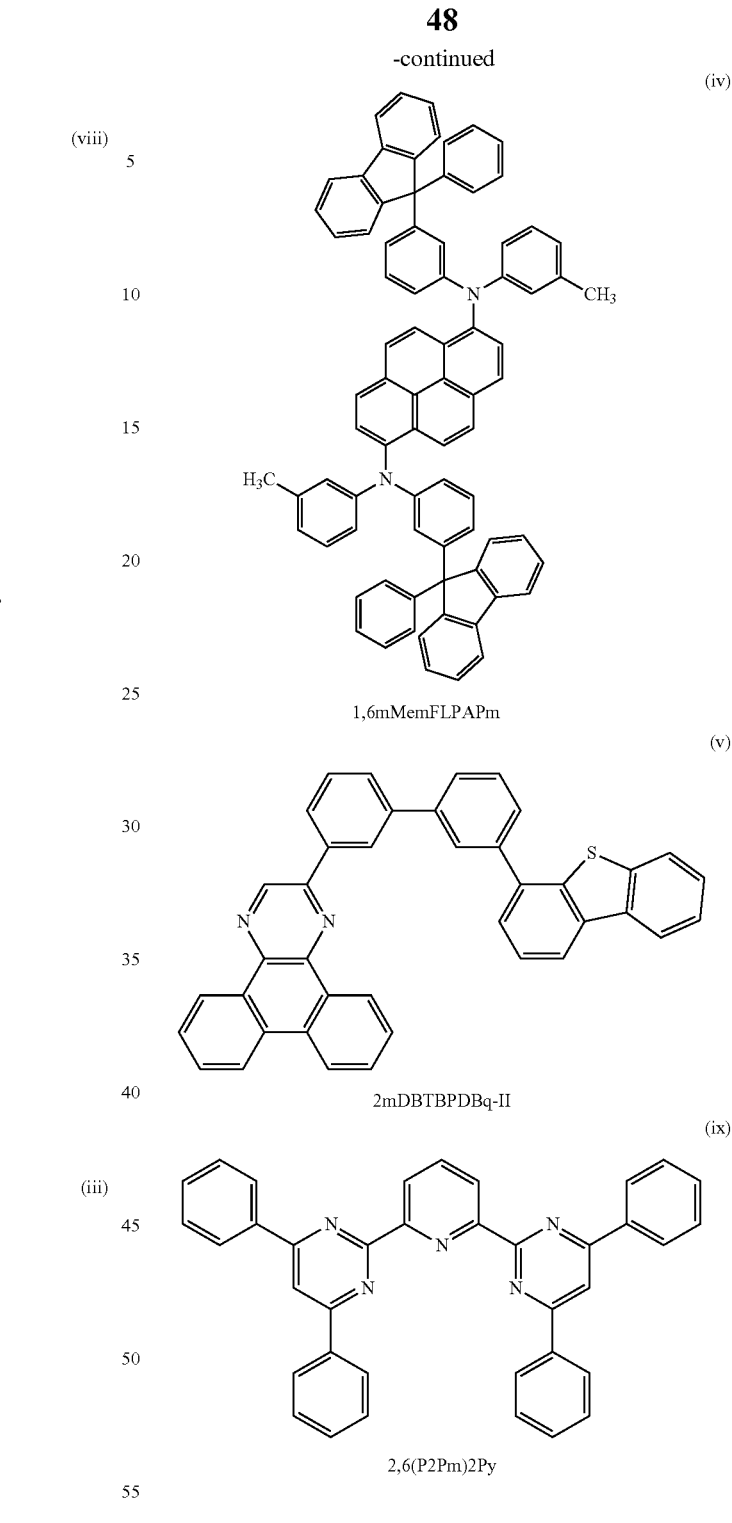

1,6mMemFLPAPm

2mDBTBPDBq-II 2,6(P2Pm)2Py (Method of Fabricating Light-Emitting Element 3)

First, a film of indium tin oxide containing silicon oxide (ITSO) was formed over a glass substrate by a sputtering method, so that the anode 101 was formed. The thickness thereof was 110 nm and the electrode area was 2 mm×2 mm.

Next, as pretreatment for forming the light-emitting element over the substrate, UV-ozone treatment was performed for 370 seconds after washing of a surface of the substrate with water and baking that was performed at 200° C. for an hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Next, the substrate provided with the anode 101 was fixed to a substrate holder provided in the vacuum evaporation device such that the side on which the anode 101 was formed faced downward. After the pressure was lowered to approximately $10^{-4}$ Pa, 3-[4-(9-phenanthryl)-phenyl]-9-phenyl-9H-carbazole (abbreviation: PCPPn) represented by the structural formula (viii) and molybdenum(VI) oxide were co-deposited over the anode 101 by an evaporation method using resistance heating, whereby the hole-injection layer 111 was formed. The thickness of the hole-injection layer 111 was 10 nm. The weight ratio of PCPPn to molybdenum oxide was adjusted to be 4:2 (=PCPPn: molybdenum oxide).

Next, PCPPn was deposited to a thickness of 20 nm over the hole-injection layer 111 to form the hole-transport layer 112.

Furthermore, over the hole-transport layer 112, the light-emitting layer 113 was formed by co-evaporation of 7-[4-(10-phenyl-9-anthryl)phenyl]-7H-dibenzo[c,g]carbazole (abbreviation: cgDBCzPA) represented by the above structural formula (iii) and N,N'-bis (3-methylphenyl)-N,N'-bis [3-(9-phenyl-9H-fluoren-9-yl)phenyl]-pyrene-1,6-diamine (abbreviation: 1,6mMemFLPAPm) represented by the above structural formula (iv) in a weight ratio of 1:0.03 (=cgDB-CzPA: 1,6mMemFLPAPm) to a thickness of 25 nm.

After that, 2-[3'-(dibenzothiophen-4-yl)biphenyl-3-yl] dibenzo[f,h]quinoxaline (abbreviation: 2mDBTBPDBq-II) represented by the structural formula (v) was deposited to a thickness of 10 nm as the first electron-transport layer 114-1 over the light-emitting layer 113, and then 2,2'-(pyridine-2, 6-diyl)bis(4,6-diphenylpyrimidine) (abbreviation: 2,6 (P2Pm)2Py) represented by the structural formula (ix) was deposited to a thickness of 15 nm as the second electron-transport layer 114-2.

After the formation of the first electron-transport layer 114-1 and the second electron-transport layer 114-2, lithium fluoride (LiF) was deposited by evaporation to a thickness of 1 nm and aluminum was deposited by evaporation to a thickness of 200 nm to form the cathode 102. Thus, the light-emitting element 3 in this example was fabricated.

(Method for Fabricating Comparative Light-Emitting Element 3)

The comparative light-emitting element 3 was fabricated in the same manner as the light-emitting element 3 except for changing 2mDBTBPDBq-II in the first electron-transport layer to cgDBCzPA.

The element structures of the light-emitting element 3 and the comparative light-emitting element 3 are shown in a table below.

TABLE 5

|  | Hole-injection layer 10 nm | Hole-transport layer 20 nm | Light-emitting layer 25 nm | First electron-transport layer 10 nm | Second electron-transport layer 15 nm |
|---|---|---|---|---|---|
| Light-emitting element 3 | PCPPn:MoOx (4:2) | PCPPn | cgDBCzPA: 1,6mMemFLPAPm (1:0.03) | 2mDBTBPDBq-II | 2,6(P2Pm)2Py |
| Comparative light-emitting element 3 |  |  |  | cgDBCzPA |  |

The light-emitting element 3 and the comparative light-emitting element 3 were each sealed using a glass substrate in a glove box containing a nitrogen atmosphere so as not to be exposed to the air (specifically, a sealing material was applied to surround the elements and UV treatment and heat treatment at 80° C. for an hour were performed at the time of sealing). Then, initial characteristics and reliability of these light-emitting elements were measured. Note that the measurements were carried out at room temperature (in an atmosphere kept at 25° C.).

Figure 28:
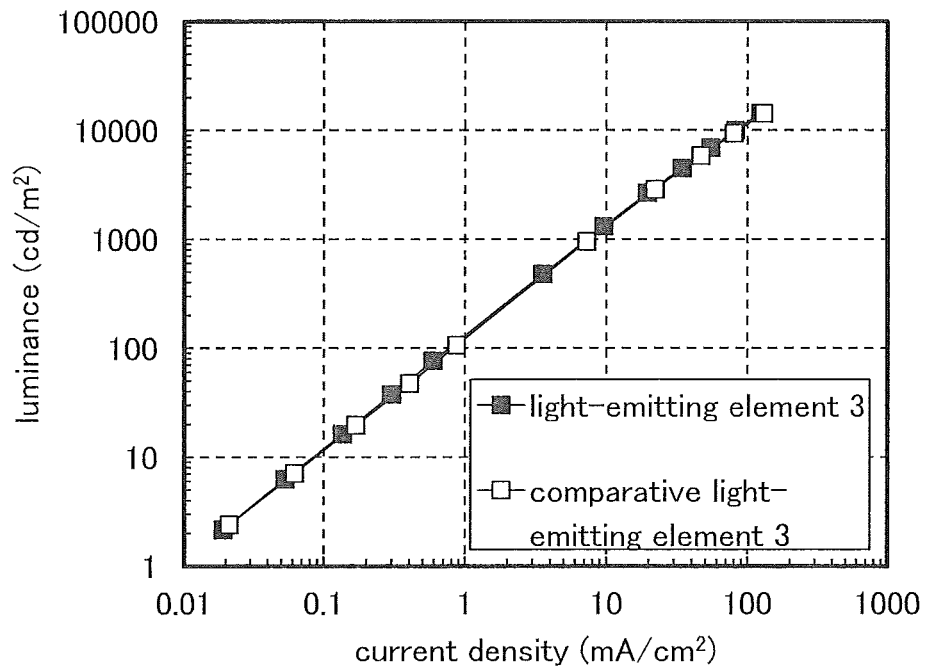
FIG. 28 shows luminance-current density characteristics of a light-emitting element 3 and a comparative light-emitting element 3.
Figure 29:
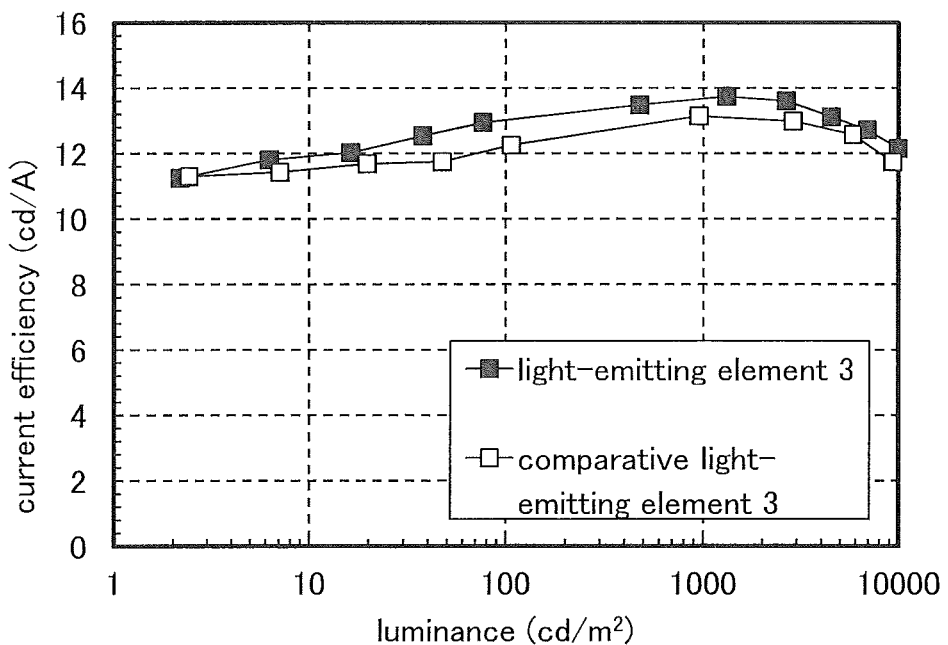
FIG. 29 shows current efficiency-luminance characteristics of the light-emitting element 3 and the comparative light-emitting element 3.
Figure 30:
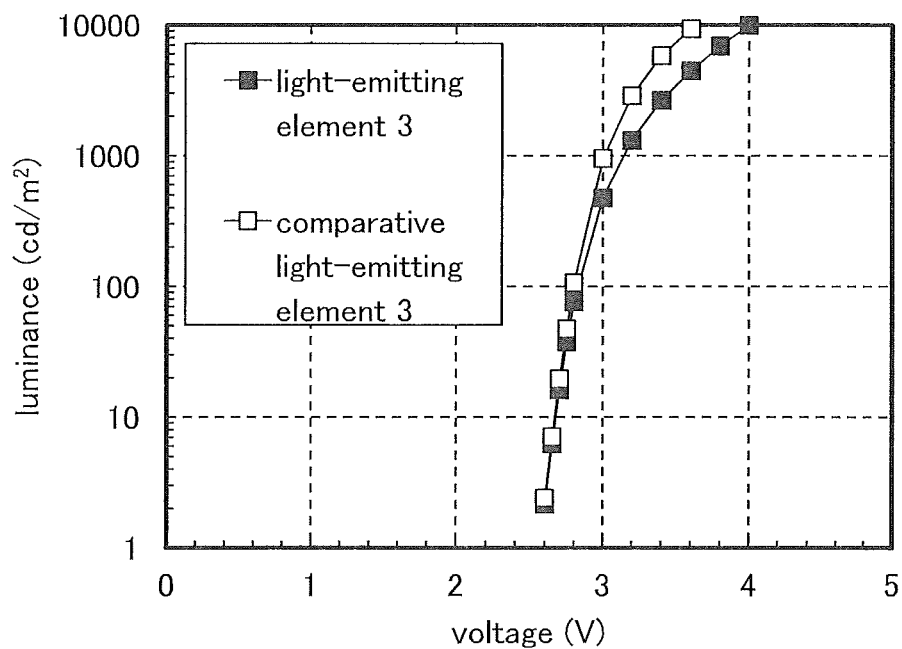
FIG. 30 shows luminance-voltage characteristics of the light-emitting element 3 and the comparative light-emitting element 3.
Figure 31:
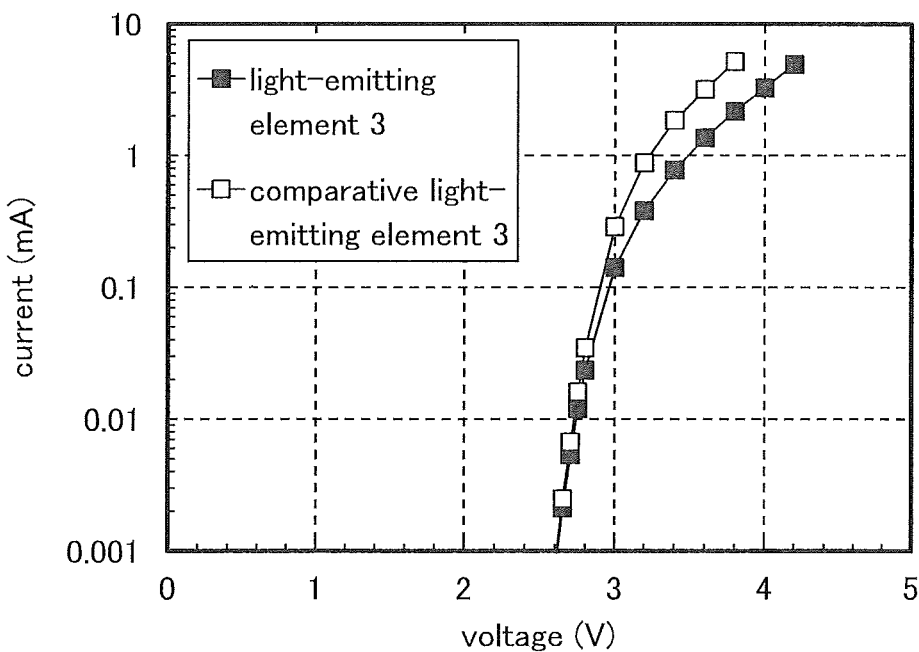
FIG. 31 shows current-voltage characteristics of the light-emitting element 3 and the comparative light-emitting element 3.
Figure 32:
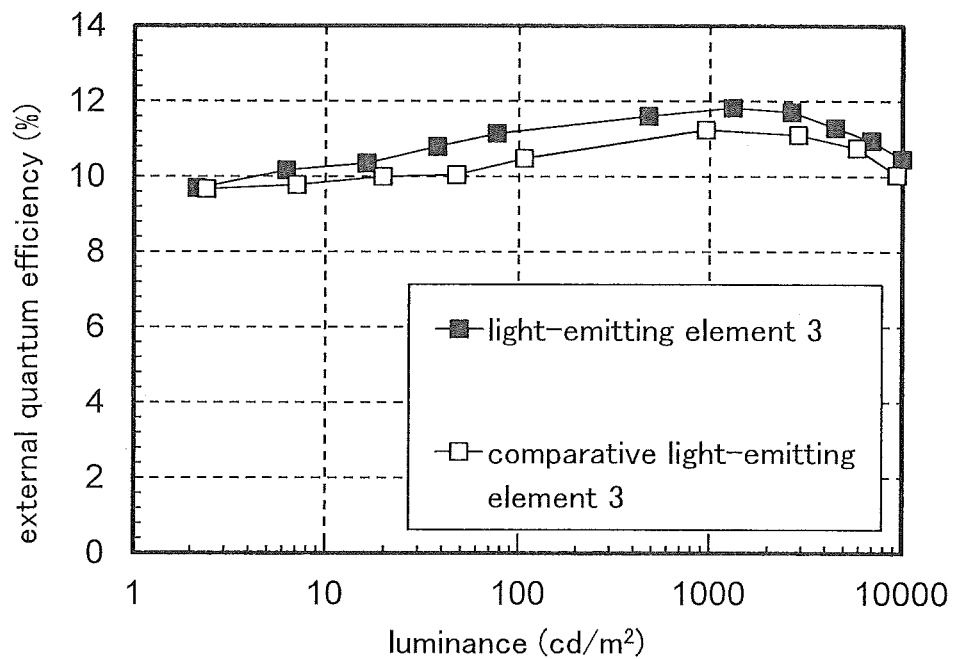
FIG. 32 shows external quantum efficiency-luminance characteristics of the light-emitting element 3 and the comparative light-emitting element 3.
Figure 33:
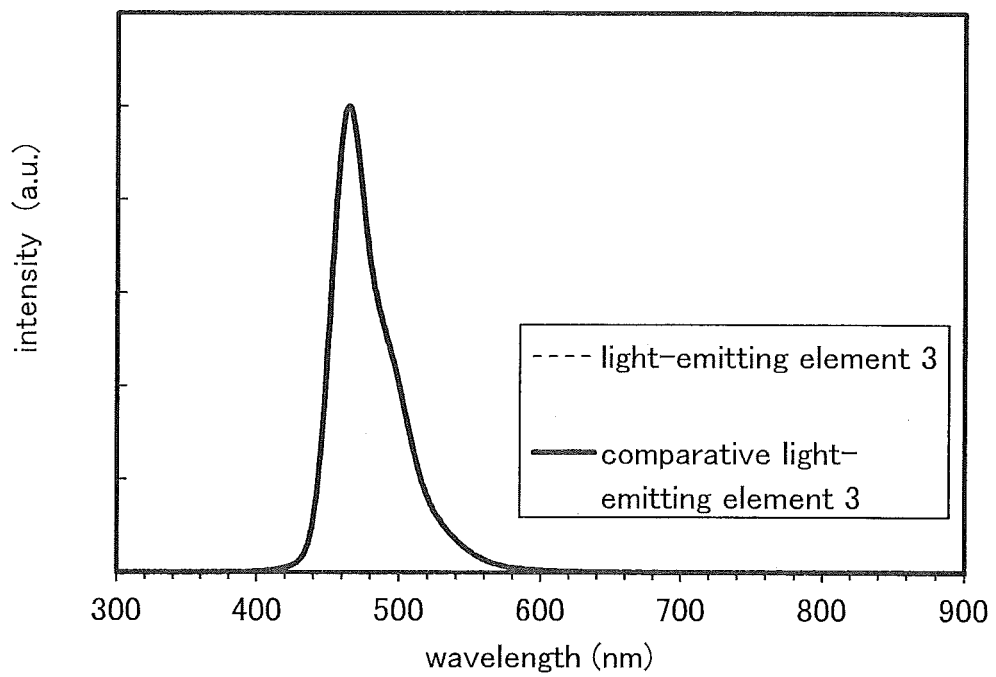
FIG. 33 shows emission spectra of the light-emitting element 3 and the comparative light-emitting element 3.

FIG. 28 shows luminance-current density characteristics of the light-emitting element 3 and the comparative light-emitting element 3. FIG. 29 shows current efficiency-luminance characteristics thereof. FIG. 30 shows luminance-voltage characteristics thereof. FIG. 31 shows current-voltage characteristics thereof. FIG. 32 shows external quantum efficiency-luminance characteristics thereof. FIG. 33 shows emission spectra thereof. Table 6 shows main characteristics of the light-emitting elements at approximately 1000 cd/m$^2$.

TABLE 6

|  | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting element 3 | 3.2 | 0.38 | 10 | 0.14 | 0.15 | 13.7 | 11.8 |
| Comparative light-emitting element 3 | 3.0 | 0.29 | 7 | 0.14 | 0.15 | 13.1 | 11.2 |

It can be found from FIG. 28, FIG. 29, FIG. 30, FIG. 31, FIG. 32, FIG. 33, and Table 6 that each of the light-emitting elements is a blue light-emitting element with favorable characteristics, and particularly, the light-emitting element 3 shows an extremely high external quantum efficiency exceeding 12% (under assumption of Lambertian distribution).

Figure 34:
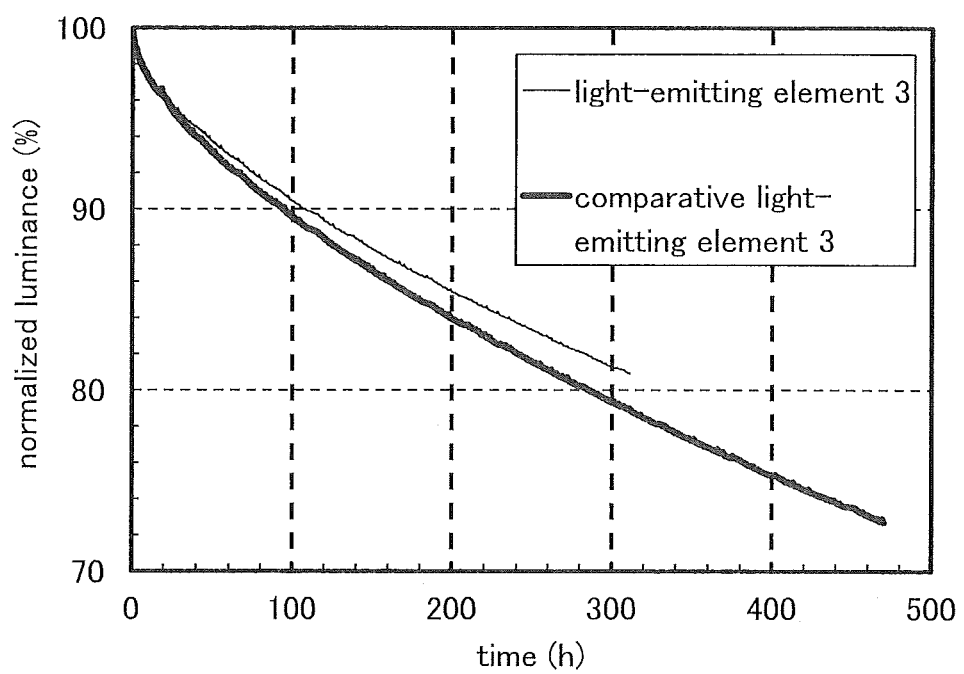
FIG. 34 shows characteristics of normalized luminance change with time of the light-emitting element 3 and the comparative light-emitting element 3.

FIG. 34 shows a change in luminance of the light-emitting element with driving time under the conditions where the initial luminance was 5000 cd/m² and the current density was constant. As shown in FIG. 34, a decrease in luminance with accumulation of driving time of the light-emitting element 3 of one embodiment of the present invention is smaller than that of the comparative light-emitting element 3; therefore, the light-emitting element 1 has a long lifetime.

According to the cyclic voltammetry (CV) measurement results, the LUMO levels of cgDBCzPA, 2mDBTBPDBq-II, and 2,6(P2Pm)2Py are estimated to −2.74 eV, −2.94 eV, and −2.78 eV, respectively. Therefore, the light-emitting element 3 is one embodiment of the present invention.

In the light-emitting element 3, a composite material of a hole-transport material and an acceptor material is used for the hole-injection layer. The hole-transport material used for the hole-injection layer is PCPPn, which is also used for the hole-transport layer, and the HOMO level of PCPPn is as deep as −5.80 eV by the CV measurement. Accordingly, PCPPn has a favorable hole-injection property with respect to cgDBCzPA (HOMO level: −5.69 eV) which is the host material in the light-emitting layer, but in general, hole injection from the anode is difficult. However, since a transition metal oxide is used as the acceptor material in the light-emitting element 3, the acceptor material shows an acceptor property with respect to a hole-transport material having a HOMO level lower (deeper) than −5.4 eV (the acceptor material can extract an electron by at least application of an electric field). Consequently, hole injection and hole transport from the anode to the hole-injection layer, the hole-transport layer, and the light-emitting layer are smoothly performed. By the combination of this hole-injection layer and one embodiment of the present invention, the light-emitting element 3 achieves not only low-voltage driving but also an unexpectedly high external quantum efficiency and a long lifetime, which are major characteristics.

Example 4

In this example, a light-emitting element 4 of one embodiment of the present invention, which corresponds to the light-emitting element described in Embodiment 1, and a comparative light-emitting element 4 which has a different structure from the light-emitting element of one embodiment of the present invention were compared, and the results are described. A difference between the light-emitting element 4 and the comparative light-emitting element 4 is only a material for the first electron-transport layer. Structural formulae of organic compounds used in the light-emitting element 4 and the comparative light-emitting element 4 are shown below.

[Chemical Formulae 6]

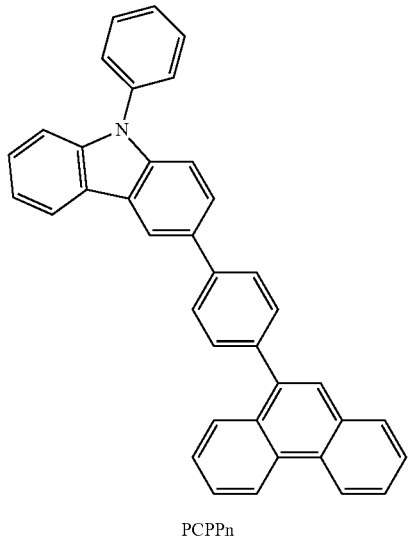

(viii)

PCPPn

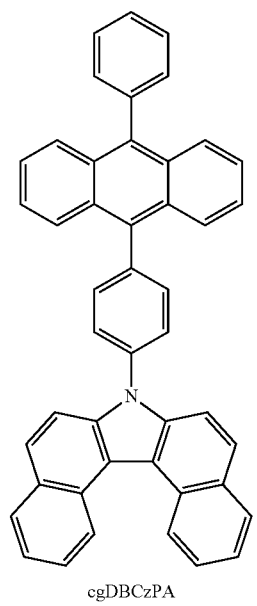

(iii)

cgDBCzPA

-continued

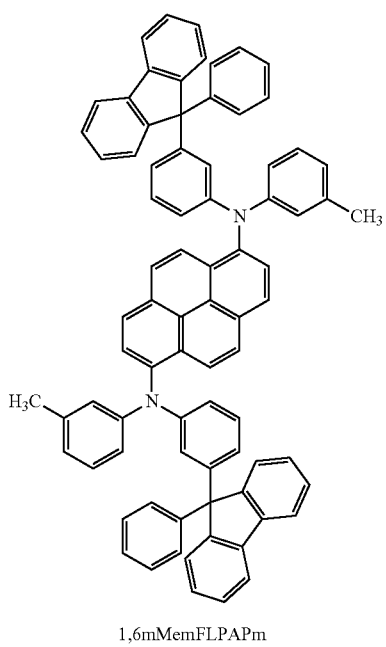

1,6mMemFLPAPrn    (iv)

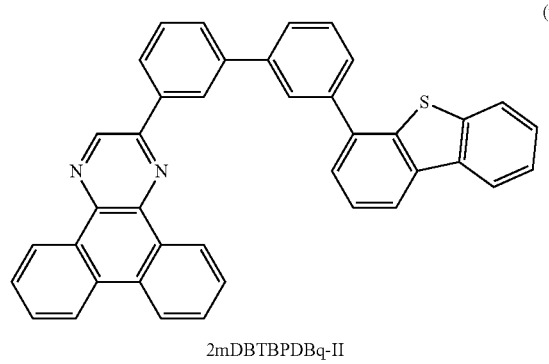

2mDBTBPDBq-II    (v)

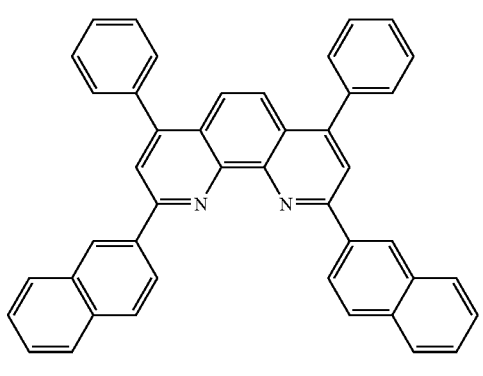

NBPhen    (vii)

(Method of Fabricating Light-Emitting Element 4)

First, a film of indium tin oxide containing silicon oxide (ITSO) was formed over a glass substrate by a sputtering method, so that the anode 101 was formed. The thickness thereof was 110 nm and the electrode area was 2 mm×2 mm.

Next, as pretreatment for forming the light-emitting element over the substrate, UV-ozone treatment was performed for 370 seconds after washing of a surface of the substrate with water and baking that was performed at 200° C. for an hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Next, the substrate provided with the anode 101 was fixed to a substrate holder provided in the vacuum evaporation device such that the side on which the anode 101 was formed faced downward. After the pressure was lowered to approximately 10-Pa, 3-[4-(9-phenanthryl)-phenyl]-9-phenyl-9H-carbazole (abbreviation: PCPPn) represented by the structural formula (viii) and molybdenum(VI) oxide were co-deposited over the anode 101 by an evaporation method using resistance heating, whereby the hole-injection layer 111 was formed. The thickness of the hole-injection layer 111 was 10 nm. The weight ratio of PCPPn to molybdenum oxide was adjusted to be 4:2 (=PCPPn: molybdenum oxide).

Next, PCPPn was deposited to a thickness of 30 nm over the hole-injection layer 111 to form the hole-transport layer 112.

Furthermore, over the hole-transport layer 112, the light-emitting layer 113 was formed by co-evaporation of 7-[4-(10-phenyl-9-anthryl)phenyl]-7H-dibenzo[c,g]carbazole (abbreviation: cgDBCzPA) represented by the above structural formula (iii) and N,N'-bis (3-methylphenyl)-N,N'-bis [3-(9-phenyl-9H-fluoren-9-yl)phenyl]-pyrene-1,6-diamine (abbreviation: 1,6mMemFLPAPrn) represented by the above structural formula (iv) in a weight ratio of 1:0.03 (=cgDBCzPA: 1,6mMemFLPAPrn) to a thickness of 25 nm.

After that, 2-[3'-(dibenzothiophen-4-yl)biphenyl-3-yl] dibenzo[f,h]quinoxaline (abbreviation: 2mDBTBPDBq-II) represented by the structural formula (v) was deposited to a thickness of 10 nm as the first electron-transport layer 114-1 over the light-emitting layer 113, and then 2,9-bis(naphthalen-2-yl)-4,7-diphenyl-1,10-phenanthroline (abbreviation: NBPhen) represented by the structural formula (vii) was deposited to a thickness of 15 nm as the second electron-transport layer 114-2.

After the formation of the first electron-transport layer 114-1 and the second electron-transport layer 114-2, lithium fluoride (LiF) was deposited by evaporation to a thickness of 1 nm and aluminum was deposited by evaporation to a thickness of 200 nm to form the cathode 102. Thus, the light-emitting element 4 in this example was fabricated.

(Method for Fabricating Comparative Light-Emitting Element 4)

The comparative light-emitting element 4 was fabricated in the same manner as the light-emitting element 4 except for changing 2mDBTBPDBq-II in the first electron-transport layer to cgDBCzPA.

The element structures of the light-emitting element 4 and the comparative light-emitting element 4 are shown in a table below.

TABLE 7

|  | Hole-injection layer 10 nm | Hole-transport layer 30 nm | Light-emitting layer 25 nm | First electron-transport layer 10 nm | Second electron-transport layer 15 nm |
|---|---|---|---|---|---|
| Light-emitting element 4 Comparative light-emitting element 4 | PCPPn:MoOx (4:2) | PCPPn | cgDBCzPA: 1,6mMemFLPAPm (1:0.03) | 2mDBTBPDBq-II cgDBCzPA | NBPhen |

The light-emitting element 4 and the comparative light-emitting element 4 were each sealed using a glass substrate in a glove box containing a nitrogen atmosphere so as not to be exposed to the air (specifically, a sealing material was applied to surround the elements and UV treatment and heat treatment at 80° C. for an hour were performed at the time of sealing). Then, initial characteristics and reliability of these light-emitting elements were measured. Note that the measurements were carried out at room temperature (in an atmosphere kept at 25° C.).

Figure 35:
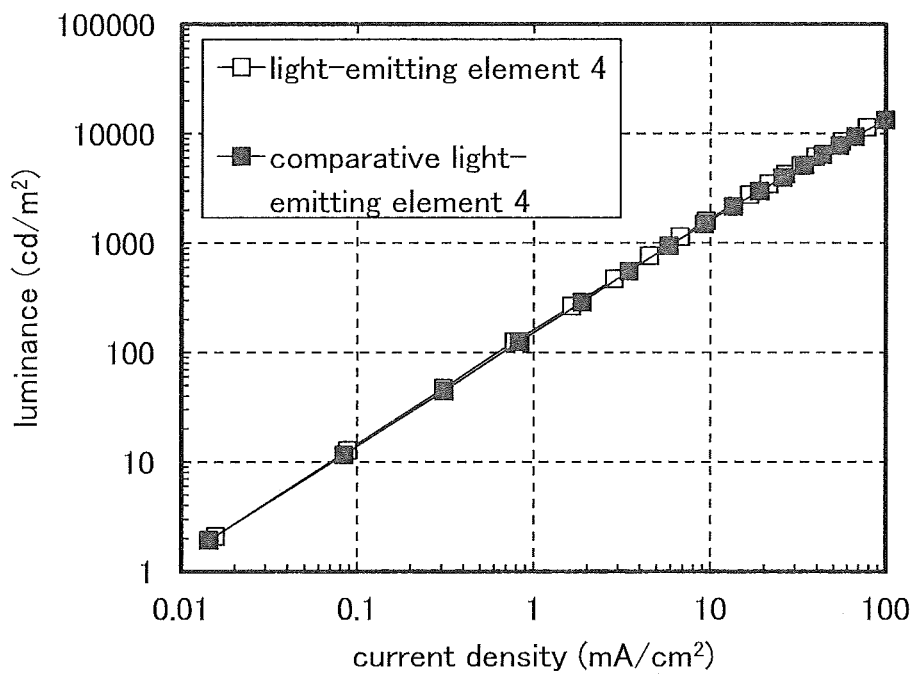
FIG. 35 shows luminance-current density characteristics of a light-emitting element 4 and a comparative light-emitting element 4.
Figure 36:
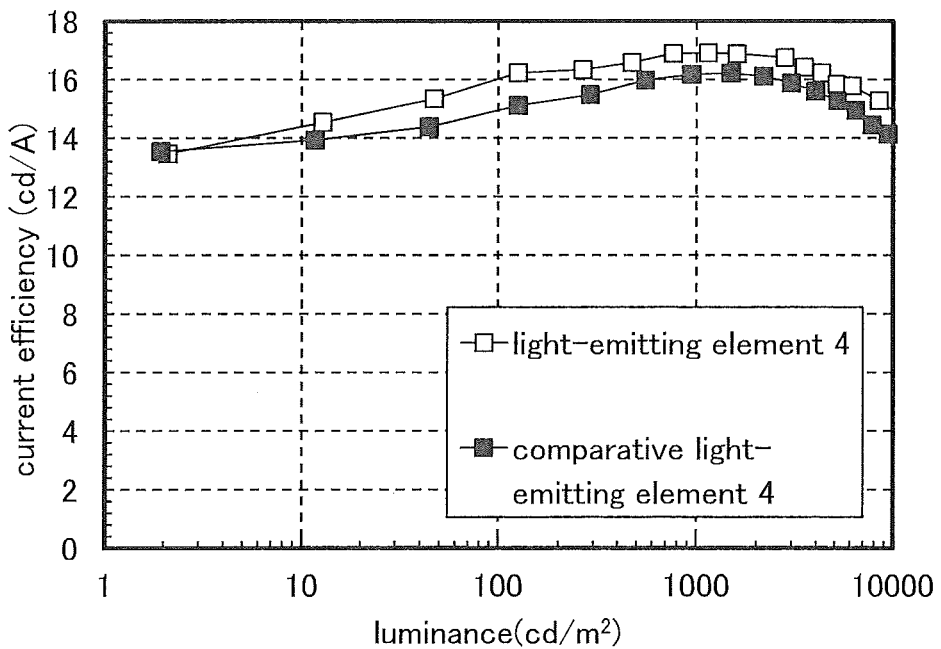
FIG. 36 shows current efficiency-luminance characteristics of the light-emitting element 4 and the comparative light-emitting element 4.
Figure 37:
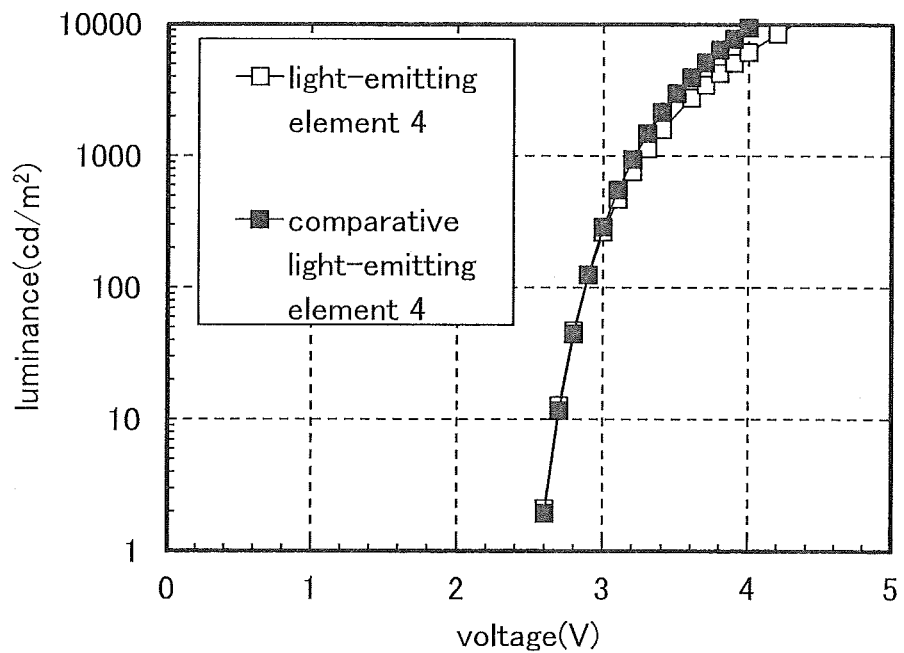
FIG. 37 shows luminance-voltage characteristics of the light-emitting element 4 and the comparative light-emitting element 4.
Figure 38:
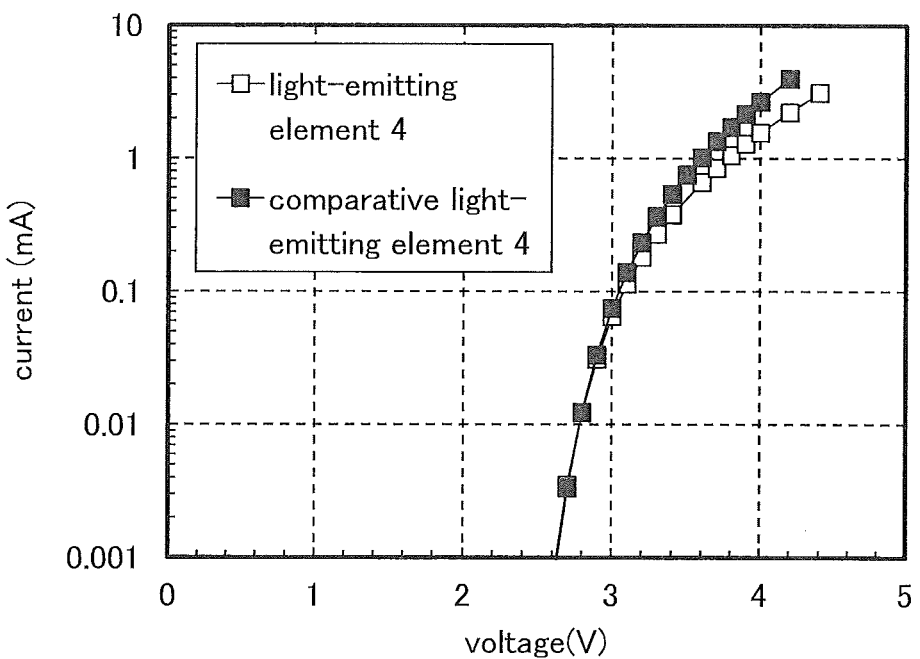
FIG. 38 shows current-voltage characteristics of the light-emitting element 4 and the comparative light-emitting element 4.
Figure 39:
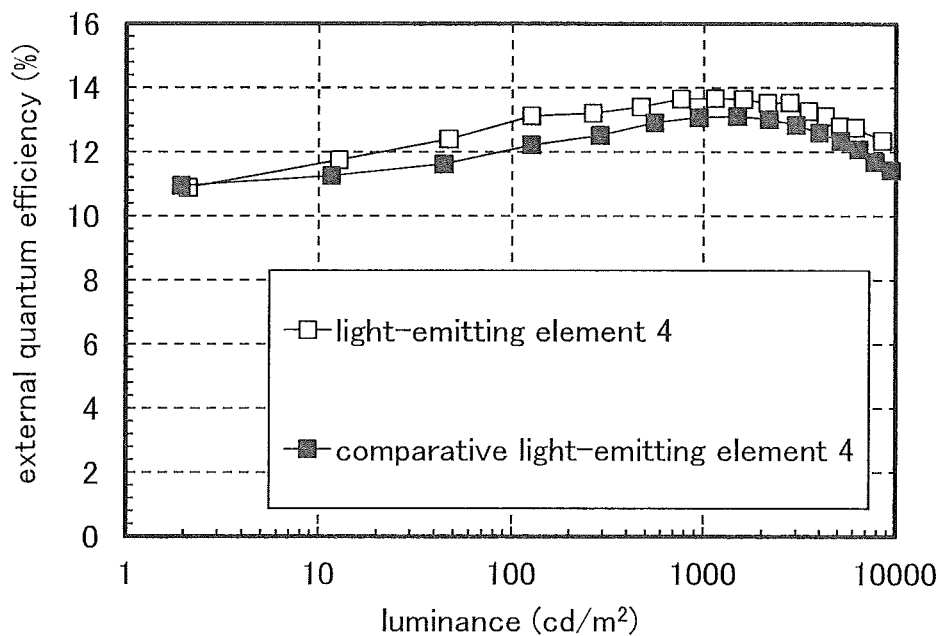
FIG. 39 shows external quantum efficiency-luminance characteristics of the light-emitting element 4 and the comparative light-emitting element 4.
Figure 40:
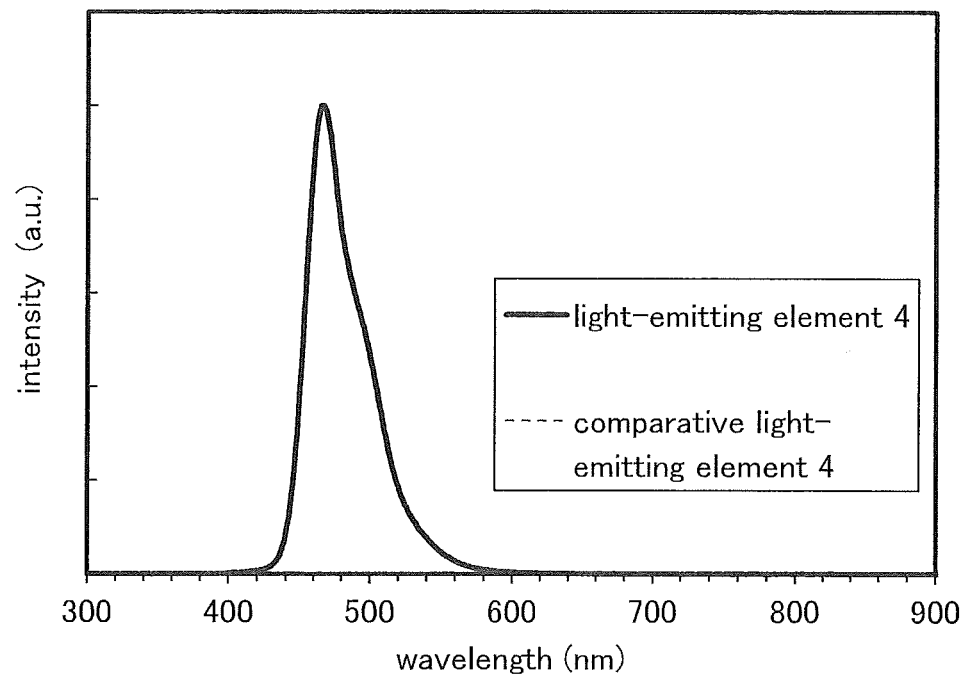
FIG. 40 shows emission spectra of the light-emitting element 4 and the comparative light-emitting element 4.

FIG. 35 shows luminance-current density characteristics of the light-emitting element 4 and the comparative light-emitting element 4. FIG. 36 shows current efficiency-luminance characteristics thereof. FIG. 37 shows luminance-voltage characteristics thereof. FIG. 38 shows current-voltage characteristics thereof. FIG. 39 shows external quantum efficiency-luminance characteristics thereof. FIG. 40 shows emission spectra thereof. Table 8 shows main characteristics of the light-emitting elements at approximately 1000 cd/m².

TABLE 8

|  | Voltage (V) | Current (mA) | Current density (mA/cm²) | Chromaticity x | Chromaticity y | Current efficiency (cd/A) | External quantum efficiency (%) |
|---|---|---|---|---|---|---|---|
| Light-emitting element 4 | 3.3 | 0.27 | 7 | 0.14 | 0.18 | 16.9 | 13.7 |
| Comparative light-emitting element 4 | 3.2 | 0.23 | 6 | 0.14 | 0.18 | 16.2 | 13.1 |

It can be found from FIG. 35, FIG. 36, FIG. 37, FIG. 38, FIG. 39, FIG. 40, and Table 8 that each of the light-emitting elements is a blue light-emitting element with favorable characteristics, and particularly, the light-emitting element 4 shows an extremely high external quantum efficiency exceeding 13.7% (under assumption of Lambertian distribution).

Figure 41:
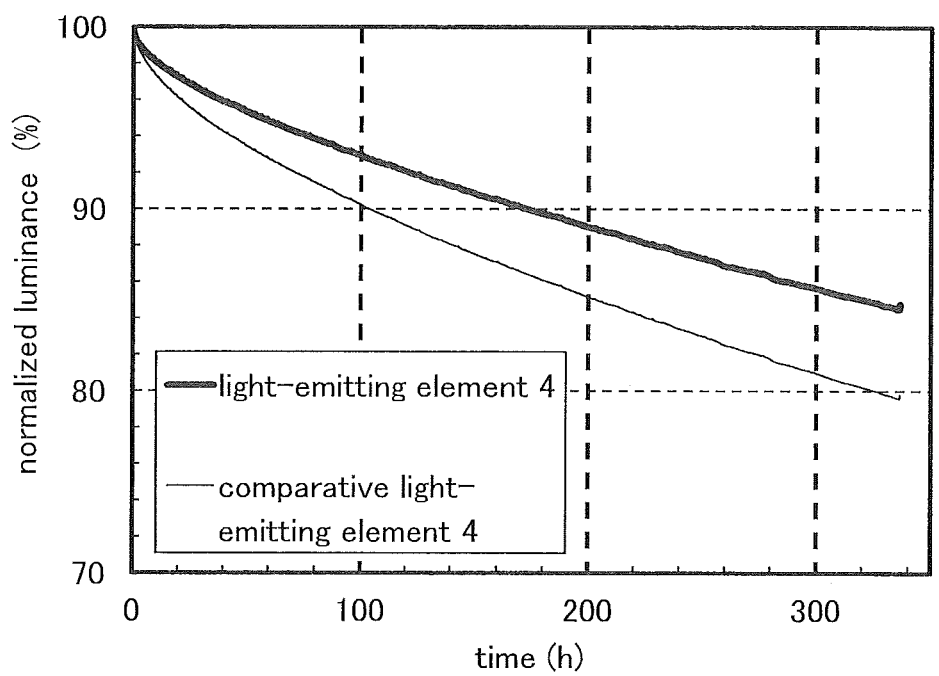
FIG. 41 shows characteristics of normalized luminance change with time of the light-emitting element 4 and the comparative light-emitting element 4.

FIG. 41 shows a change in luminance of the light-emitting element with driving time under the conditions where the initial luminance was 5000 cd/m² and the current density was constant. As shown in FIG. 41, a decrease in luminance with accumulation of driving time of the light-emitting element 4 of one embodiment of the present invention is smaller than that of the comparative light-emitting element 4; therefore, the light-emitting element 4 has a long lifetime.

According to the cyclic voltammetry (CV) measurement results, the LUMO levels of cgDBCzPA, 2mDBTBPDBq-II, and NBPhen are estimated to −2.74 eV, −2.94 eV, and −2.83 eV, respectively. Therefore, the light-emitting element 4 is one embodiment of the present invention.

In the light-emitting element 4, a composite material of a hole-transport material and an acceptor material is used for the hole-injection layer. The hole-transport material used for the hole-injection layer is PCPPn, which is also used for the hole-transport layer, and the HOMO level of PCPPn is as deep as −5.80 eV by the CV measurement. Accordingly, PCPPn has a favorable hole-injection property with respect to cgDBCzPA (HOMO level: −5.69 eV) which is the host material in the light-emitting layer, but in general, hole injection from the anode is difficult. However, since a transition metal oxide is used as the acceptor material in the light-emitting element 4, the acceptor material shows an acceptor property with respect to a hole-transport material having a HOMO level lower (deeper) than −5.4 eV (the acceptor material can extract an electron by at least application of an electric field). Consequently, hole injection and hole transport from the anode to the hole-injection layer, the hole-transport layer, and the light-emitting layer are smoothly performed. By the combination of this hole-injection layer and one embodiment of the present invention, the light-emitting element 4 achieves not only low-voltage driving but also an unexpectedly high external quantum efficiency and a long lifetime, which are major characteristics.

Example 5

Compounds that can be used for the light-emitting element of one embodiment of the present invention are listed in tables. Compounds including a condensed aromatic ring skeleton including 3 to 6 rings which are suitably used as the host material in the light-emitting layer are listed as No. 1 to No. 13 in Table 9. In addition, compounds each having a low LUMO level which are suitably used for the first electron-transport layer are listed as No. 14 to No. 35 in Table 10; compounds suitably used for the second electron-transport layer (whose LUMO levels tend to be relatively higher than the LUMO levels of the compounds suitably used for the first electron-transport layer) are listed as No. 36 to No. 46 in Table 11. The molecular structure of the compounds are also shown below. In the tables, EmL refers to the light-emitting layer, ETL1 refers to the first electron-transport layer, and ETL2 refers to the second electron-transport layer. The LUMO levels were obtained through a cyclic voltammetry (CV) measurement to be described later.

TABLE 9

| No. | Abbreviation | Layer | Skeleton | LUMO (eV) measured by CV |
|---|---|---|---|---|
| 1 | CzPA | EmL | anthracene | −2.73 |
| 2 | cgDBCzPA | EmL | anthracene | −2.74 |
| 3 | PCzPA | EmL | anthracene | −2.70 |
| 4 | 2mDBFPPA-II | EmL | anthracene | −2.78 |
| 5 | t-BuDNA | EmL | anthracene | −2.68 |
| 6 | BH-1 | EmL | anthracene | −2.73 |
| 7 | DPT | EmL | tetracene | −3.05 |
| 8 | rubrene | EmL | tetracene | −3.11 |
| 9 | TBRb | EmL | tetracene | −2.99 |
| 10 | TPB3 | EmL | pyrene | −2.64 |
| 11 | BPPF | EmL | pyrene | −2.58 |
| 12 | spiro-pye | EmL | pyrene | −2.62 |
| 13 | TBP | EmL | perylene | −2.77 |

[Chemical Formulae 7]

No.1

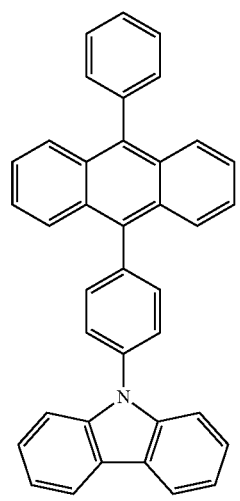

CzPA

No.2

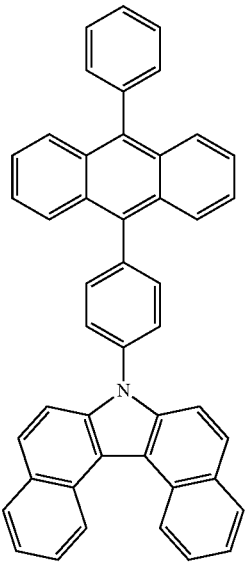

egDBCzPA

No.3

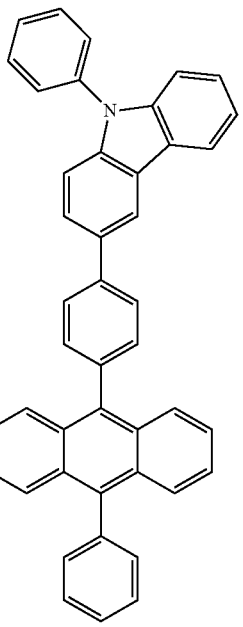

PCzPA

No.4

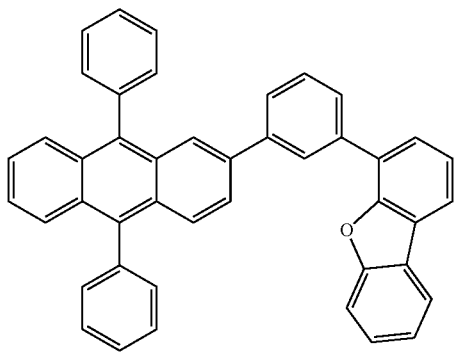

2mDBFPPA-II

No.5

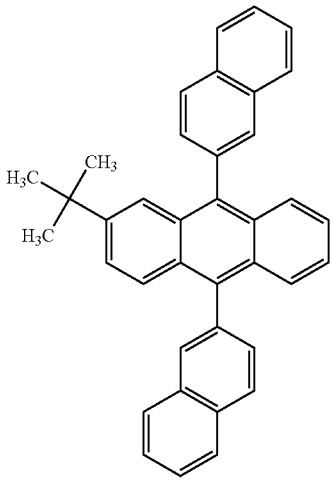

t-BuDNA

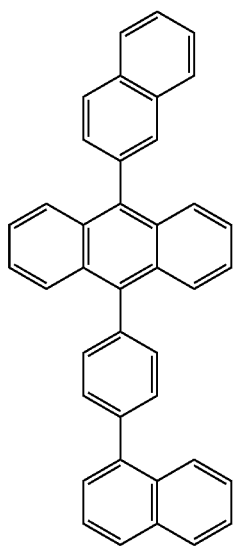
BH-1
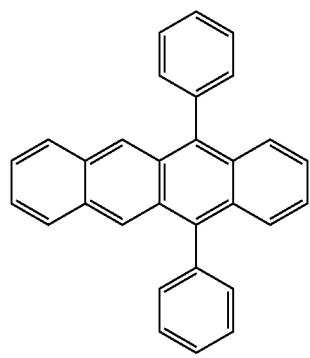
DPT
[Chemical Formulae 8]
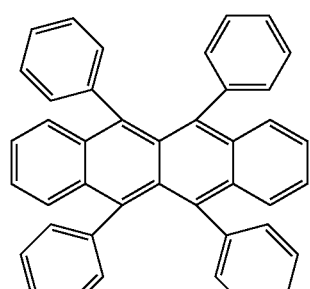
ruburene
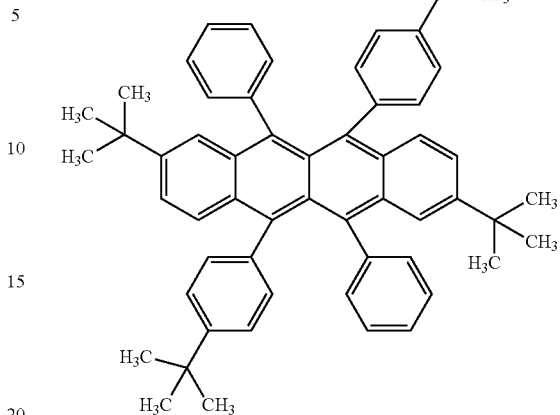
TBRb
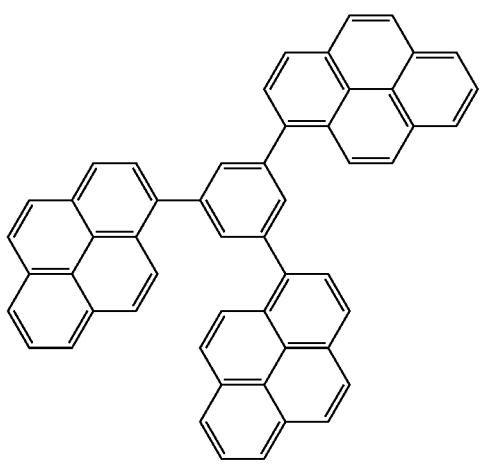
TPB3
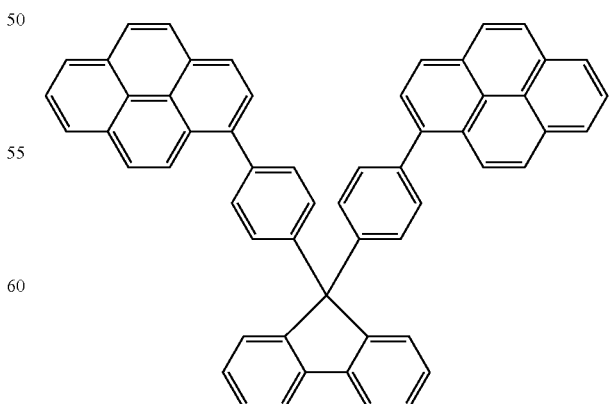
BPPF -continued

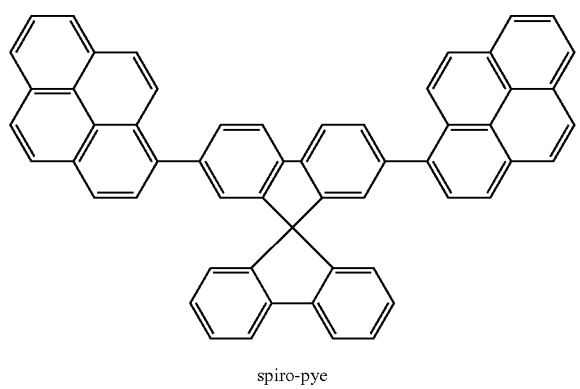

spiro-pye

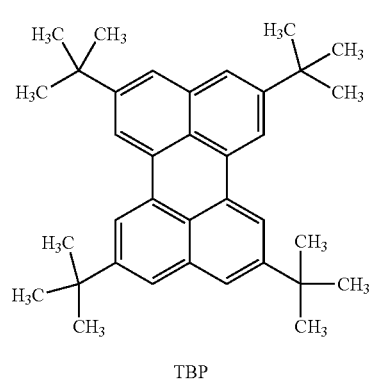

TBP

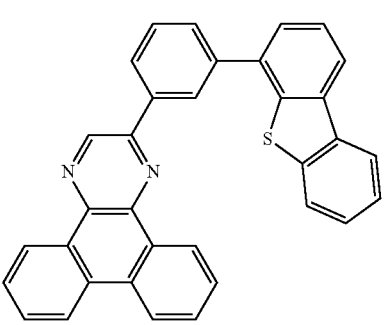

2mDBTPDBq-II

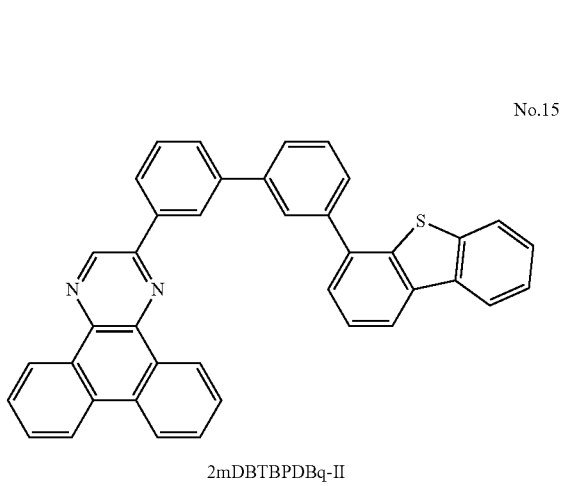

2mDBTBPDBq-II

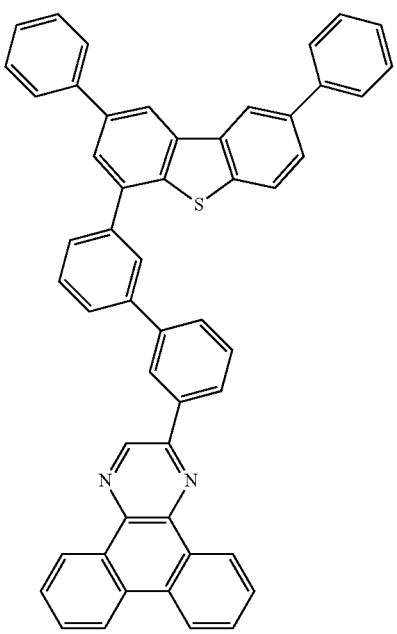

2mDBTBPDBq-III

TABLE 10

| No. | Abbreviation | Layer | Skeleton | LUMO (eV) measured by CV |
|---|---|---|---|---|
| 14 | 2mDBTPDBq-II | ETL1 | dibenzoquinoxaline | −2.95 |
| 15 | 2mDBTBPDBq-II | ETL1 | dibenzoquinoxaline | −2.94 |
| 16 | 2mDBTBPDBq-III | ETL1 | dibenzoquinoxaline | −2.94 |
| 17 | 2mDBTBPDBq-IV | ETL1 | dibenzoquinoxaline | −2.94 |
| 18 | PCPDBq | ETL1 | dibenzoquinoxaline | −2.93 |
| 19 | 2mCzPDBq-III | ETL1 | dibenzoquinoxaline | −2.99 |
| 20 | 2mCzBPDBq | ETL1 | dibenzoquinoxaline | −2.95 |
| 21 | 7mDBTPDBq-II | ETL1 | dibenzoquinoxaline | −2.86 |
| 22 | 7mDBTBPDBq-II | ETL1 | dibenzoquinoxaline | −2.86 |
| 23 | 2,6(P-Bpn)2Py | ETL1 | dibenzoquinazoline | −2.92 |
| 24 | 4mDBTBPBfpm-II | ETL1 | pyrimidine (fused) | −2.96 |
| 25 | 4mCzBPBfpm | ETL1 | pyrimidine (fused) | −2.97 |
| 26 | 4,6mDBTP2Pm-II | ETL1 | pyrimidine | −2.83 |
| 27 | 4,6mCzP2Pm | ETL1 | pyrimidine | −2.88 |
| 28 | B3PYMPM | ETL1 | pyrimidine | −2.84 |
| 29 | 2,6(P2Pm)2Py | ETL1 | pyrimidine | −2.78 |
| 30 | PPDN | ETL1 | pyrazine (fused) | −3.83 |
| 31 | 2PYPR | ETL1 | pyrazine (fused) | −3.22 |
| 32 | 3PYPR | ETL1 | pyrazine (fused) | −3.26 |
| 33 | 2Py3Tzn | ETL1 | triazine | −3.15 |
| 34 | TmPPPyTz | ETL1 | triazine | −3.00 |
| 35 | CPCBPTz | ETL1 | triazine | −2.99 |

No.17
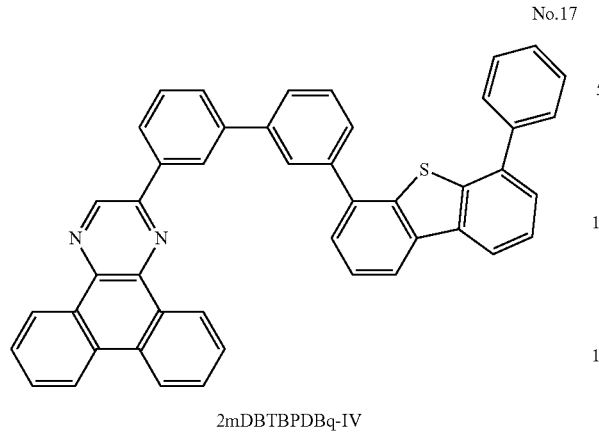
2mDBTBPDBq-IV
No.18
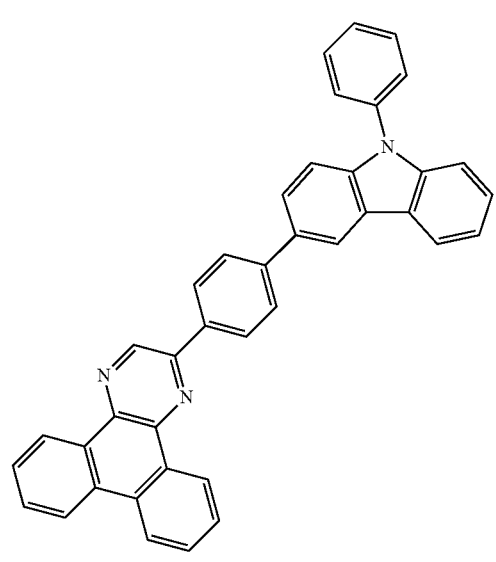
PCPDBq
No.19
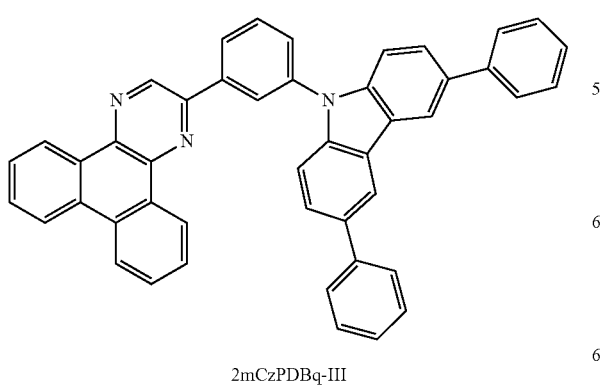
2mCzPDBq-III
No.20
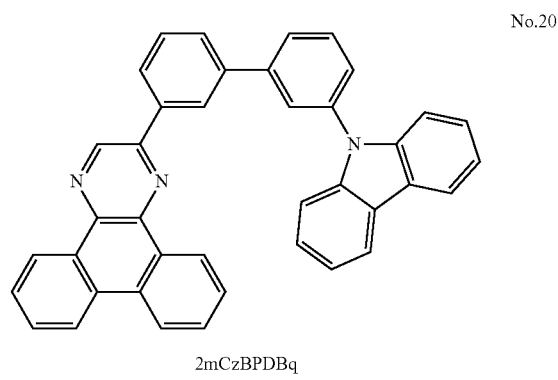
2mCzBPDBq
[Chemical Formulae 10]
No.21
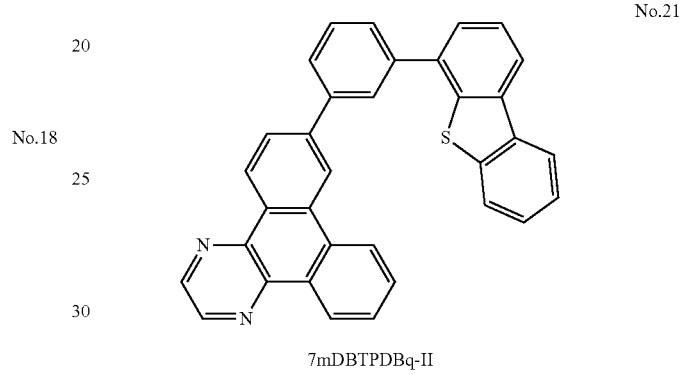
7mDBTPDBq-II
No.22
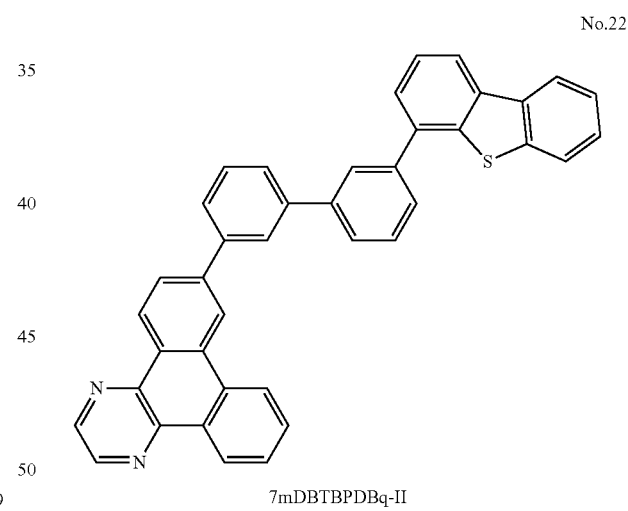
7mDBTBPDBq-II
No.23
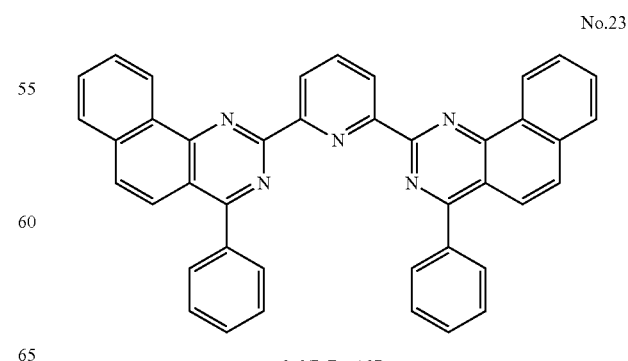
2,6(P-Bpn)2Py No.24
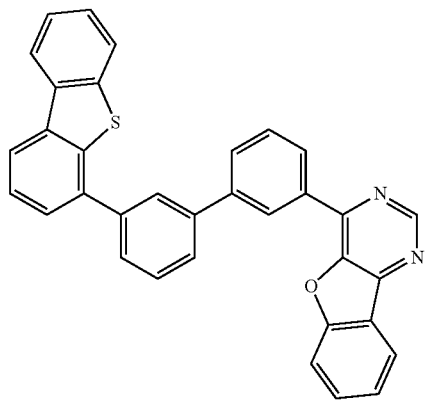
4mDBTBPBfpm-II
No.25
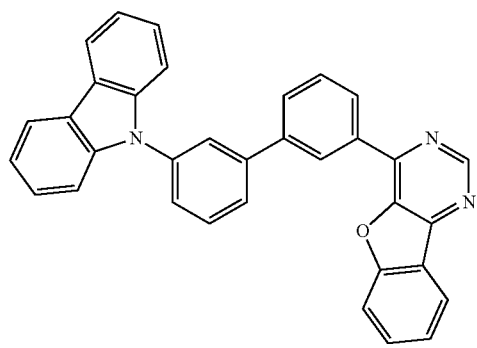
4mCzBPBfpm
No.26
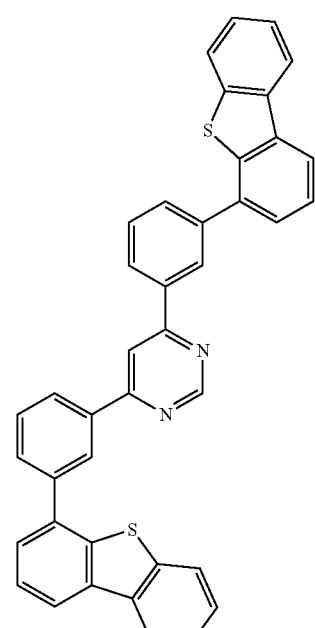
4,6mDBTP2Pm-II
No.27
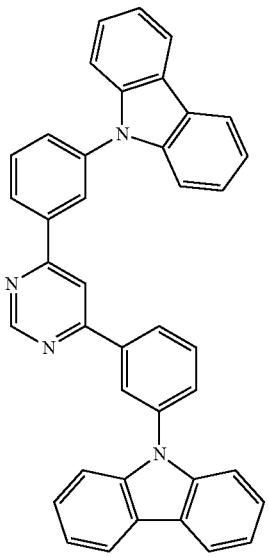
4,6mCzP2Pm
No.28
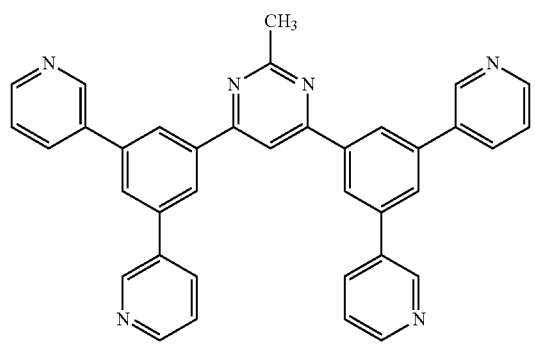
B3PYMPM
[Chemical Formulae 11]
No.29
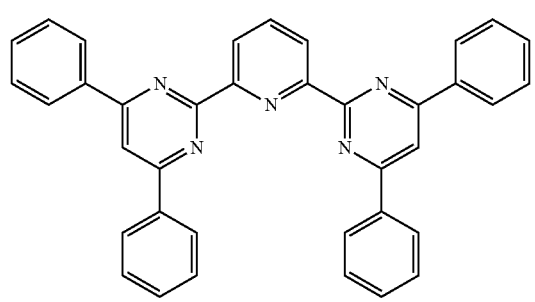
2,6(P2Pm)2Py No. 30

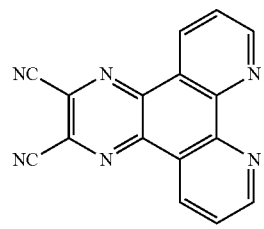

PPDN

No. 31

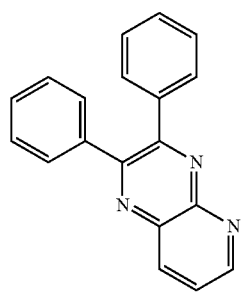

2PYPR

No. 32

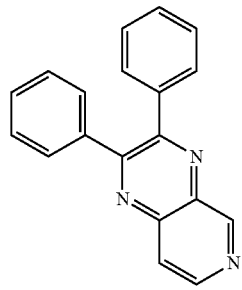

3PYPR

No. 33

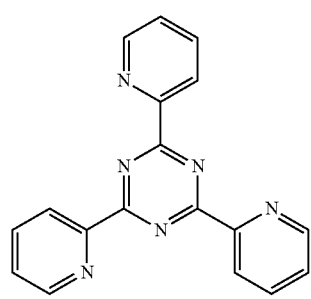

2Py3Tzn

No. 34

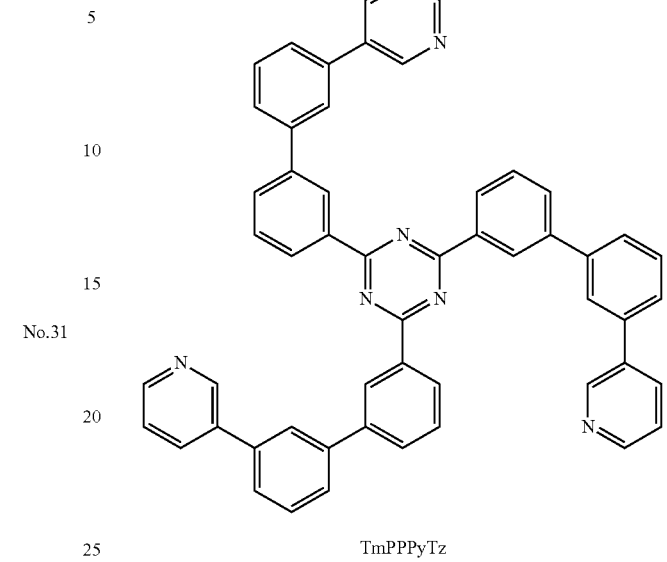

TmPPPyTz

No. 35

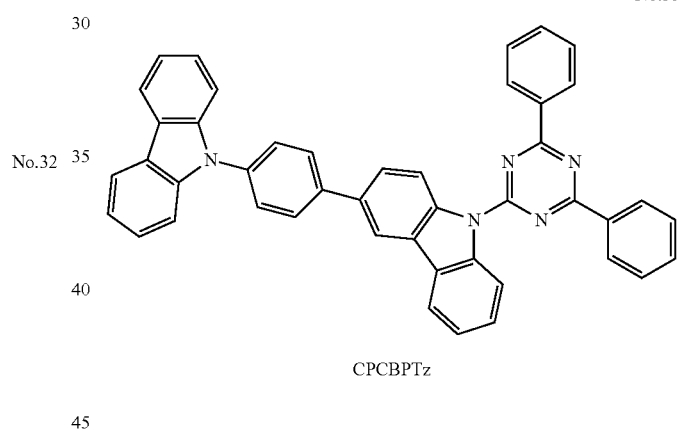

CPCBPTz

TABLE 11

| No. | Abbreviation | Layer | Skeleton | LUMO (eV) measured by CV |
|---|---|---|---|---|
| 36 | BCP | ETL2 | phenanthroline | −2.55 |
| 37 | BPhen | ETL2 | phenanthroline | −2.63 |
| 38 | NBPhen | ETL2 | phenanthroline | −2.83 |
| 39 | Phen2BP | ETL2 | phenanthroline | −2.79 |
| 40 | 4,4'mCzP2BPy | ETL2 | bipyridine | −2.66 |
| 41 | 4,4'mDBTP2BPy-II | ETL2 | bipyridine | −2.63 |
| 42 | 4,4'DBfP2BPy | ETL2 | bipyridine | −2.60 |
| 43 | 3TPYMB | ETL2 | pyridine | −2.63 |
| 44 | TmPyPB | ETL2 | pyridine | −2.23 |
| 45 | BP4mPy | ETL2 | pyridine | −2.26 |
| 46 | BmPyPhB | ETL2 | pyridine | −2.29 |

[Chemical Formulae 12]
No.36
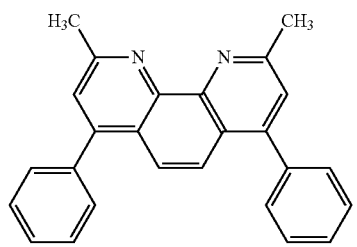
BCP
No.37
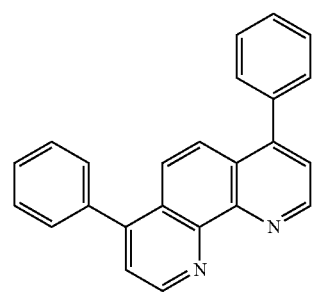
BPhen
No.38
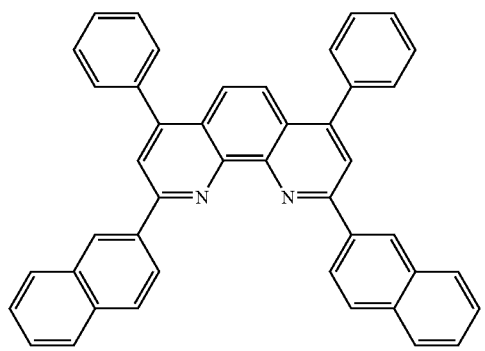
NBPhen
No.39
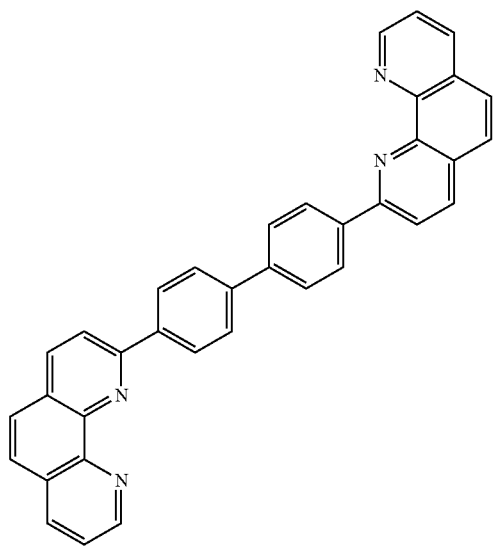
Phen2BP
No.40
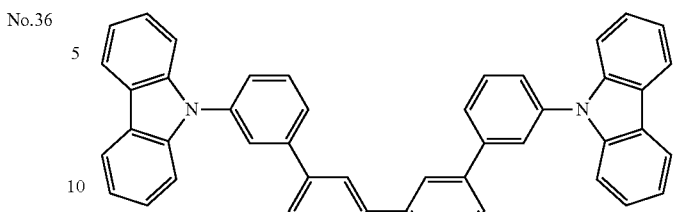
4,4'mCzP2BPy
No.41
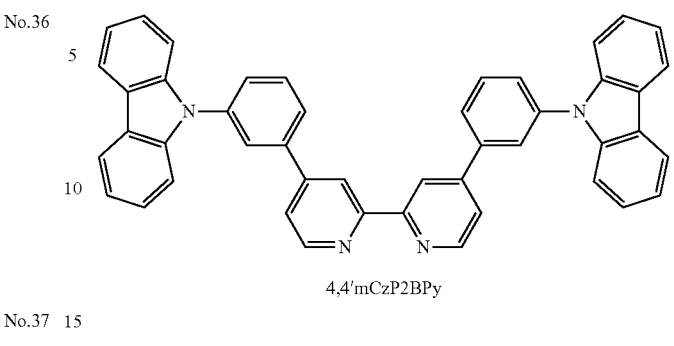
4,4'mDBTP2BPy-II
No.42
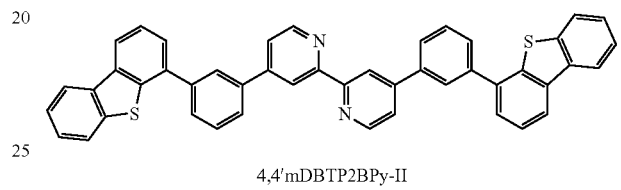
4,4'DBfP2BPy
No.43
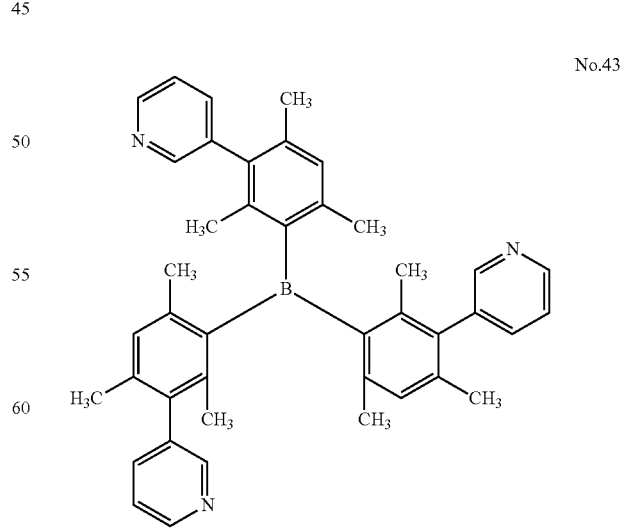
3TPYMB

[Chemical Formulae 13]

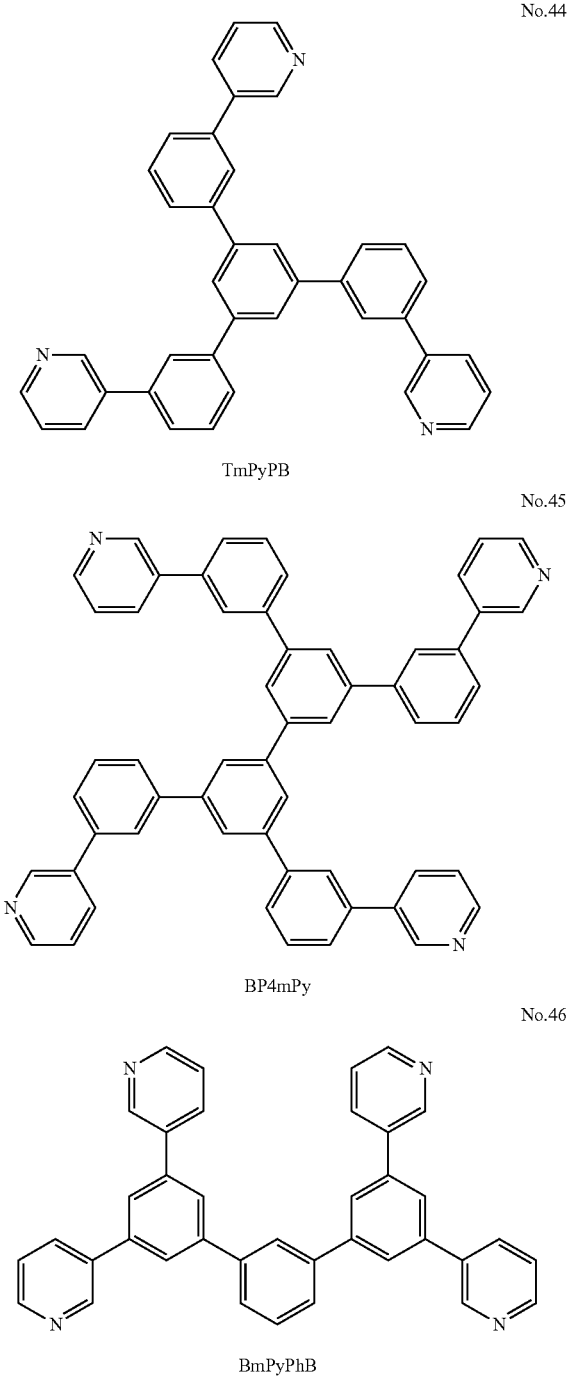

TmPyPB (No.44)

BP4mPy (No.45)

BmPyPhB (No.46)

It is found that, for example, the LUMO levels of compounds each including an anthracene skeleton are approximately −2.7 eV from the table. In the case where the compound including an anthracene skeleton is used as the host material in the light-emitting layer, a compound whose LUMO level is lower than the LUMO level of the compound including an anthracene skeleton may be used for the first electron-transport layer, and any of the compounds of No. 14 to No. 35 can be used. However, since an energy difference between the LUMO levels is preferably lower than or equal to 0.3 eV, a compound including a dibenzoquinoxaline skeleton, a dibenzoquinazoline skeleton, or a pyrimidine skeleton is particularly preferred because the LUMO level is approximately −2.80 eV to −2.99 eV in many cases. In that case, with use of any of the compounds of No. 36 to No. 46 for the second electron-transport layer, the light-emitting element of one embodiment of the present invention can be fabricated.

In the case where a compound including another skeleton is used as the host material in the light-emitting layer, the light-emitting element of one embodiment of the present invention can be fabricated in a similar manner. For example, in the case where a compound including a tetracene skeleton is used as the host material in the light-emitting layer, not all the compounds of No. 14 to No. 36 are suitably used for the first electron-transport layer because the LUMO level of the compound including a tetracene skeleton is relatively low. However, with use of, for example, a fused pyrazine compound or a fused triazine compound for the first electron-transport layer, the light-emitting element of one embodiment of the present invention can be fabricated.

Note that the compounds including a phenanthroline skeleton, a bipyridine skeleton, or a pyridine skeleton are suitably used for the second electron-transport layer because of their relatively high LUMO levels among the compounds having an electron-transport property as shown in the table. Moreover, in the case where any of these compounds is used in contact with the cathode, the electron-injection property from the cathode is favorable, which is another reason that these compounds are suitably used for the second electron-transport layer.

Here, cyclic voltammetry (CV) measurement is described. An electrochemical analyzer (ALS model 600A or 600C, manufactured by BAS Inc.) was used for the CV measurement.

As for a solution used for the CV measurement, dehydrated dimethylformamide (DMF, produced by Sigma-Aldrich Inc., 99.8%, Catalog No. 227056-12) was used as a solvent, and tetra-n-butylammonium perchlorate (electrochemical grade, Wako Pure Chemical Industries, Ltd., manufacturer's code: 043999, CAS. No. 1923-70-2), which was a supporting electrolyte, was dissolved in the solvent so that the concentration of tetra-n-butylammonium perchlorate can be 100 mmol/L. Further, the measurement target was dissolved in the solution so that the concentration thereof can be 2 mmol/L. Then, the solution was put into an electrochemical cell, electrodes were set, and then degasification by argon bubbling was performed for approximately 30 minutes. The electrodes used for the measurement were a platinum electrode (produced by BAS Inc., PTE platinum electrode) as a working electrode, a platinum electrode (produced by BAS Inc., Pt counter electrode) as an auxiliary electrode, and a reference electrode for nonaqueous solvent (produced by BAS Inc., RE-7 reference electrode for nonaqueous solvent (Ag/Ag$^+$)) as a reference electrode. In the CV measurement, room temperature (20° C. to 25° C.) and a scan rate of 0.1 V/sec were employed. Note that the potential energy of the reference electrode with respect to the vacuum level was assumed to be −4.94 eV in this example.

The LUMO level (reduction potential) and the HOMO level (oxidation potential) were obtained from the CV measurement results. From an oxidation peak potential (from the reduction state to the neutral state) $E_{pc}$ [V] and a reduction peak potential (from the neutral state to the reduction state) $E_{pa}$ [V], a half wave potential (a potential intermediate between $E_{pa}$ and $E_{pc}$) was calculated ($=(E_{pa}+$ $E_{pc}$)/2 [V]). Then, this half wave potential was subtracted from the potential energy of the reference electrode with respect to the vacuum level (−4.94 eV), so that the LUMO level was obtained. From an oxidation peak potential (from the neutral state to the oxidation state) $E_{pa}$ [V] and a reduction peak potential (from the oxidation state to the neutral state) $E_{pc}$ [V], the half wave potential (the potential intermediate between $E_{pa}$ and $E_{pc}$) was calculated (=($E_{pa}$+$E_{pc}$)/2 [V]). Then, this half wave potential was subtracted from the potential energy of the reference electrode with respect to the vacuum level (−4.94 eV), so that the HOMO level was obtained.

This application is based on Japanese Patent Application serial no. 2015-099866 filed with Japan Patent Office on May 15, 2015 and Japanese Patent Application serial no. 2016-049620 filed with Japan Patent Office on Mar. 14, 2016, the entire contents of which are hereby incorporated by reference.

What is claimed is:

1. A light-emitting element comprising:
an anode;
a cathode; and
an EL layer between the anode and the cathode,
wherein the EL layer comprises a light-emitting layer, a first electron-transport layer, and a second electron-transport layer,
wherein the first electron-transport layer is between the light-emitting layer and the second electron-transport layer,
wherein the light-emitting layer has a region in contact with the first electron-transport layer,
wherein the second electron-transport layer has a region in contact with the first electron-transport layer,
wherein the light-emitting layer comprises a fluorescent substance and a host material,
wherein the first electron-transport layer comprises a first material,
wherein the second electron-transport layer comprises a second material,
wherein the host material is different from the first material and the second material,
wherein a LUMO level of the host material is higher than a LUMO level of the first material,
wherein a LUMO level of the second material is higher than the LUMO level of the first material,
wherein the host material is a substance including a condensed aromatic ring skeleton including 3 to 6 rings,
wherein the first material is a substance including a first heteroaromatic ring skeleton,
wherein the second material is a substance including a second heteroaromatic ring skeleton, and
wherein the substance including the first heteroaromatic ring skeleton is different from the substance including the second heteroaromatic ring skeleton.

2. The light-emitting element according to claim 1, wherein each of the substance including the first heteroaromatic ring skeleton and the substance including the second heteroaromatic ring skeleton is a substance including a six-membered nitrogen-containing heteroaromatic ring skeleton.

3. The light-emitting element according to claim 1, wherein the substance including the first heteroaromatic ring skeleton is a substance including a condensed heteroaromatic ring skeleton.

4. The light-emitting element according to claim 1, wherein the substance including the first heteroaromatic ring skeleton is a substance including a condensed heteroaromatic ring skeleton including a diazine skeleton or a triazine skeleton.

5. The light-emitting element according to claim 1, wherein the substance including the first heteroaromatic ring skeleton is a substance including a pyrazine skeleton or a pyrimidine skeleton.

6. The light-emitting element according to claim 1, wherein the substance including the first heteroaromatic ring skeleton is a substance including a dibenzoquinoxaline skeleton.

7. The light-emitting element according to claim 1, wherein the host material is a substance including an anthracene skeleton.

8. The light-emitting element according to claim 1, wherein the second electron-transport layer is in contact with the cathode.

9. The light-emitting element according to claim 1, wherein the EL layer further comprises a hole-injection layer,
wherein the hole-injection layer is in contact with the anode, and
wherein the hole-injection layer comprises an organic acceptor material.

10. The light-emitting element according to claim 9, wherein the organic acceptor material is 2,3,6,7,10,11-hexacyano-1,4,5,8,9,12-hexaazatriphenylene.

11. The light-emitting element according to claim 1, wherein the fluorescent substance exhibits blue light.

12. A light-emitting device comprising:
the light-emitting element according to claim 1; and
at least one of a transistor and a substrate.

13. An electronic device comprising:
the light-emitting device according to claim 12; and
at least one of a sensor, an operation button, a speaker, and a microphone.

14. A lighting device comprising:
the light-emitting device according to claim 12; and
a housing.

* * * * *